US009366700B2

(12) United States Patent
Ausserlechner

(10) Patent No.: US 9,366,700 B2
(45) Date of Patent: Jun. 14, 2016

(54) CURRENT SENSOR

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 84 days.

(21) Appl. No.: 14/288,632

(22) Filed: May 28, 2014

(65) Prior Publication Data

US 2014/0266178 A1    Sep. 18, 2014

Related U.S. Application Data

(60) Division of application No. 13/873,559, filed on Apr. 30, 2013, now Pat. No. 8,779,757, which is a continuation of application No. 12/794,919, filed on Jun. 7, 2010, now Pat. No. 8,461,824.

(51) Int. Cl.
*G01R 33/02* (2006.01)
*G01R 15/18* (2006.01)
*G01R 15/20* (2006.01)
*G01R 19/00* (2006.01)

(52) U.S. Cl.
CPC .............. *G01R 15/18* (2013.01); *G01R 15/207* (2013.01); *G01R 19/00* (2013.01)

(58) Field of Classification Search
CPC .... G01R 15/207; G01R 15/202; G01R 15/18; G01R 33/07
USPC .......................................... 324/117 R, 117 H
See application file for complete search history.

(56) References Cited

U.S. PATENT DOCUMENTS 4,887,027 A    12/1989  Strasser
4,916,392 A     4/1990  Sendeff et al.
(Continued)

FOREIGN PATENT DOCUMENTS

DE    19813890 A1    9/1999
DE    10108640 A1    9/2002
(Continued)

OTHER PUBLICATIONS

Melexis MLX(91205: Current Sensor, http://www.melexis.com/Sensor_ICs_Hall_effect/Triaxis_Hall_ICs/Current_Sensor_689.aspx, 1998, p. 1-2.
(Continued)

*Primary Examiner* — Vincent Q Nguyen
(74) *Attorney, Agent, or Firm* — Eschweiler & Associates, LLC

(57) ABSTRACT

A current sensor includes a conductive element, and at least two magnetic field sensors arranged on the conductive element and configured to sense a magnetic field generated by a current through the conductive element, wherein the at least two magnetic field sensors are arranged on opposite sides of a line perpendicular to a current flow direction in the conductive element. The current sensor further includes an insulating layer arranged between the conductive element and the magnetic field sensors, and at least two conductor traces provided on the insulating layer, wherein one end of the conductor traces connects to a respective magnetic field sensor, and the other end of the conductor traces providing a terminal for outputting the sensor signals. The conductor traces are arranged such that they do not extend entirely around the conductive element.

9 Claims, 54 Drawing Sheets

(56) References Cited

U.S. PATENT DOCUMENTS

| | | | |
|---|---|---|---|
| 5,017,859 A | 5/1991 | Engel et al. | |
| 5,041,780 A | 8/1991 | Rippel | |
| 5,570,034 A | 10/1996 | Needham et al. | |
| 5,767,668 A | 6/1998 | Durand | |
| 6,040,690 A | 3/2000 | Ladds | |
| 6,154,023 A | 11/2000 | Durand | |
| 2004/0257061 A1 | 12/2004 | de Buda | |
| 2005/0151533 A1 | 7/2005 | Howard et al. | |
| 2005/0156587 A1 | 7/2005 | Yakymyshyn et al. | |
| 2006/0028195 A1 | 2/2006 | Tanizawa | |
| 2006/0082357 A1 | 4/2006 | Tsukamoto | |
| 2006/0219436 A1* | 10/2006 | Taylor | G01R 15/207 174/529 |
| 2006/0284613 A1* | 12/2006 | Hastings | G01R 15/202 324/117 H |

FOREIGN PATENT DOCUMENTS

| | | |
|---|---|---|
| DE | 10240241 A1 | 3/2004 |
| EP | 0947843 A2 | 10/1999 |
| JP | 2006038640 A | 2/2006 |
| WO | 0122076 A1 | 3/2001 |

OTHER PUBLICATIONS

Allegro: Allegro Hall Effect-Based Current Sensor ICs, http://www.allegromicro.com/en/Products/Design/current_sensors/, 2010, p. 1-4.

Amploc World: Center of the Current Sensing, "Amploc Current Sensors", http://amploc.com/store/index.html, Jun. 7, 2010. p. 1-3.

ISA Scale Isabellenhuette, "Advanced Sensor Module with IHM-A-1500", http://www.isabellenhuette.de/fileadmin/pdf/Data_sheet/Datasheet_IMC-A-R0001.pdf, Dec. 15, 2008, p. 1-2.

Non-Final Office Action dated Oct. 12, 2012 for U.S. Appl. No. 12/794,919. 19 Pages.

Notice of Allowance dated Jan. 25, 2013 for U.S. Appl. No. 12/794,919. 9 Pages.

Non-Final Office Action dated Aug. 30, 2013 for U.S. Appl. No. 13/873,559.

Notice of Allowance dated Mar. 10, 2014 for U.S. Appl. No. 13/873,559.

* cited by examiner

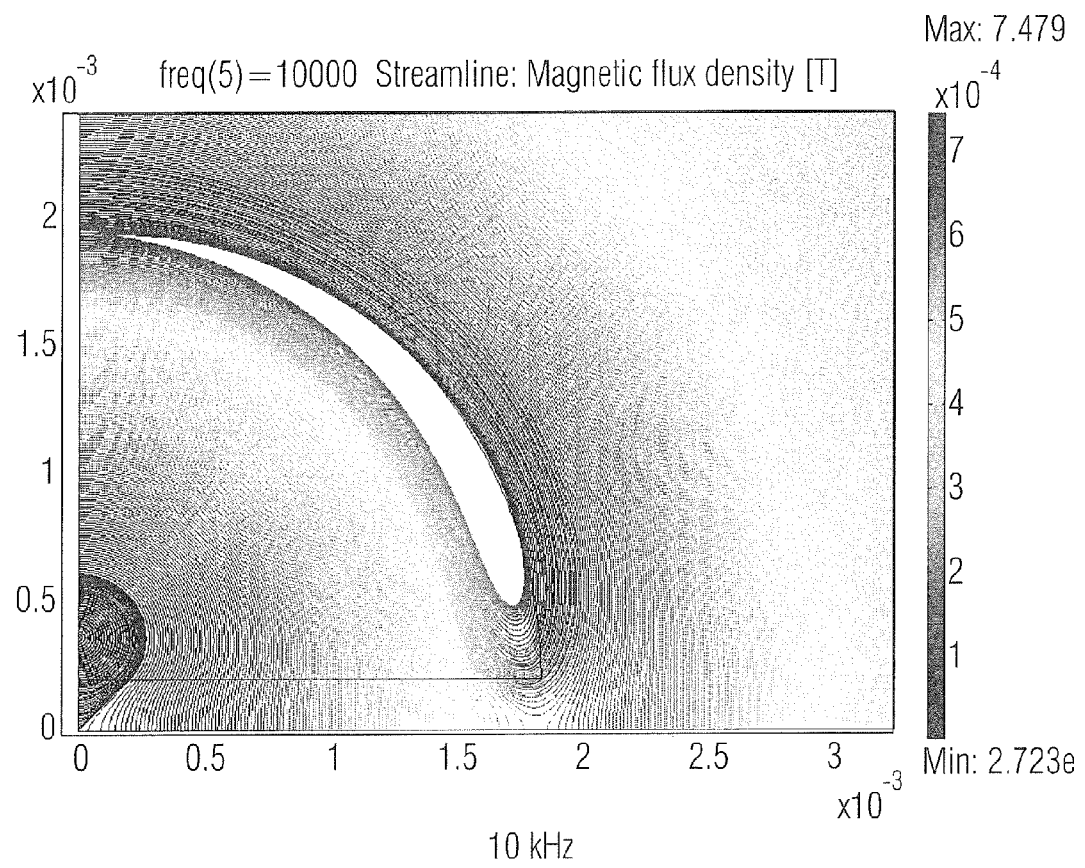
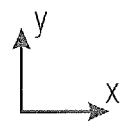
FIG 8B

CURRENT SENSOR

REFERENCE TO RELATED APPLICATION

This application is a divisional of U.S. application Ser. No. 13/873,559 filed on Apr. 30, 2013, which claims priority to U.S. Pat. No. 8,461,824 issued on Jun. 11, 2013 (previously U.S. application Ser. No. 12/794,919 filed on Jun. 7, 2010).

FIELD OF THE INVENTION

Embodiments of the invention relate to the field of current sensing. Embodiments relate to a current sensor and a cable system including a current sensor. Embodiments of the invention relate to current sensors for high current systems (for example, systems using currents of 50 A or more). Embodiments of the invention relate to coreless magnetic current sensors (CLMCS) that include magnetic field sensors, which detect the magnetic field of a current through a conductor and use this information to infer the current.

SUMMARY

Embodiments of the invention provide a current sensor including a conductive element, at least two magnetic field sensors arranged on the conductive element and adapted to sense a magnetic field generated by a current through the conductor element, wherein the at least two magnetic field sensors are arranged on opposite sides of a line perpendicular to a current flow direction in the conductive element, an insulating layer arranged between the conductive element and the magnetic field sensors, and a conductor trace connected to the magnetic field sensors.

Embodiments of the invention provide a current sensor including a substantially cylindrical conductor including a first end, a second end, and a central part arranged between the first end and the second end, wherein the outer diameter of the central part is smaller than the outer diameter of the first and second ends, wherein the first end of the substantially cylindrical conductor includes a terminal element or a first connecting element adapted to be connected to a first cable or to a first contact, wherein the second end of the substantially cylindrical conductor includes a second connecting element adapted to be connected to a second cable or to a second contact, an insulating layer arranged on the central part of the substantially cylindrical conductor, a sensor element arranged at the central part of the substantially cylindrical conductor with a part of the insulating layer arranged between the substantially cylindrical conductor and the sensor element, wherein the sensor element includes at least two magnetic field sensors connected in a differential way and arranged on opposite sides of a line perpendicular to a current flow direction in the substantially cylindrical conductor, and a plurality of conductor traces arranged on the insulating layer and connected to the sensor element.

Embodiments of the invention provide a cable system including a first cable adapted to conduct a current, a conductive element connected to the first cable, at least two magnetic field sensors arranged on the conductive element and adapted to sense a magnetic field generated by a current through the conductor element, wherein the at least two magnetic field sensors are arranged on opposite sides of a line perpendicular to a current flow direction in the conductive element, an insulating layer arranged between the conductive element and the magnetic field sensors, and a conductor trace connected to the magnetic field sensors.

In accordance with embodiments of the invention the at least two magnetic field sensors are arranged on a line perpendicular to the current flow direction in the conductive element, wherein one magnetic field sensor is left of a center line of the conductive element and the other magnetic field sensor is right of the center line of the conductive element so that the relevant components of the magnetic field on both sensor elements point in opposite directions. In embodiments using a Hall sensor the relevant component of the magnetic field is perpendicular to the die surface.

Embodiments may include a cylindrical, conductive shield arranged concentrically around the sensor element.

BRIEF DESCRIPTION OF THE DRAWINGS

FIGS. 8(a)-(d) show plots illustrating the frequency dependency of the flux-lines.

DETAILED DESCRIPTION

Figure 1:
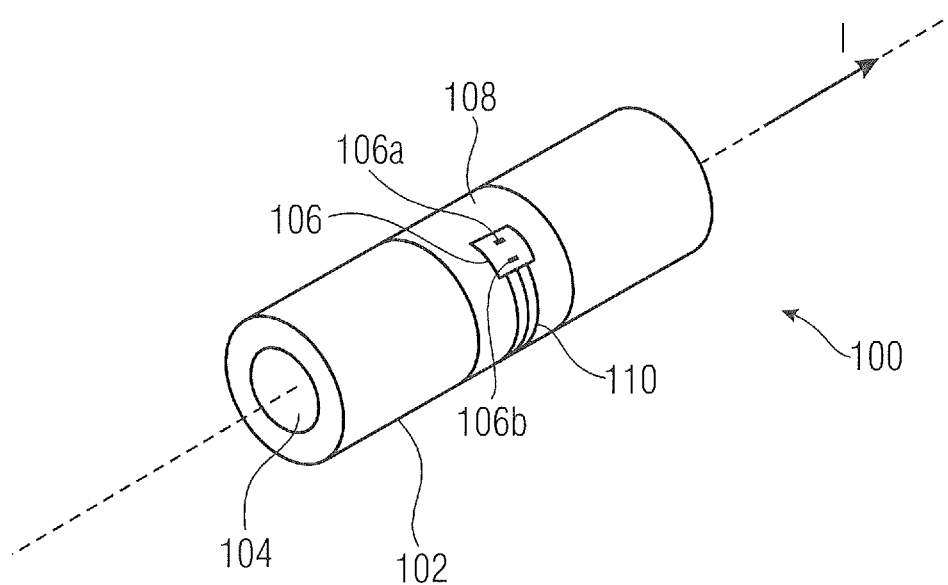
FIG. 1 shows a current sensor in accordance with an embodiment of the invention.

High current systems use busbars or massive cables which may be connected to a busbar. A busbar may be formed by massive strips of copper with cross-sections of e.g. 3 mm×15 mm. A massive cable may include strands of e.g. 10 mm diameter covered with a plastic insulation of e.g. 15 mm outer diameter. A typical application may be the connection to the ports of a car battery. In such an application the cables may be about 1 cm thick.

In such systems two approaches are used for sensing a current, namely (a) putting the cable through a magnetic core, which collects the flux of the current through the cable and directs it onto a magnetic field sensor, or (b) breaking up the cable, inserting a shunt, and measuring the voltage drop across this shunt with a voltmeter. The first approach (a) is disadvantageous since the magnetic core introduces errors into the measurement signal, e.g. nonlinearity, hysteresis, limited bandwidth, too low suppression of background fields, limited over-current, and temperature dependency. Using a closed loop system may improve the accuracy, yet the power consumption of the sensor increases, particularly at large currents to be measured. The second approach (b) is disadvantageous due to the large power loss (e.g. 15.2 W at 390 A), the limited isolation voltage, and the high price. Further, mounting the shunt via screws is apt for a busbar, yet for simple cables one needs two cable-shoes at the ends of the cables plus screws to attach them to the shunt and moreover the shunt has to be attached to some frame or housing without making contact. Thus, there is a need to provide for an improved approach for sensing a current, e.g. a current in such high current systems.

Embodiments of the invention address the problem of how to measure the current in such a cable and provide for an improved way to attach a current sensor to a massive cable.

Embodiments of the invention place a high current sensor onto a massive conductor (e.g., a cylindrical conductor) with a thin voltage isolation layer in-between, whereby the die plane is essentially tangential to the conductor. The die has at least two magnetic field sensors connected, for example, in a differential configuration (to subtract homogeneous background fields). Embodiments of the invention may provide the at least two magnetic field sensors on the conductor (without providing a common die on which the sensors are arranged). The die or the magnetic field sensors is/are arranged on the conductor such that the at least two magnetic field sensors are arranged on opposite sides of a line that is perpendicular to a longitudinal axis of the conductor along which the current to be sensed flows.

Embodiments of the invention use at least two Hall sensors that are arranged on a substrate or sensor die. The sensor die is arranged such that the at least two Hall sensors have substantially the same radial distance to the longitudinal axis of the conductor. In such an arrangement the fluxlines generated by the current through the conductor are substantially tangential through the Hall sensors. Conventionally, such an arrangement of the Hall sensors would have been avoided as for Hall sensors to operate best a perpendicular arrangement with respect to the flux-lines (the magnetic field) is thought to be best. Thus, one would expect signals to be the strongest from a sensor element having its Hall sensors arranged perpendicular to the fluxlines. However, as will be shown later in detail (see FIGS. 14 to 20 and the associated description) this is not necessarily the case. Actually, the inventors found out that the arrangement in accordance with embodiments of the invention (as described above and also referred to as a "tangential" arrangement) provides for stronger signals.

The conductor may be manufactured from a hollow cylindrical sleeve via pressing/forming/crimping. Its two ends may be sleeves which are crimped onto the strands of massive cables or cable shoes.

FIG. 1 shows a current sensor in accordance with an embodiment of the invention. The current sensor 100 includes a conductive element 102, a receptacle 104 adapted to receive a cable, and a sensor element 106 arranged on the conductive element 102. The sensor element 106 senses a magnetic field that is generated by a current I in the conductive element 102. The sensor element 106 comprises two magnetic field sensors 106a, 106b (e.g. Hall sensors) that are arranged on opposite sides of a line 107 (see FIG. 4) perpendicular to the current flow direction. To be more specific, there may be three directions forming a Cartesian tripod (i.e., respective two of these three directions are perpendicular to each other): the current flow direction, the direction of a line connecting the two magnetic field sensors and the line 107, wherein the line 107 passes through a center of gravity of the current density distribution. An insulating layer 108 is arranged between the conductive element 102 and the sensor element 106. The insulating layer 108 may have a dimension larger than the dimension of the sensor element 106 and may further extend partly or completely around the conductive element 102. On the insulating layer 108 one or more conductor traces 110 are provided, one end of which is connected to the sensor element 106. The other end of the conductor traces 110 provides a terminal for outputting the sensor signals. The conductor traces 110 may be arranged such that they do not extend entirely around the conductive element 102 so as to avoid forming a closed circle of the conductor traces 110 through which the conductive element 102 extends. While FIG. 1 shows an embodiment having three conductive traces 110 it is noted that the invention is not limited to this; rather any number of desired traces may be used, e.g. a single trace, two traces or more than three traces.

Figure 2:
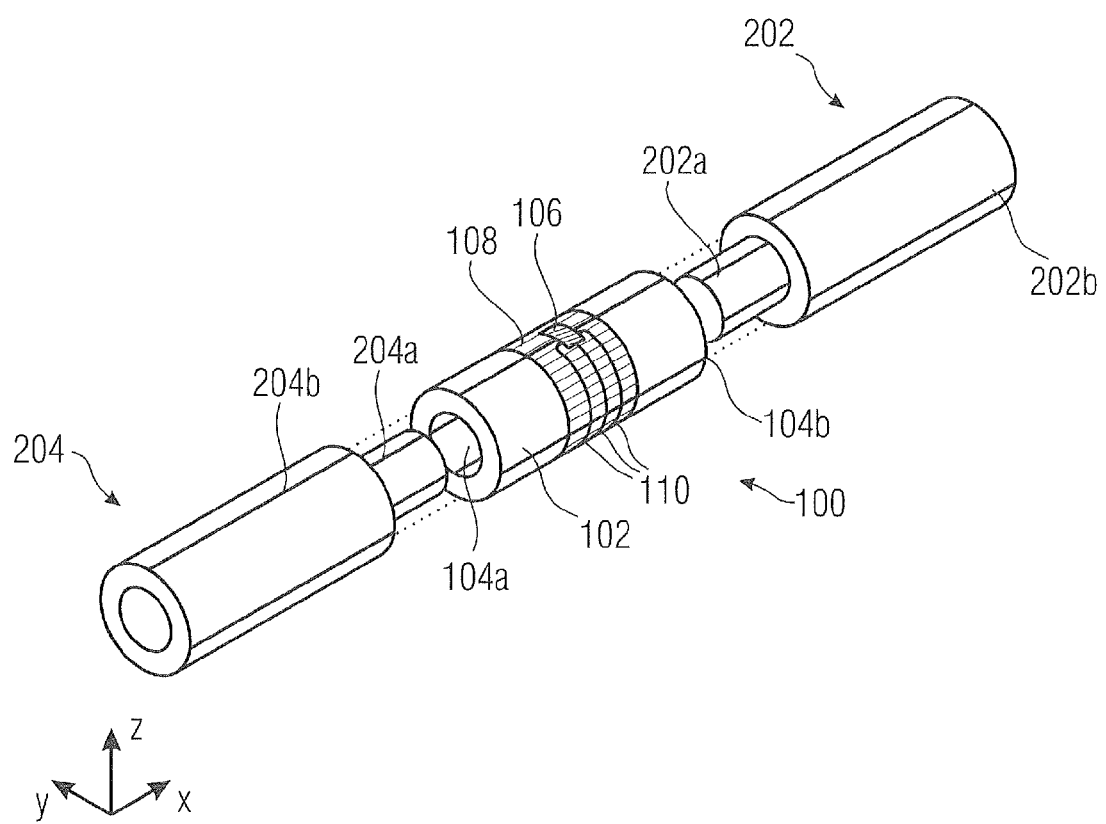
FIG. 2 shows a current sensor in accordance with a further embodiment of the invention.

FIG. 2 shows a current sensor in accordance with a further embodiment of the invention. FIG. 2 shows the current sensor 100 and how it may be inserted between a first cable 202 and a second cable 204. Each cable 202, 204 has a strand 202a, 204a and an insulation 202b and 204b coating the strand 202a, 204a. To allow for a connection to the current sensor 100, the insulation 202b, 204b is removed from those ends of the cables 202, 204 that face the current sensor 100.

The current sensor 100 includes a massive conductor 102 having a cylindrical shape. The receptacle includes a first opening 104a and a second opening 104b at opposite ends of the cylindrical conductor 102. Into the openings the exposed parts of the strands 202a, 204a of the two cables 202, 204 are inserted. Around a central part 112 of the cylinder 102 the insulating layer 108, e.g. a Kapton foil, is wrapped or glued. The foil 108 serves two purposes: first it provides for a desired voltage isolation, and second it carries the fine conductor traces 110 which contact the die (sensor element) 106. The sensor die 106 may be placed atop of this foil 108 in a flip-chip style so that the surface containing the pads faces the surface of the Kapton foil 108 bearing the conductor traces 110 to which the pads are connected. The thickness of the foil 108, in one example, may be between 10 μm and 1 mm. Embodiments of the invention have a foil 108 with a thickness of 50 μm which is sufficient to achieve sufficient withstand voltage (e.g. in the range of 6 kV). All conductor traces 110 may extend only to one side of the massive conductor 102 to avoid closed circles of conductor traces 110 with the massive conductor 102 going through these circles.

In accordance with embodiments of the invention the traces 110 may have maximum distance to an edge of the isolation foil 108 to have a maximum creepage distance. Moreover they may be close to each other thereby spanning a minimum area where noise and disturbances may be coupled due to an electromagnetic interference. The traces 110 may be as fine as possible to act as a fail-safe fuse in case there is a short between the massive conductor 102 and the leads of the sensor die 106. The conductor 102 may be coated in addition with some kind of varnish like that is common in high-voltage transformers to increase the reliability of voltage isolation. In embodiments of the invention, the desired distance of the traces from the edge may be about 3 mm, the separation of the traces from each other may be about 0.1 mm, and the width of the traces may be about 0.05 mm.

FIG. 2 shows an embodiment having a cylindrical conductor 102 with two openings 104a, 104b extending into the conductor 102 from opposite ends. The openings 104a, 104b have a depth sufficient for receiving the exposed ends (without insulation 202b, 204b) of the cables 202, 204. Between the openings 104a, 104b conductor material may remain. The invention is not limited to such embodiments. The receptacle 106 may include a single opening in the cylindrical conductor 102 so that the cylinder is hollow. Alternatively, the cylinder 102 may be hollow with an inner conductor or mandrel provided therein.

Figure 3:
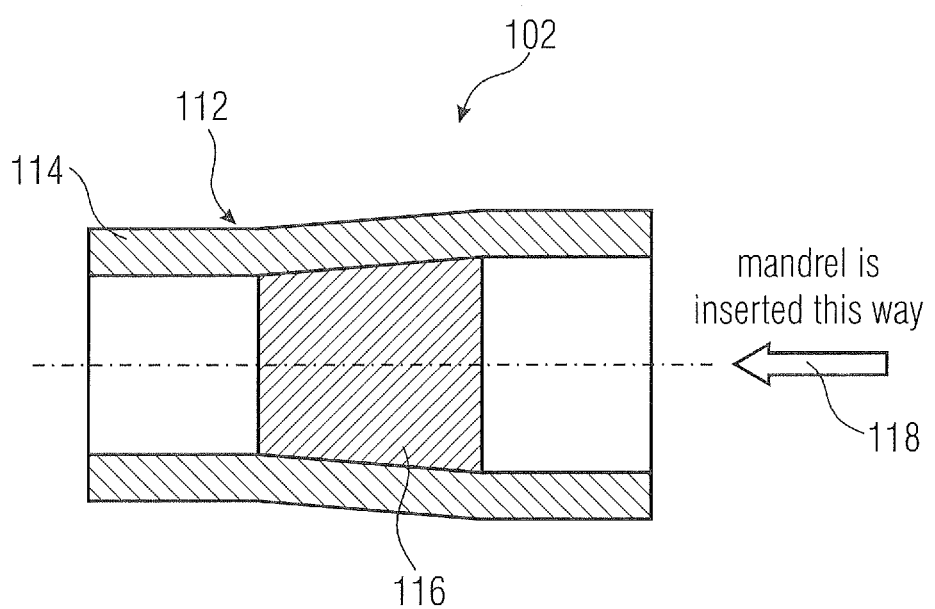
FIG. 3 is a cross sectional view along the longitudinal extension of a cylindrical conductor in accordance with an embodiment.

FIG. 3 is a cross sectional view along the longitudinal extension of a cylindrical conductor 102 in accordance with an embodiment. The conductor 102 has a conical sleeve 114 into which an inner conductor or mandrel 116 is inserted (see the arrow 118). The mandrel 114 basically serves the purpose to make the central part 112 stiffer and to avoid a strain when the strands of the cables are contacted with the sleeve 114 of the cylindrical conductor 102 (this may be done by soldering or crimping). This may be of specific interest in case the sensor is calibrated in an end-of-line-test at a semiconductor manufacturer before it is attached to the cables by the manufacturer of the cable or of the final system. The mandrel 116 may consist of a stiff material like bronze, brass or steel. It may also be stiff enough to use copper, particularly if the mandrel is made of a hard, machinable copper, and the sleeve is made of soft copper (to facilitate crimping). A non-magnetic material may be used for the mandrel 116 (in this case copper should have a particularly low or vanishing iron and nickel content).

The mandrel 116 may be slightly conical and the sleeve 114 may be pressed also into slightly conical shape so that the mandrel 116 can be pressed tightly into the sleeve 114. It is noted that in FIG. 3 the aperture angle of the sleeve 114 is shown exaggerated, in practice the aperture angle is much smaller. It may be advantageous to join the mandrel 116 and the sleeve 114 by ultrasonic welding or brazing or soldering in order to make the central part 112 as stiff as possible to avoid changes in the shape when the sleeve 114 is squeezed onto the strands of the cables. Embodiments avoid that the outer surface of the sleeve 114 is conical, because a conical shape is more difficult to coat with isolating foils around the entire circumference without gaps and blisters.

Figures 4A, 4B:
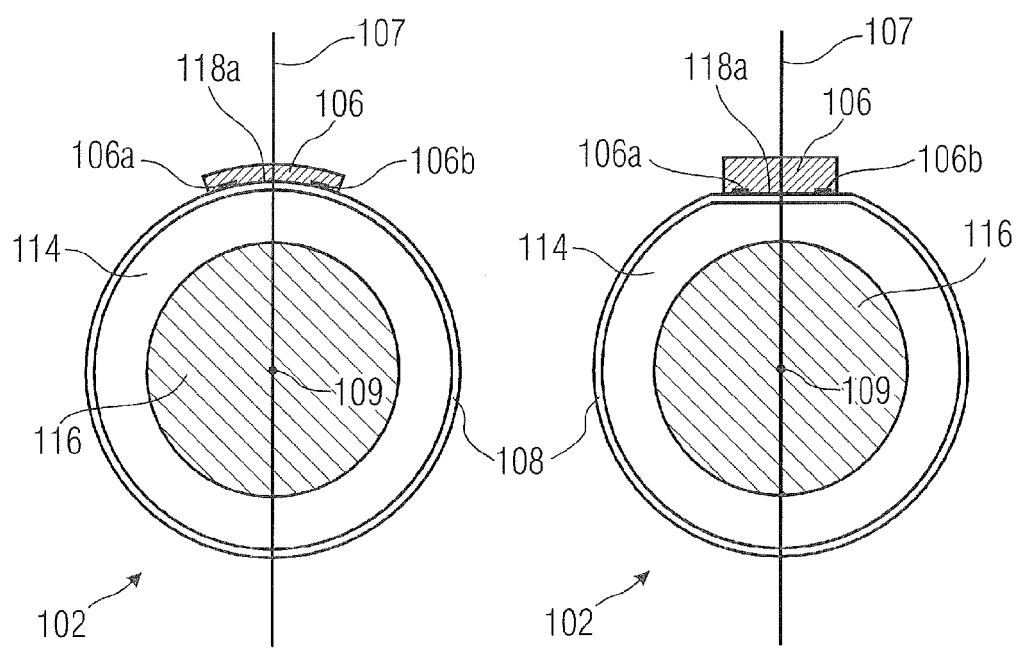
FIGS. 4(a)-(b) show cross sectional views of embodiments of two cylindrical conductors along their lateral extension.

FIG. 4 shows cross sectional views of embodiments of two cylindrical conductors along their lateral extension. As can be seen from FIGS. 4(a) and 4(b) the mounting positions of the sensor die 106 to the sleeve 102 with the Kapton foil 108 in-between may be circular 118a or flat 118b. The arrangement of the magnetic field sensors 106a and 106b on two opposite sides of the line 107 can be seen. In accordance with an embodiment of the invention the sensors 106a, 106b may be Hall sensors arranged with substantially the same radial distance to the longitudinal axis 109 of the sleeve 102.

In the case of a circular surface 118a the die 106 has to bend in order to avoid air voids between the isolation foil 108 and the conductor sleeve 114. Such voids should be avoided because they may collect moisture and weaken the voltage isolation due to the large dielectric constant of water. Moreover the voids may give rise to popcoring and are usually the starting point for a delamination, which is generally considered a major risk for reliability. Therefore in one embodiment the die 106 is flexible, e.g. the die thickness should be below 100 μm (e.g. 40 μm). This may be achieved by suitable manufacturing techniques (e.g. thin wafer techniques like grinding before dicing and the like). This geometry may lead to a slight reduction of the sensitivity of the sensor because if the surfaces of the Hall plates 106a, 106b are perfectly tangential to the circular conductor 102 the magnetic field perpendicular through the plates vanishes.

In the case of a flattened die-attach surface 118b shown in FIG. 4(b) the die 106 may be thicker than in the above described situation (e.g. 210 μm). In this case, the die 106 may be more difficult to seal with a top insulating foil. The sleeve 114 may be flattened by pressing.

Figure 5A:
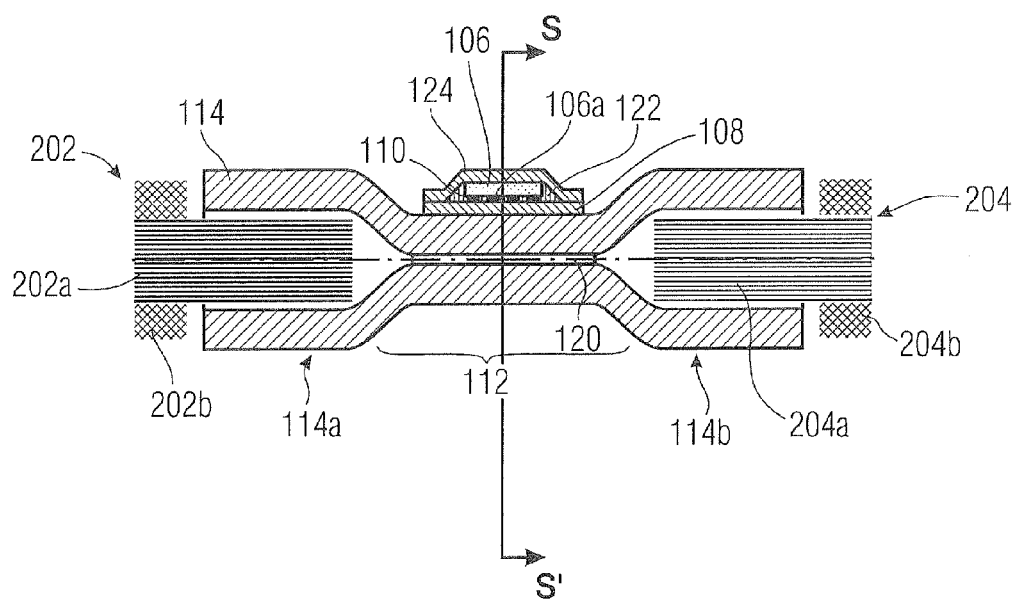
FIG. 5(a) shows another embodiment of the current sensor.

FIG. 5(a) shows another embodiment of the current sensor. Besides using a sleeve with or without mandrel, in this embodiment a sleeve is used having a corrugation in the center part, where the die is attached to the conductor. FIG.

5(a) is a cross sectional view along the longitudinal extension of a cylindrical conductor 102 of the current sensor 100. The conductor 102 is formed by a sleeve 114 that may be formed of soft copper. The sleeve 114 has a first end 114a and a second end 114b. The central part 112 is arranged between the first end 114a and the second end 114b and obtained by pressing the sleeve 114 in this part. This results in the corrugation of the copper sleeve 114 in the central part 112, wherein the sleeve 114 may be pressed such that a small opening 120 remains or such that no opening remains. The sensor die 106 including the Hall sensor 106a is mounted in the corrugation 112 with the isolating foil 108 between the sensor die 106 and the sleeve 114. In this embodiment the foil 108 only extend partly around the sleeve 114. The conductor traces 110 are provided on the foil 108, and the die 106 is flip-chip bonded onto the traces 110. The space between the die 106 and the foil 108 is filled with an underfill material 122. In this embodiment, an additional or upper isolating foil 124 is provided to cover the die 106. At the first end 114a of the sleeve 114 a first opening 104a is formed which receives the strand 202a of the first cable 202. At the second end 114b of the sleeve 114 a second opening 104b is formed which receives the strand 204a of the second cable 204. In this embodiment the conductor cross-section is reduced underneath the sensor die 106 and thus the current density and the magnetic field is increased. Moreover the outer diameter of the entire structure including the die is kept at a minimum. The inner opening 120 may vanish or may remain with a smaller dimension than at the two ends of the sleeve, e.g. in case this is necessary due to given rules of metal transforming. However, even if the part below the sensor remains a hollow cylinder this will not lead to a frequency dependency as long as its inner and outer surfaces are cylindrical. This will be shown below:

Without corrugation the sleeve has inner and outer diameters $a_1$, $a_2$—whereas the corrugated part has a vanishing inner diameter and an outer diameter $a_3=\sqrt{a_2^2-a_1^2}$. This means that the cross sectional area of the corrugation is equal to the cross sectional area of the sleeve. This is due to the fact that the corrugation is manufactured by metal forming. The differential field without corrugation is $$\Delta B_y^{sleeve} = \frac{\mu_0 I}{2\pi} \frac{d}{(d/2)^2 + (a_2+g)^2}$$

and with corrugation it is $$\Delta B_y^{corrug} = \frac{\mu_0 I}{2\pi} \frac{d}{(d/2)^2 + (a_3+g)^2} > \Delta B_y^{sleeve}.$$

In the following g denotes the isolation gap, which is the distance between the conductor surface and the semiconductor die; and d is the spacing of the two magnetic field sensors, which may be planar Hall plates integrated on a single silicon die.

In one embodiment, a cable having a cross-sectional area of 100 mm² (used for 500 A current) and having a strand diameter of 11.3 mm is assumed. The sleeve used for cable-shoes of this strand diameter has the following diameters $a_1$=5.7 mm, $a_2$=8.5 mm and $a_3$=6.3 mm. Therefore, the differential field without corrugation is 4.44 mT and with corrugation it is 7.72 mT. Since ordinary Hall sensors have an accuracy of at least 50 µT this corresponds to 0.65% of the nominal current (=3.2 A). Thus, the field is fairly small. The reason is the low current density of only 5 A/mm² in the strand of the cable. If the current density in the strand were to be increased to 10 A/mm² the field would also increase to 15.44 mT—yet this is sometimes not allowed due to safety regulations (because the cable may heat up too much). A better way to improve this may be a reduction of the cross-section in the center part of the sensor, yet this cannot be done by a simple corrugation.

If there is a certain current density in the cable strand ($I=\pi a_1^2 S_{cable}$) then there is a current density in the corrugated part which is not larger than $$I = \pi a_3^2 S_{corrug}.$$

Thus, the ratio of current densities is $S_{corrug}/S_{cable}=a_1^2/a_3^2=1/((a_2/a_1)^2-1)$ and the differential field becomes $$\Delta B_y^{corrug} = \frac{\mu_0 a_3^2 S_{corrug}}{2} \frac{d}{(d/2)^2 + (a_3+g)^2} = \frac{\mu_0 a_3^2 S_{cable}}{2((a_2/a_1)^2 - 1)} \frac{d}{(d/2)^2 + (a_3+g)^2}$$

Assuming a value of $a_3$ being large when compared to d and g the differential field becomes:

$$\Delta B_y^{corrug} \to \frac{\mu_0 S_{cable} d}{2((a_2/a_1)^2 - 1)}.$$

Therefore the inner and outer diameter of the sleeve should match as closely as possible—this means that the sleeve has to be thin-walled. The minimum thickness of the wall of the sleeve is determined either by the metal forming process or by dissipation caused in the corrugated portion of the conductor or by the structural stability of the final sensor. The latter problem can be tackled by using additional non-conducting and non-magnetic supporting structures like PCBs to increase the stiffness of the sensor. Assuming an outer diameter of the sleeve to be $a_2$=7 mm in the above example a differential field of 21.6 mT is obtained, while the current density in the cable is only 5 A/mm². The wall thickness of the sleeve is only 0.65 mm in one embodiment. To sum up: one may adjust the magnetic field by reducing the thickness of the sleeve thereby increasing the loss in the corrugation so that there is a trade-off between dissipation and accuracy.

Instead of crimping the sleeves over the stranded ends of the cables the sleeves may also be made of hard copper and they may carry internal threads on their ends. This sensor element can be screwed onto a threaded bolt. It may be advantageous if only one end of the sensor is equipped with this thread, while the opposite end is realized as described above. Moreover, it may be advantageous if the end with the thread has some profile in the shape of a nut at its outer surface so that force can be applied to the thread via the threaded end only without the force being transmitted through the sensitive part with the sensor die.

Figure 5B:
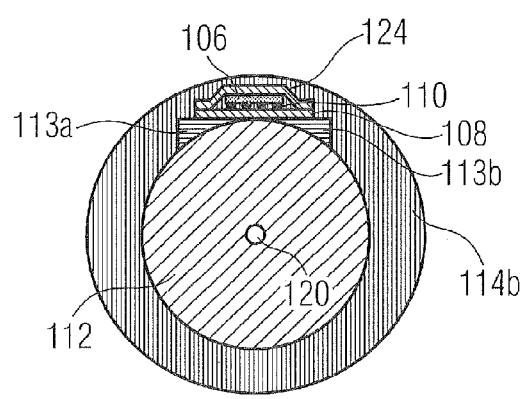
FIG. 5(b) is a cross sectional view of the current sensor of FIG. 5(a) along the line S-S' in FIG. 5(a), wherein the corrugation has a circular cross section.

FIG. 5(b) is a cross sectional view of the current sensor of FIG. 5(a) along the line S-S' in FIG. 5(a). In this embodiment the corrugation 112 has a circular cross section. As can be seen, the die 108 is attached to a top portion of the corrugation 112. To support the die 108 on the circular corrugation 112 supporting wedges 113a and 113b are provided. The supporting wedges 113a, 113b may be made of plastic and may be electrically isolating and non-magnetic.

Figure 5C:
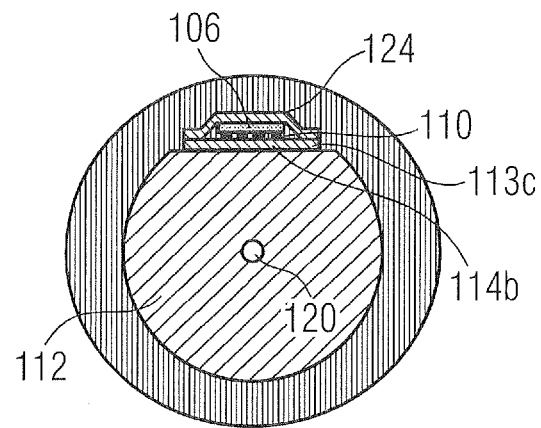
FIG. 5(c) is a cross sectional view of the current sensor of FIG. 5(a) along the line S-S' in FIG. 5(a), wherein the corrugation has a circular cross section with a flattened die attachment surface.

FIG. 5(c) is a cross sectional view of the current sensor of FIG. 5(a) along the line S-S' in FIG. 5(a), wherein the corrugation 112 has a circular cross section with a flattened die attachment surface 113c.

Figure 5D:
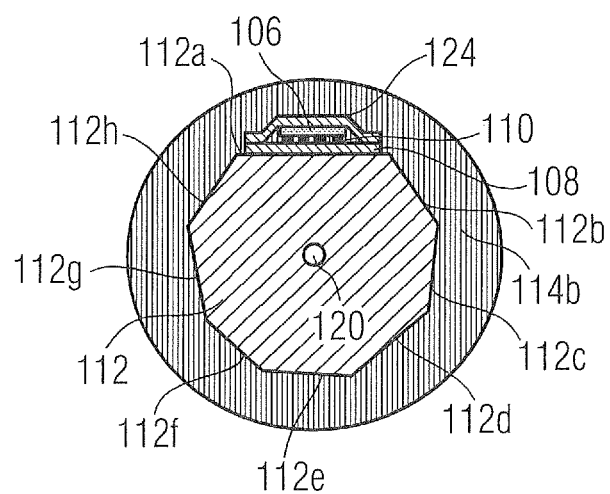
FIG. 5(d) is a cross sectional view of the current sensor of FIG. 5(a) along the line S-S' in FIG. 5(a), wherein the corrugation has a circular shaped (polygonal) cross section.

FIG. 5(d) is a cross sectional view of the current sensor of FIG. 5(a) along the line S-S' in FIG. 5(a), wherein the corrugation 112 has a substantially circular shaped (polygonal) cross section. More specifically, the corrugation 112 has eight flat surfaces 112a-112h connected as shown in the FIG. The die 108 is attached to the surface 112a. The surfaces 112a to 112b may be of the same length or may have different lengths.

Figure 6:
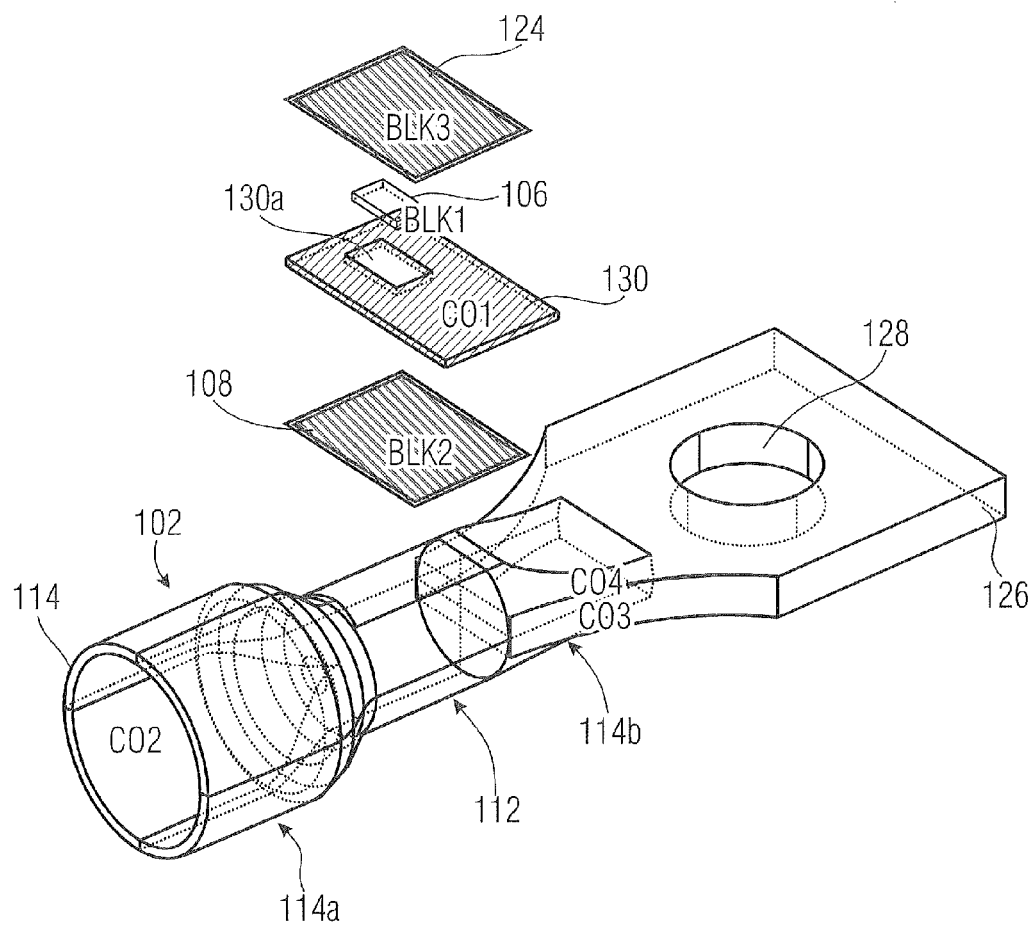
FIG. 6 shows an embodiment of the invention similar to the one of FIG. 5(a), except that at the second end of the sleeve a connecting member is provided allowing a connection of the sleeve to a terminal, e.g. a battery port.

In the embodiments of the invention described above the sensor was placed in-between two cables. The invention is not limited to such embodiments. FIG. 6 shows an embodiment of the invention similar to the one of FIG. 5(a), except that at the second end of the sleeve a connecting member is provided allowing a connection of the sleeve to a terminal, e.g. a battery port. The second end 114b of the sleeve 114 ($a_1$=5.7 mm, $a_2$=7 mm, $a_3$=4.1 mm) is tapered and comprises a rectangular plate 126 having a hole 128 forming a part of a cable-shoe. The isolation foils 108 and 124 are shown which may have a thickness of 0.2 mm and which may be of Kapton. A PCB (printed circuit board) 130, e.g. a FR4-board (PCB) having a thickness of about 0.5 mm, is provided between the two foils 108, 124. The PCB 130 has a hole 130a for receiving the die 106 therein. The die 106 may be oriented with its open bond pads downwards and an Ag-paste may be used to contact the fine copper traces on the upper side of the lower Kapton foil 108. On the right side one can connect wires to supply the sensor circuit and to make contact to its output signals. The PCB plus isolation foils and parts of the wires may be overmolded to provide additional voltage isolation and protection from environmental influences. The right side of the cable-shoe has the hole 128 so that it may be bolted to a heavy contact of a busbar or a plug (e.g. of a battery in a car). Embodiments of the invention may also provide cable-shoes at both ends of the sleeve.

The embodiment of FIG. 6 may be slightly modified as follows:

The foils 108, 124 may overlap the PCB 130, so that they can be glued together along the entire perimeter of the PCB 130. This provides for a voltage isolation and a better barrier against lateral moisture ingress. Alternatively the PCB 130 with die 106 may be wrapped up with Kapton foil by one or several turns.

The PCB 130 may have only a recess instead of a hole. In this recess one can place the die while the remaining material of the recess carries the fine traces to contact the die. Then the Kapton foil does not need to carry the traces.

In simpler systems the PCB 130 does not need to have a hole or a recess: if one places the die face-down atop the PCB it may be contacted via traces on the upper side of the PCB. This may increase the isolation gap, because the foil 108 and the remaining layer of PCB material are between the conductor and the sensor. Alternatively one may place the die face-up beneath the PCB with traces at the bottom side of the PCB. Alternatively one may place the die face-up atop the PCB with traces on the top side of the PCB. The contact between pads on the die and conductor traces on the PCB may be carried out with ordinary bond wires.

An underfill may serve as additional means for voltage isolation—in particular with all these versions, where the die is contacted in a flip-chip manner.

In the following, three possible arrangements of the sensor die and the conductor will be compared, and it will be shown that arrangement described above in accordance with embodiments of the invention is the best in terms of bandwidth and sensitivity.

Figure 7:
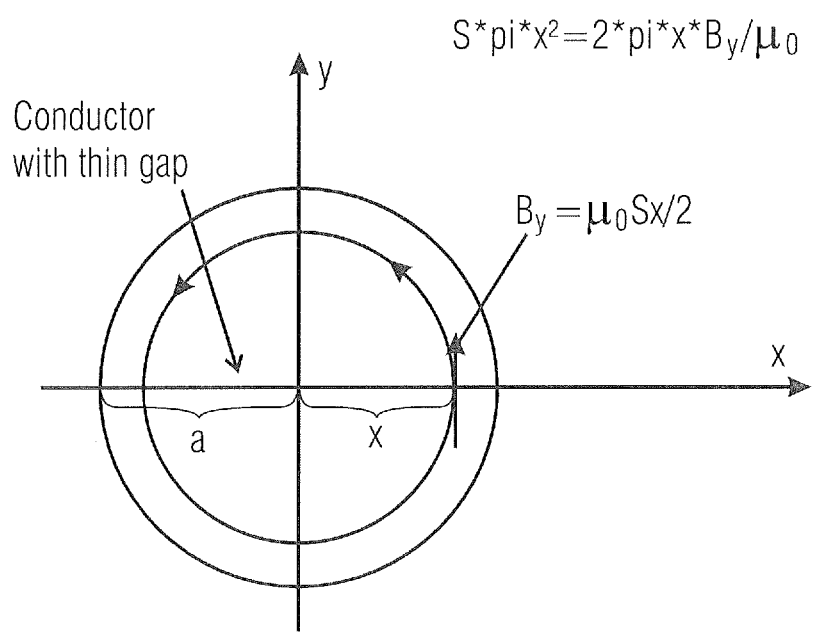
FIG. 7 shows a schematic cross sectional view of the conductor which has a slim slot in the center plane.
Figure 8A:
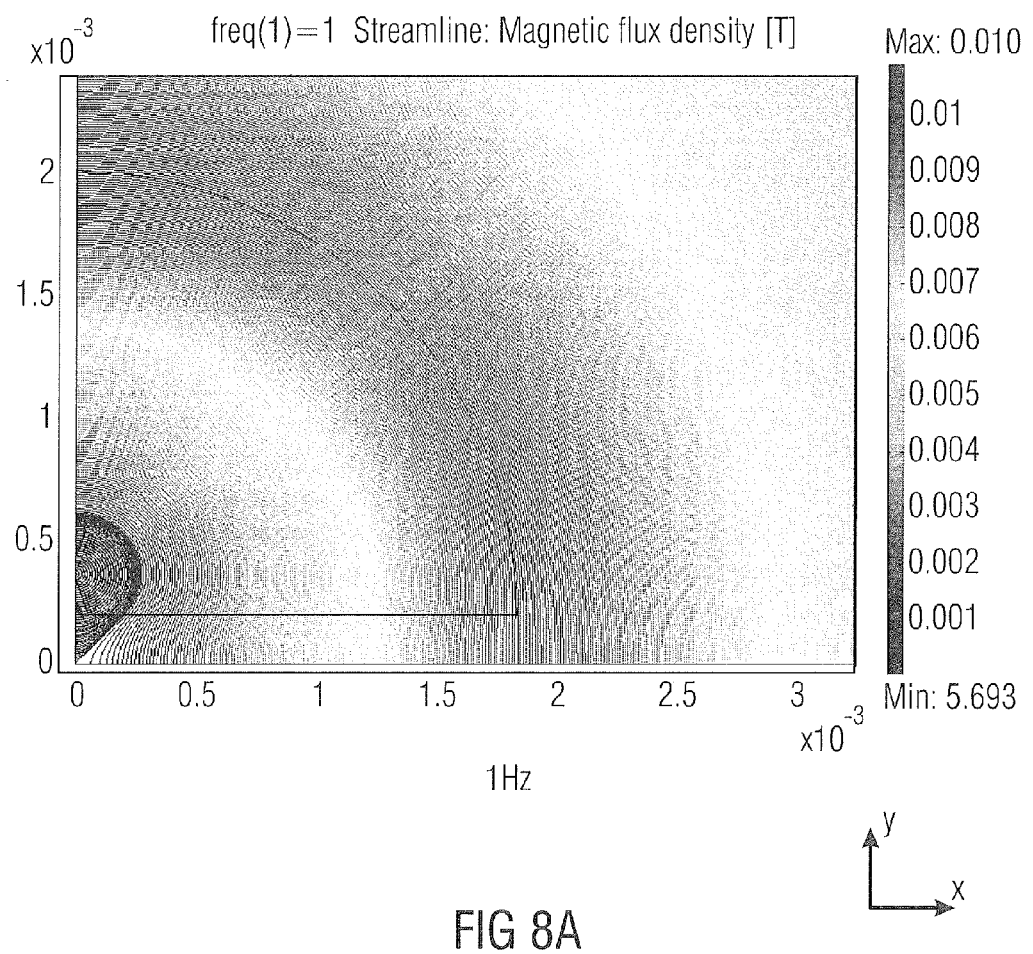
Figure 8C:
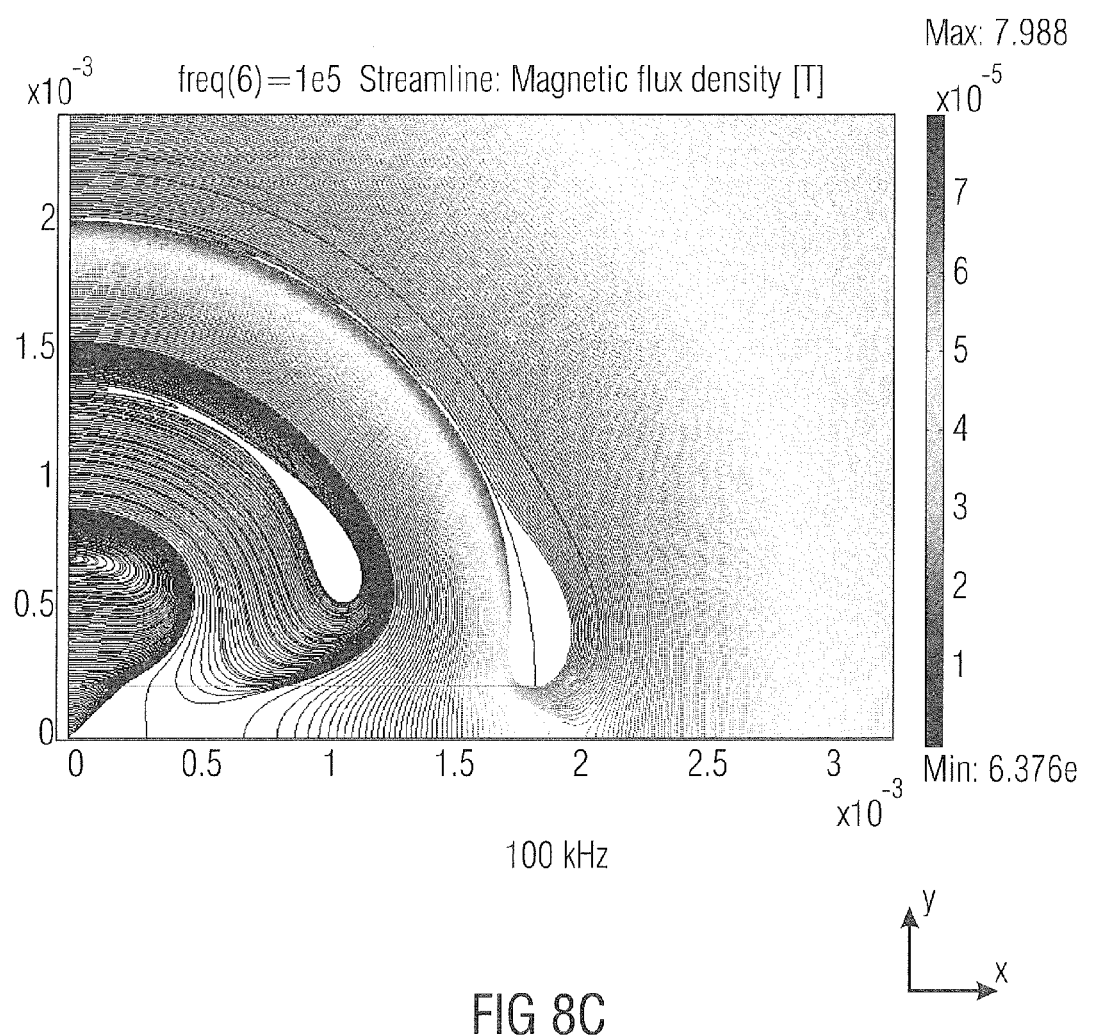
Figure 8D:
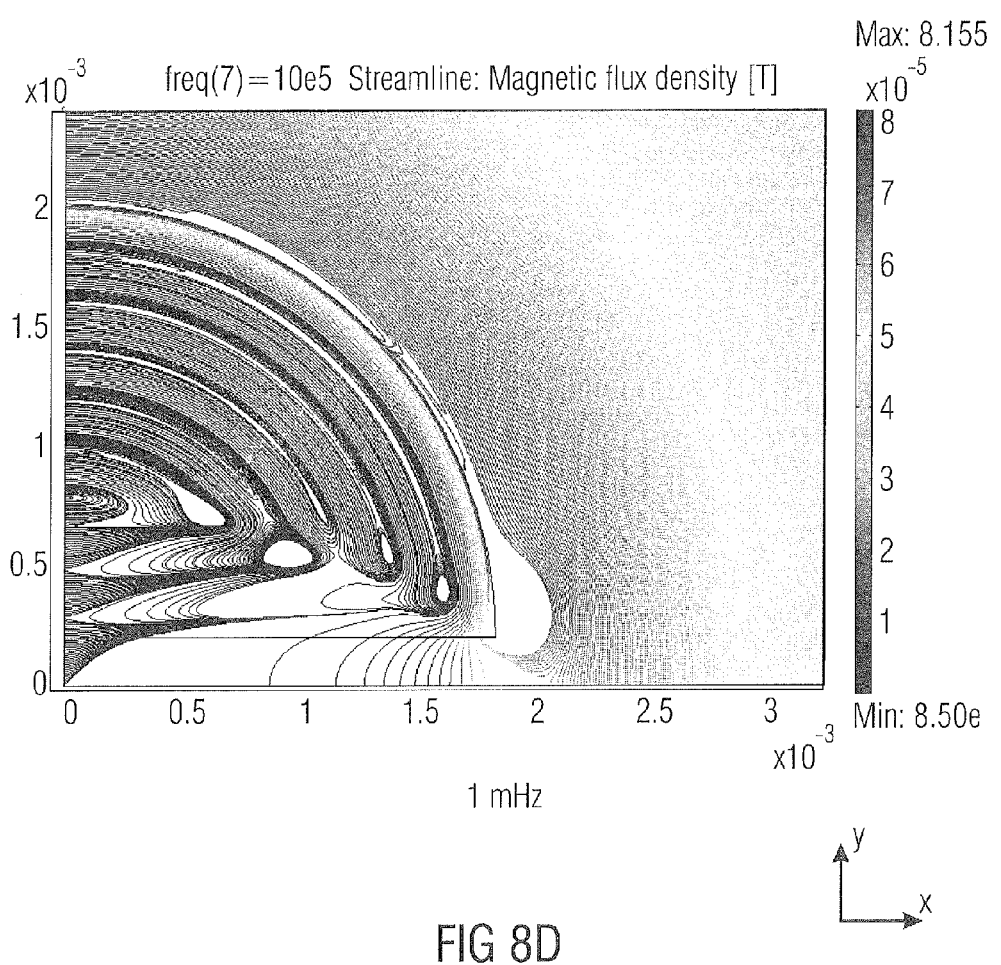

FIG. 7 shows a schematic cross sectional view of the conductor 102 which has a slim slot in the center plane y=0 and −a<x<a:

$$Sx^2\pi = 2\pi x B_y/\mu_0 \to B_y = \mu_0 Sx/2$$

If the differential system has two Hall sensor elements on a single die at a distance d, the difference in magnetic fields is:

$$\Delta B_y = \mu_0 Sd/2$$

For S=10 A/mm² and d=3.5 mm: $\Delta B_y = 2\pi \times 10^{-7}$* 0.0035=22 mT. This system works for conductor diameters from 3.5 mm upwards—therefore from 96 A upwards. At smaller currents it gets inefficient, because one cannot scale down the diameter and still keep the gap small to this diameter—on the other hand, if we keep the diameter constant and reduce the current then the current density goes down and thus the magnetic field gets small (which increases noise, drift of zero point and accuracy).

In practice one faces the problem how to isolate the die from the conductor. This could be done by putting the die in-between two foils of Kapton, where one foil has fine copper traces to contact the die. If each foil is 0.1 mm thick and the die is also 0.1 mm thick the total gap is 0.3 mm thick and this is still small compared to 3.5 mm diameter. If the sensor elements are placed in the very center of the gap we have to increase it even to 0.4 mm. Another problem of this conductor geometry are eddy currents: at higher frequencies the current is expelled from the interior of the conductor and this changes the magnetic field distribution in the gap where the die is placed.

Figure 9A:
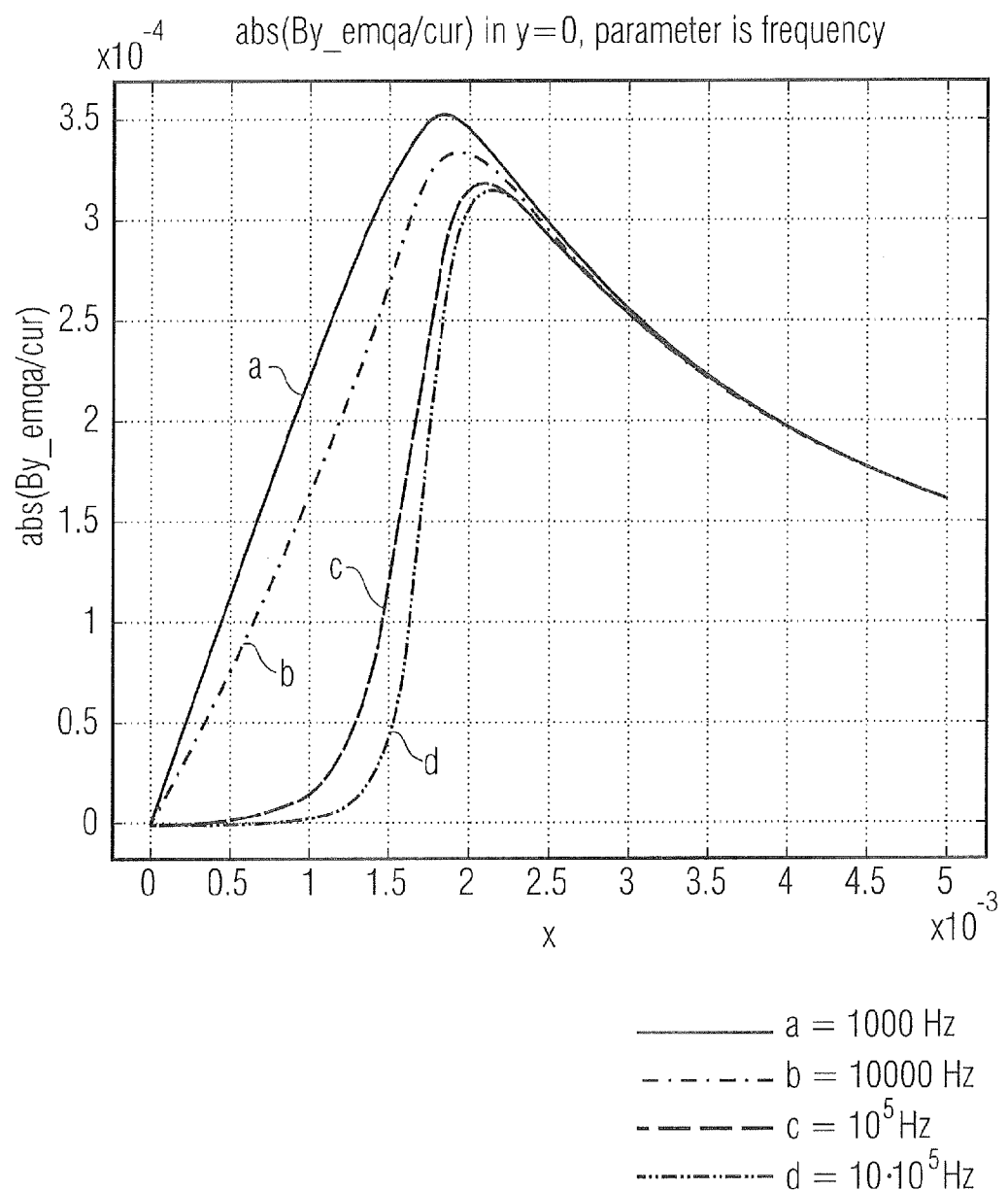
FIGS. 9(a)-(b) show plots illustrating a phase distortion in the gap of the slotted circular conductor.
Figure 9B:
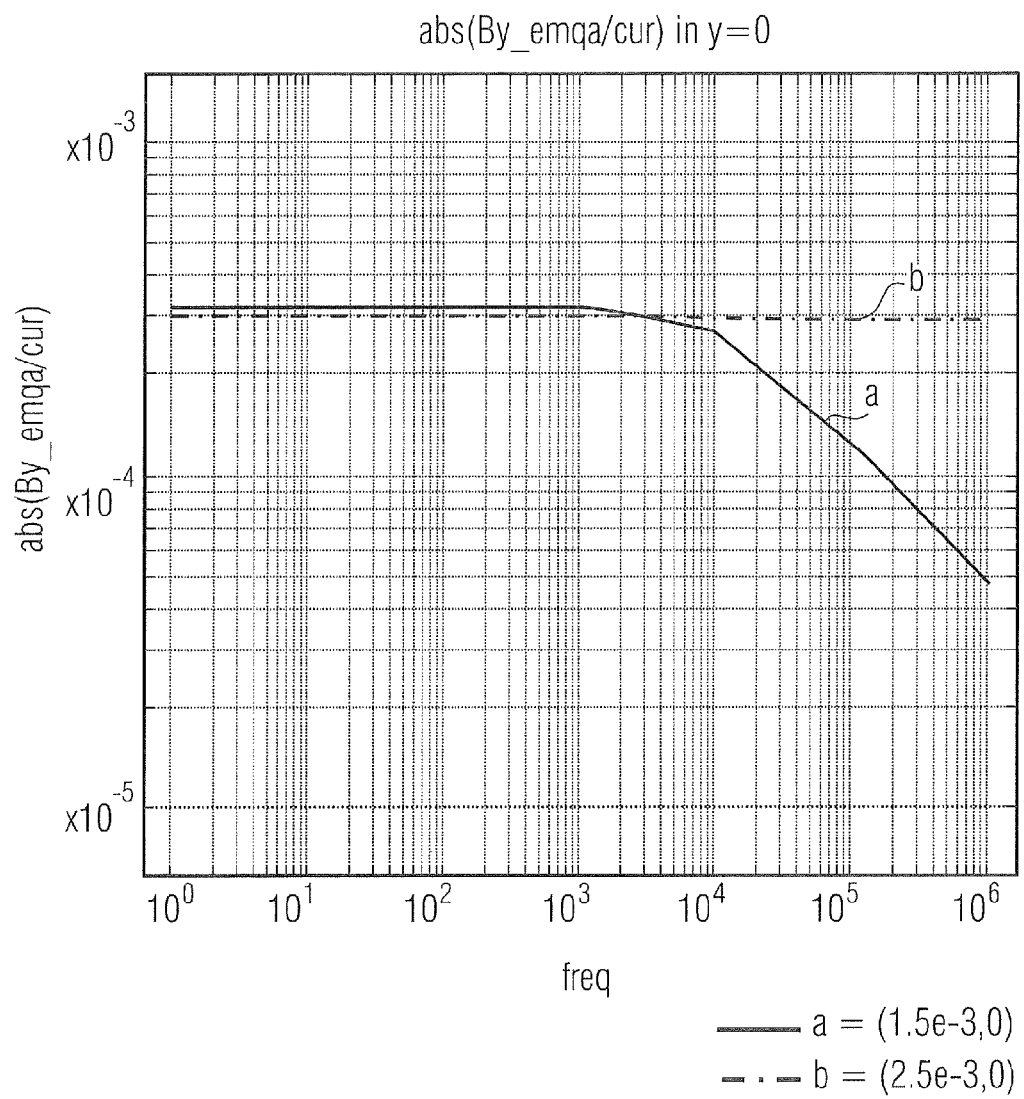

The fluxlines have the frequency dependency as shown in FIGS. 8(a)-8(d). As can be seen in FIG. 9(a), the field in the center plane within the gap of the conductor decreases drastically at x=1.5 e-3 m=1.5 mm at frequencies above 20 kHz (−3 dB corner frequency).

Figure 10A:
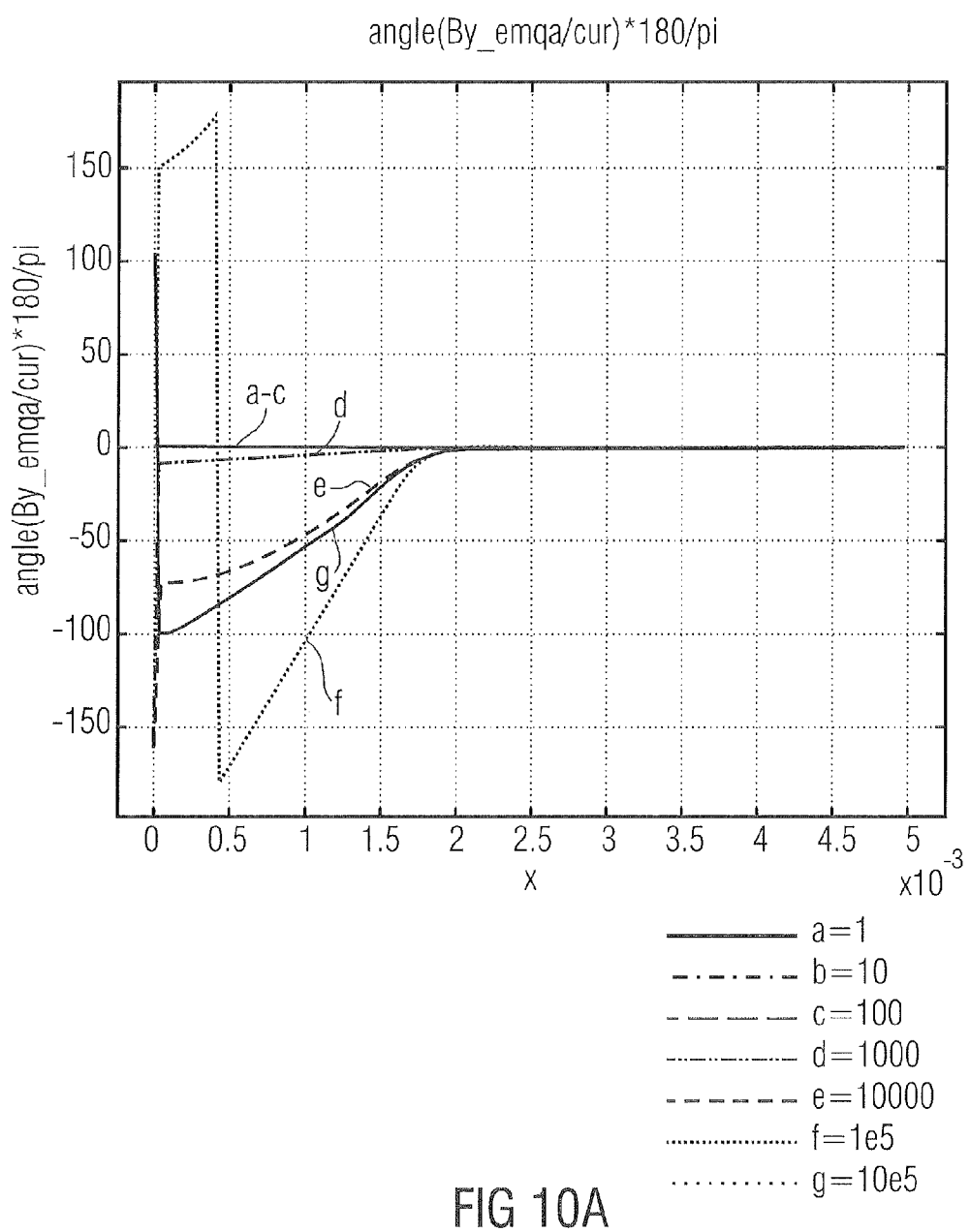
FIGS. 10(a)-(b) show plots illustrating a decrease of the corner frequency for larger cross-sections.
Figure 10B:
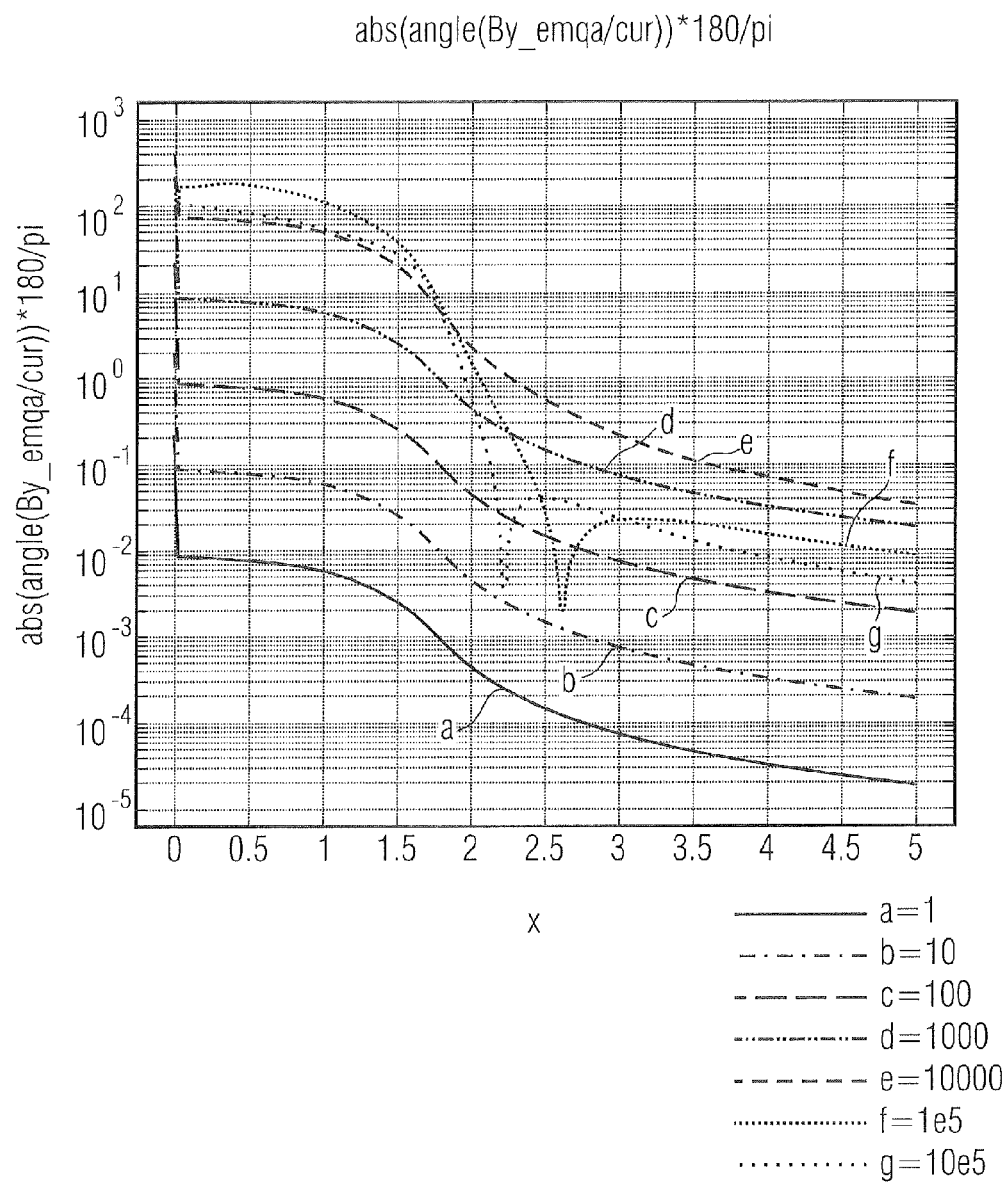

As can be seen from FIGS. 10(a) and 10(b), the phase is also significantly distorted in the gap of the slotted circular conductor at y=0 and x<2 mm.

Thus, the measurement of the current in the gap of the conductor of FIG. 7 works only for frequencies below ca. 5 kHz with high accuracy.

Figure 11:
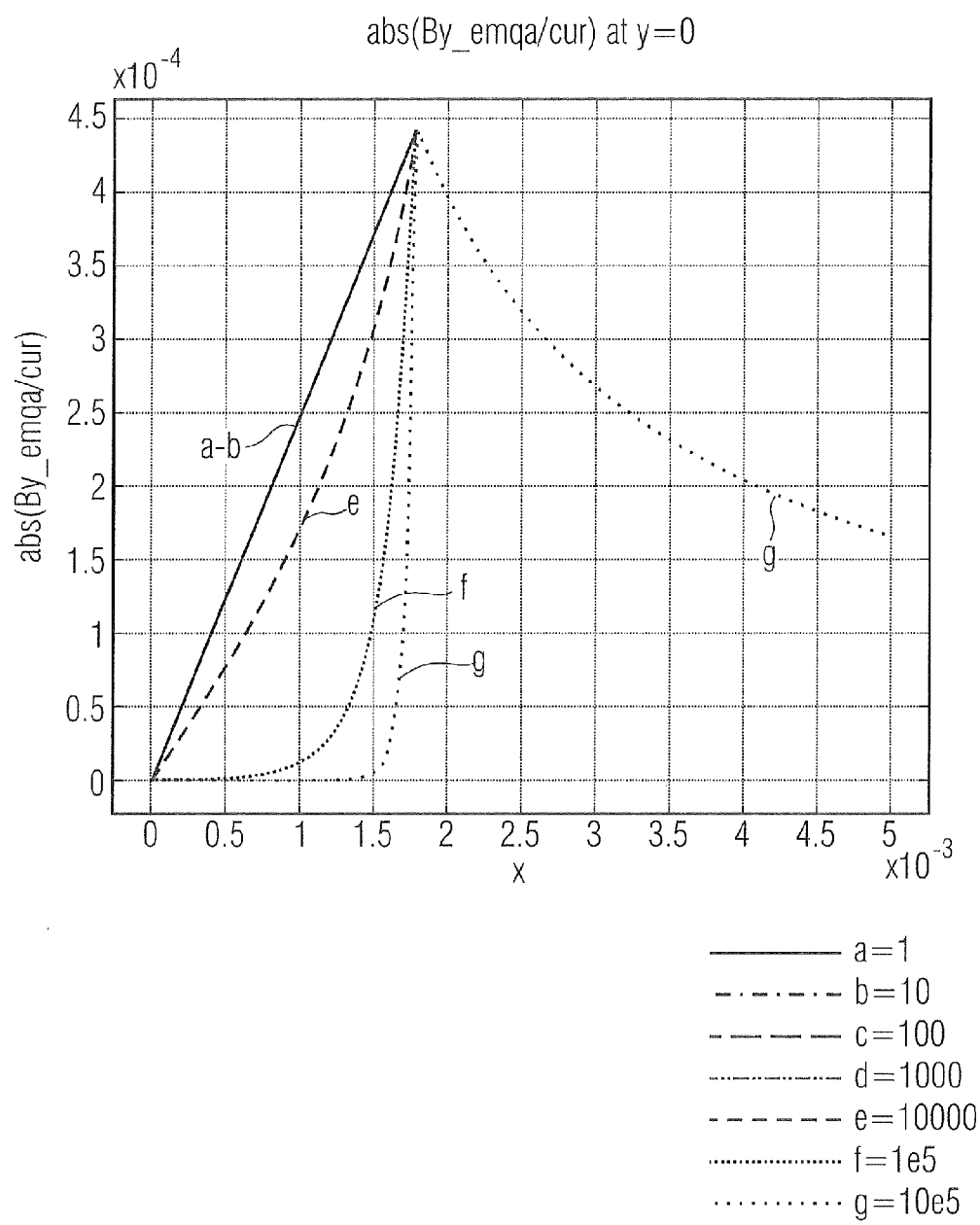
FIG. 11 shows that the By-field is expelled out of the interior of the conductor, whereas it does not change outside the circular conductor.
Figure 12A:
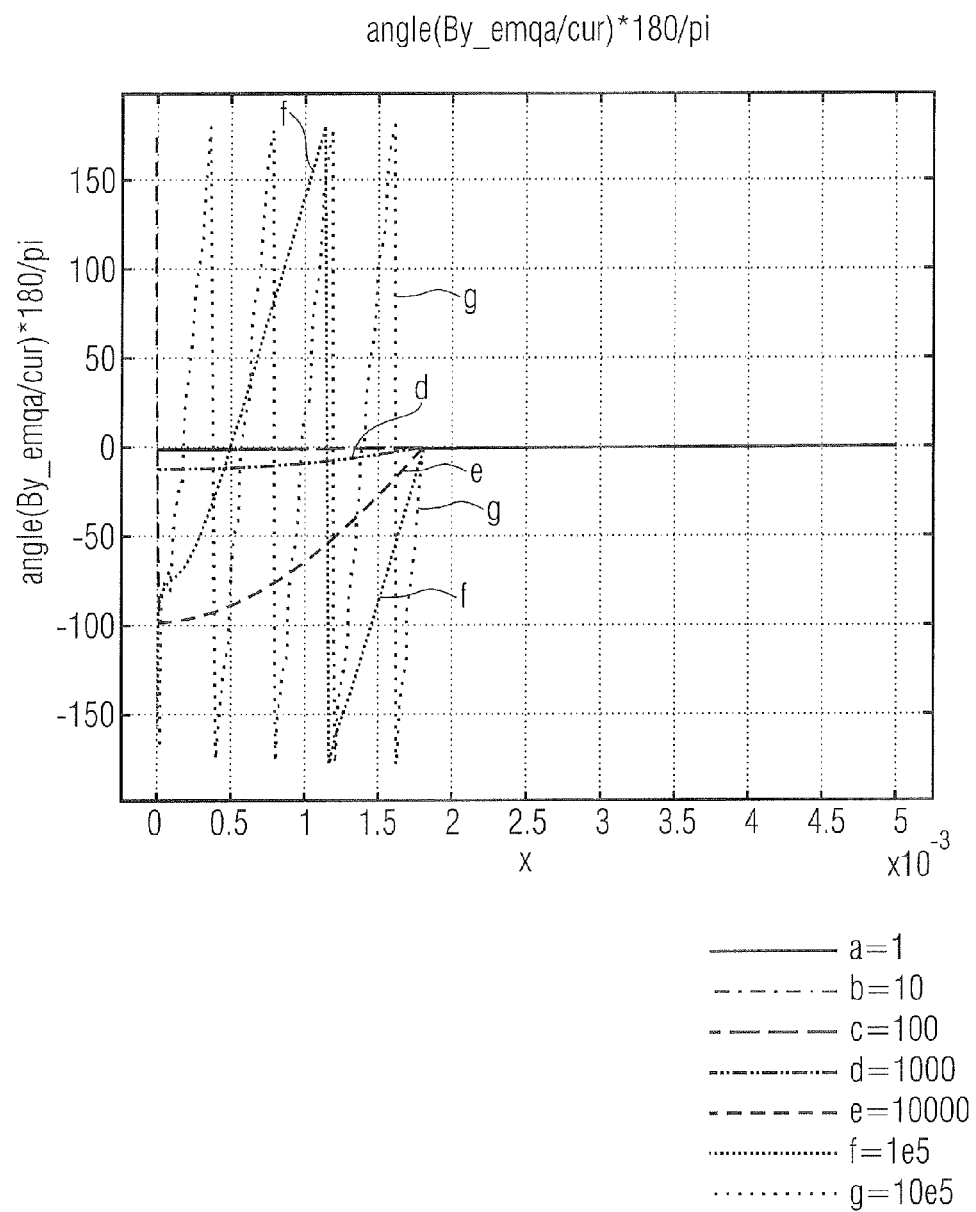
FIGS. 12(a)-(b) show plots showing that the phase of the magnetic field outside the conductor is also constant vs. frequency.
Figure 12B:
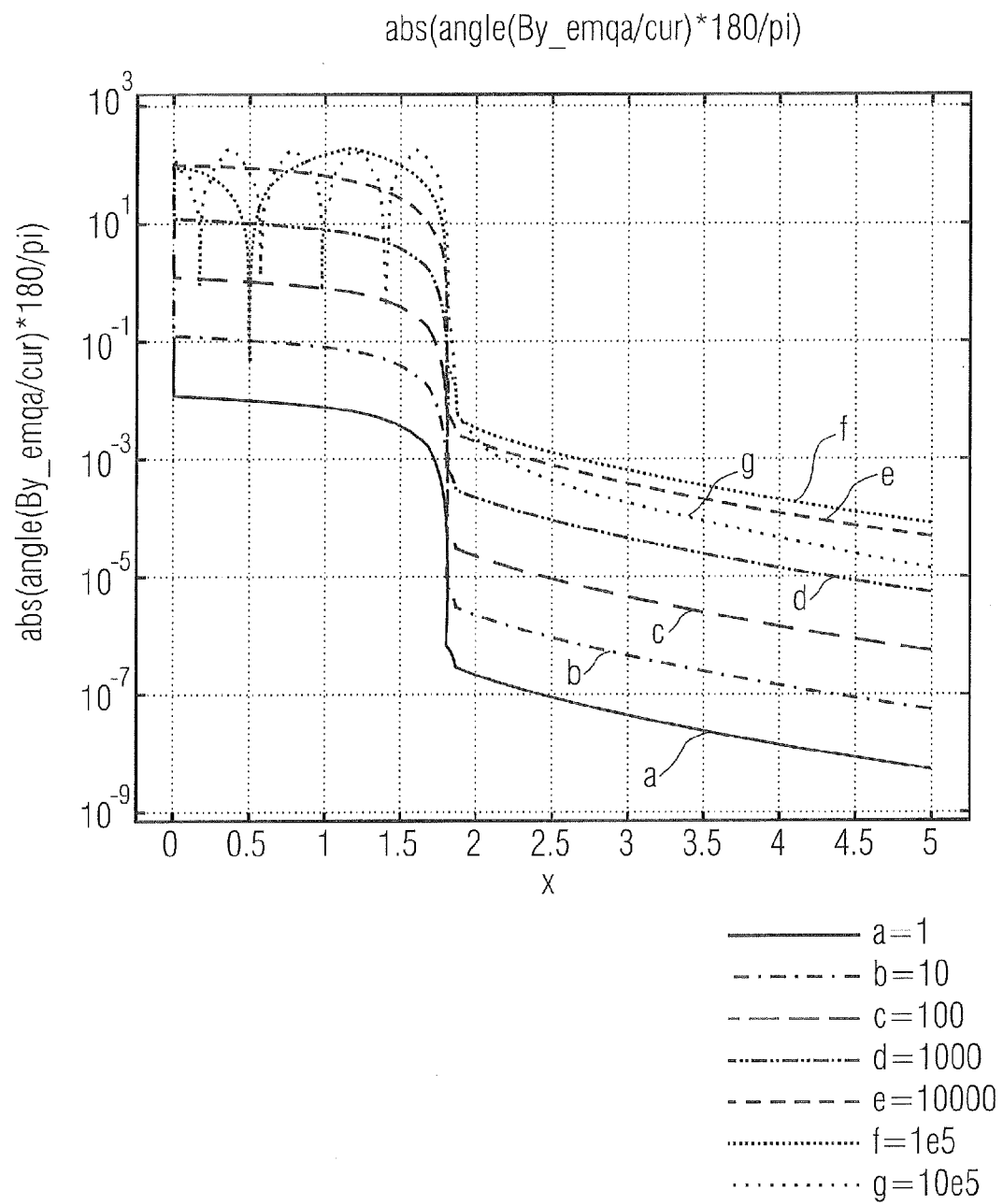
Figure 13:
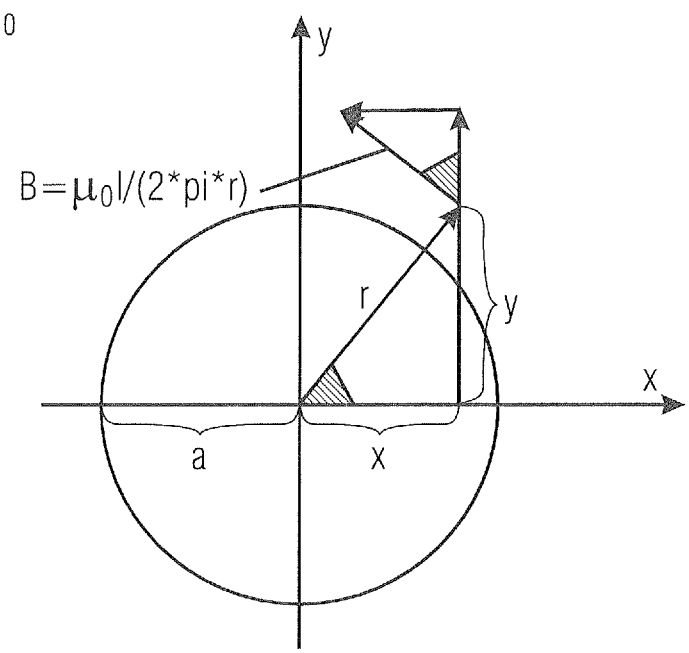
FIG. 13 is a representation for calculating the magnetic field outside the circular conductor.
Figure 14:
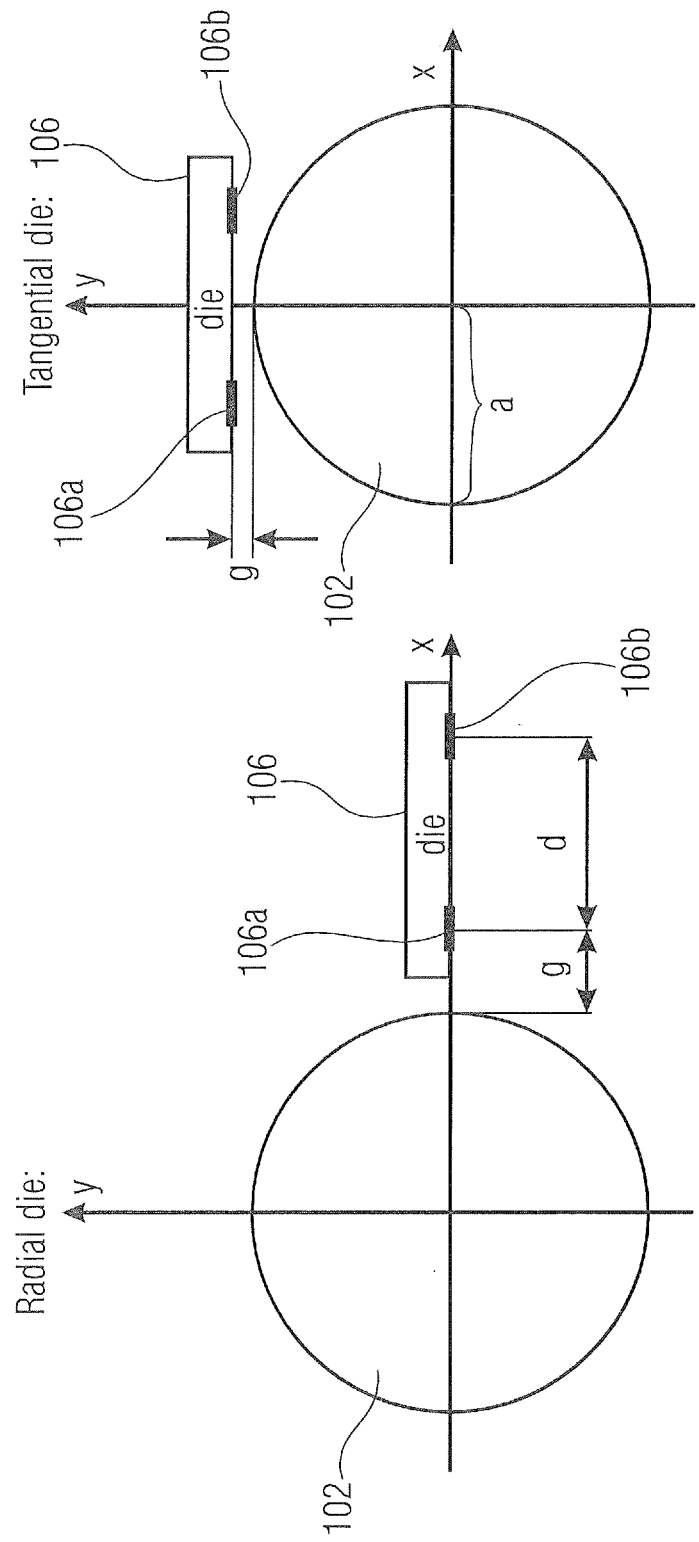
FIGS. 14(a)-(b) show two possible orientations of the sensor die with respect to the conductor, a radial orientation (FIG. 14(a)), and a tangential arrangement (see FIG. 14(b)).

To avoid this frequency dependency, in accordance with an embodiment of the invention the conductor is circular and the die is placed outside the conductor: FIG. 11 shows that the By-field is expelled out of the interior of a massive conductor (x<1.8 mm) whereas it does not change outside the circular conductor. The phase of the magnetic field outside the conductor is also constant vs. frequency (see FIG. 12—the small dependency for x>1.8 mm in FIG. 12(b) originates from discretization errors of the FEM-code). The magnetic field outside the circular conductor is given by (see FIG. 13)

$$B_y = \frac{xB}{r} = \frac{\mu_0 I}{2\pi} \frac{x}{x^2 + y^2}$$

In the following it will be discussed that the tangential arrangement of the magnetic field sensors in accordance with embodiments of the invention is advantageous over a conventional radial arrangement. There are two possible orientations of the sensor die 106 with respect to the conductor 102. In the radial orientation the Hall sensor elements 106a, 106b are lined up on the same radius-ray through the center of the conductor 102 (see FIG. 14(a)): one element 106a is at a radial distance of a+g, the other element 106b is at the radial distance a+g+d from the center of the conductor. In the tangential arrangement (see FIG. 14(b)) both Hall sensor elements 106, 106b have the same radial distance to the center of the conductor sqrt((a+g)^2+(d/2)^2).

Figure 15:
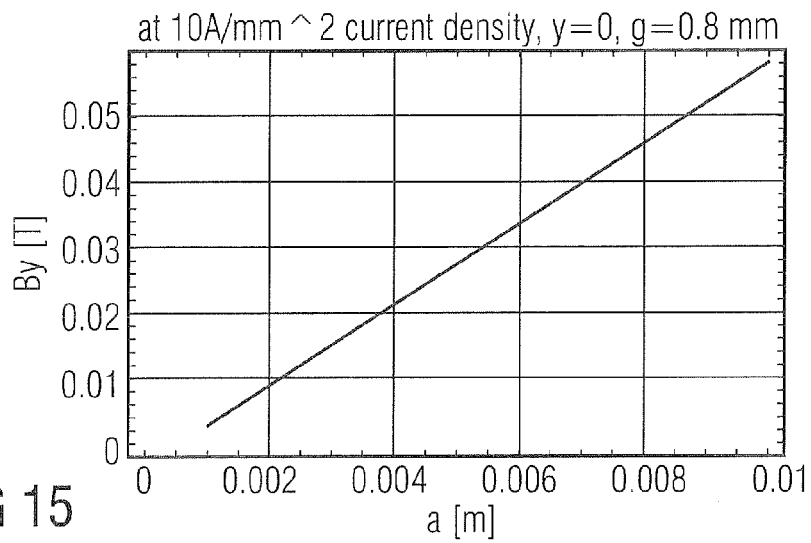
FIG. 15 is a graph showing the linear increase of the magnetic field with conductor diameter.
Figure 16:
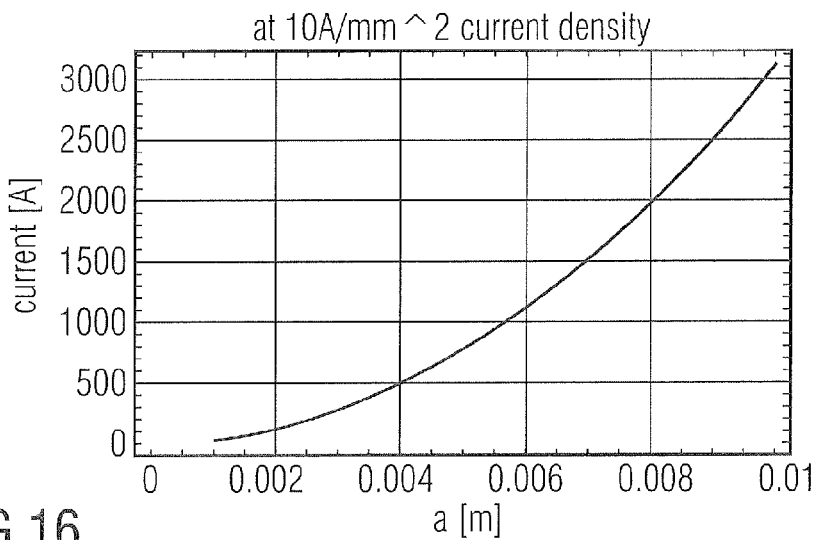
FIG. 16 is a graph showing that the current increases with the square of the conductor diameter.

Note that in reality the isolation gap g is smaller in the tangential arrangement (>0.1 mm) than in the radial one (>0.5 mm). Since the isolation gap is subject to thermal expansion and maybe subjected to a deformation versus lifetime (e.g. via moisture soaking or mechanical load) the radial arrangement seems more stable over lifetime than the tangential one. In the radial arrangement the die is perpendicular to the fluxlines, whereas in the tangential arrangement they are fairly tangential. One would expect that the signals from the Hall sensors are much stronger in the radial arrangement, yet this is not necessarily the case:

In the radial case the field on each sensor element is strong:

$$B_y = \frac{\mu_0 I}{2\pi} \frac{1}{a+g}$$

on the left element and $$B_y = \frac{\mu_0 I}{2\pi} \frac{1}{a+g+d}$$

on the right one. If the current density is kept constant at 10 A/mm² the full scale magnetic field increases nearly linearly with conductor diameter as is shown in FIG. 15. The current increases with the square of the conductor diameter as is shown in FIG. 16. E.g. at 8 mm diameter (a=4 mm) the current is 500 A and the field on the left Hall plate is 21 mT. Yet, this field cannot be used for signal processing—it is not yet compensated against background disturbances. To this end one needs to subtract the fields on both Hall plates and this gives a much lower signal:

$$dB_y = \frac{\mu_0 I}{2\pi}\left(\frac{1}{a+g} - \frac{1}{a+g+d}\right).$$

Figure 17:
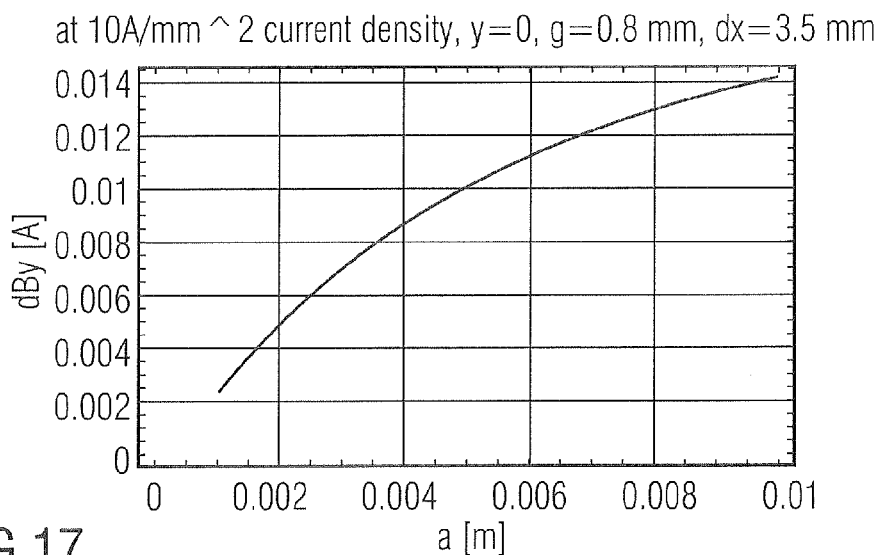
FIG. 17 is a graph showing the increase of the magnetic field with conductor diameter when the sensor has a radial orientation with respect to the conductor.

Thus, the differential field is only 9 mT at 500 A (see FIG. 17).

The situation is more favorable in the tangential arrangement. Although the absolute field on each Hall element is low $$B_y = \pm \frac{\mu_0 I}{2\pi} \frac{d/2}{(d/2)^2 + (a+g)^2}$$

the differential field is twice as large:

$$\Delta B_y = \frac{\mu_0 I}{2\pi} \frac{d}{(d/2)^2 + (a+g)^2}.$$

Figure 18:
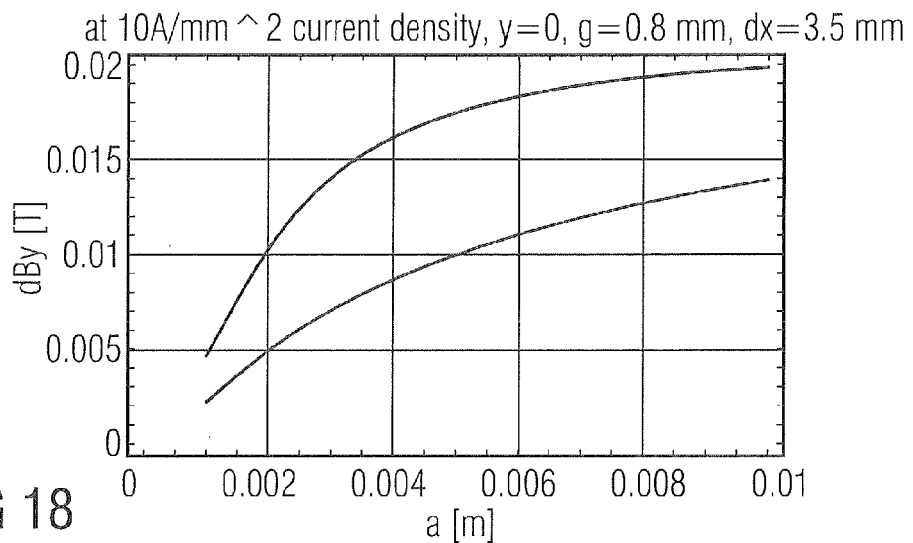
FIG. 18 is a graph showing the increase of the magnetic field with conductor diameter for both a sensor having a radial orientation and a sensor having a tangential orientation with respect to the conductor.
Figure 19:
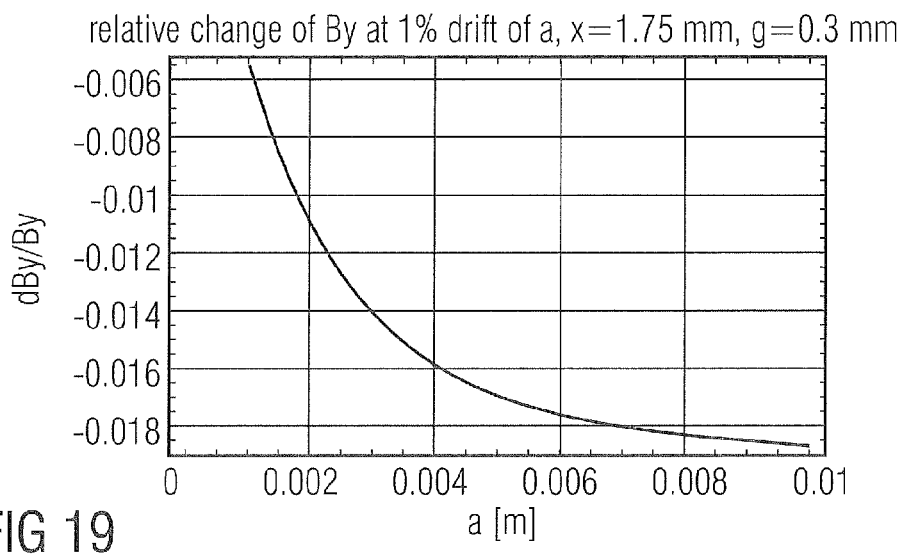
FIGS. 19-20 show graphs of the measurement drifts for small and large diameter conductors.
Figure 20:
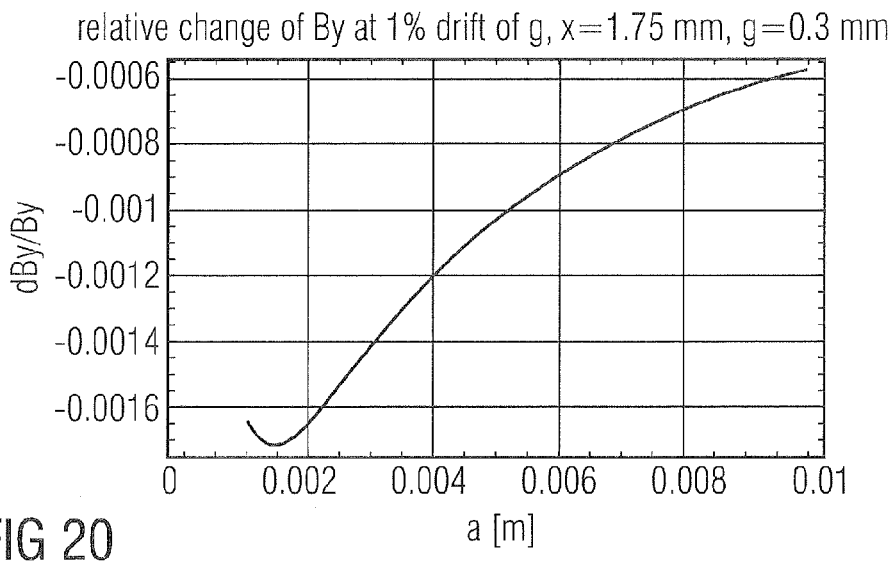

FIG. 18 shows both signals for radial and tangential arrangement, where the upper curve corresponds to the tangential arrangement. As can be seen, the signal is about 16 mT at 500 A (which is 67% larger than above!). In the plot of FIG. 18 the isolation gap g was 0.3 mm for the tangential setup and 0.8 mm for the radial one.

Considering a very large conductor, the radius a goes to infinity while the current density remains constant $$\lim_{a\to\infty} \Delta B_y = \lim_{a\to\infty} \frac{\mu_0 a^2 \pi S}{2\pi} \frac{d}{(d/2)^2 + (a+g)^2} = \frac{\mu_0 S d}{2}$$

which becomes 22 mT for 10 A/mm² and a spacing of 3.5 mm between the two Hall plates. First we see that the signal is proportional to current density, not to current: thus the sensor is rather a current-density-sensor than a current sensor. Second we note that the signal is identical to the signal obtained by a sensor in a slim gap of two conductors with half-spherical cross-section (like shown in the start)! This is really good news, because it is much easier to manufacture a sensor with a die atop a circular conductor than having a die in-between two massive conductors with half-circular cross-section. Moreover we have greatly enhanced bandwidth. And still we do not loose sensitivity, as long as the conductor is much larger than the die! This will be shown below.

If the diameter of the conductor increases by 1% due to thermal expansion or mechanical stress while the current is constant this increases the cross section by 2% and effectively reduces the current density by 2%. Thus any change in diameter is twice as large in the measurement result. As long as the conductor is not too big the measurement drifts by less than 2% (see FIG. 19). The thermal expansion can be accounted for by the sensor circuit, as long as the sensor is thermally tied to the conductor.

If the thickness of the isolation gap changes by 1% this affects the current measurement by −2Δg/a (for large conductor diameter 2a) and slightly more for slimmer conductors. Since the isolation gap is usually thin it is much less critical than the conductor diameter: drifts of only 0.1% are expected (see FIG. 20).

Embodiments of the invention, like the ones described above, relate to so called coreless magnetic current sensors (CLMCS). The term "coreless" in CLMCS means that there is no magnetic core with μr>1.01 or μr<0.99 used to collect the flux around the conductor. As described above, these sensors are magnetic field sensors, which detect the magnetic field of a current through a conductor and use this information to infer the current. The above embodiments used double Hall systems where the magnetic field is sampled at two spots.

Figure 21A:
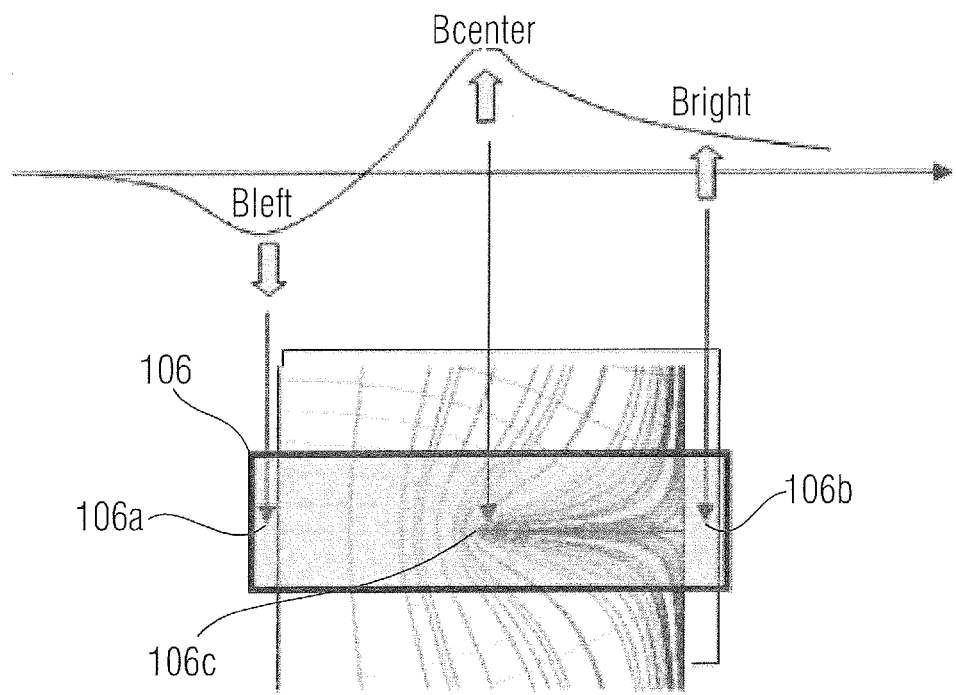
FIGS. 21(a)-(c) show examples of triple Hall systems for currents up to 400 A with three different shapes of a conductor.
Figure 21B:
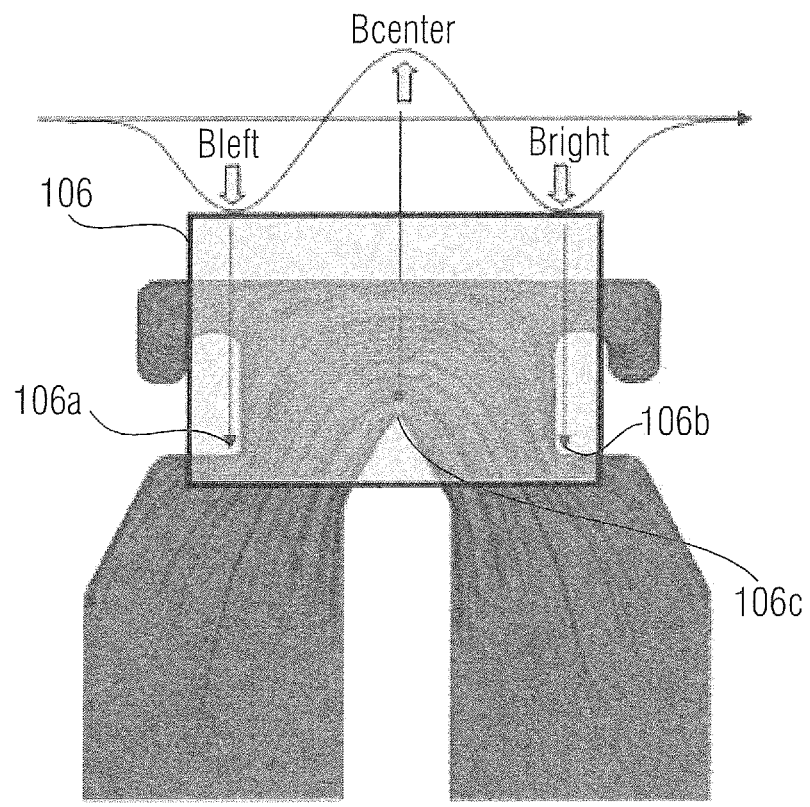
Figure 21C:
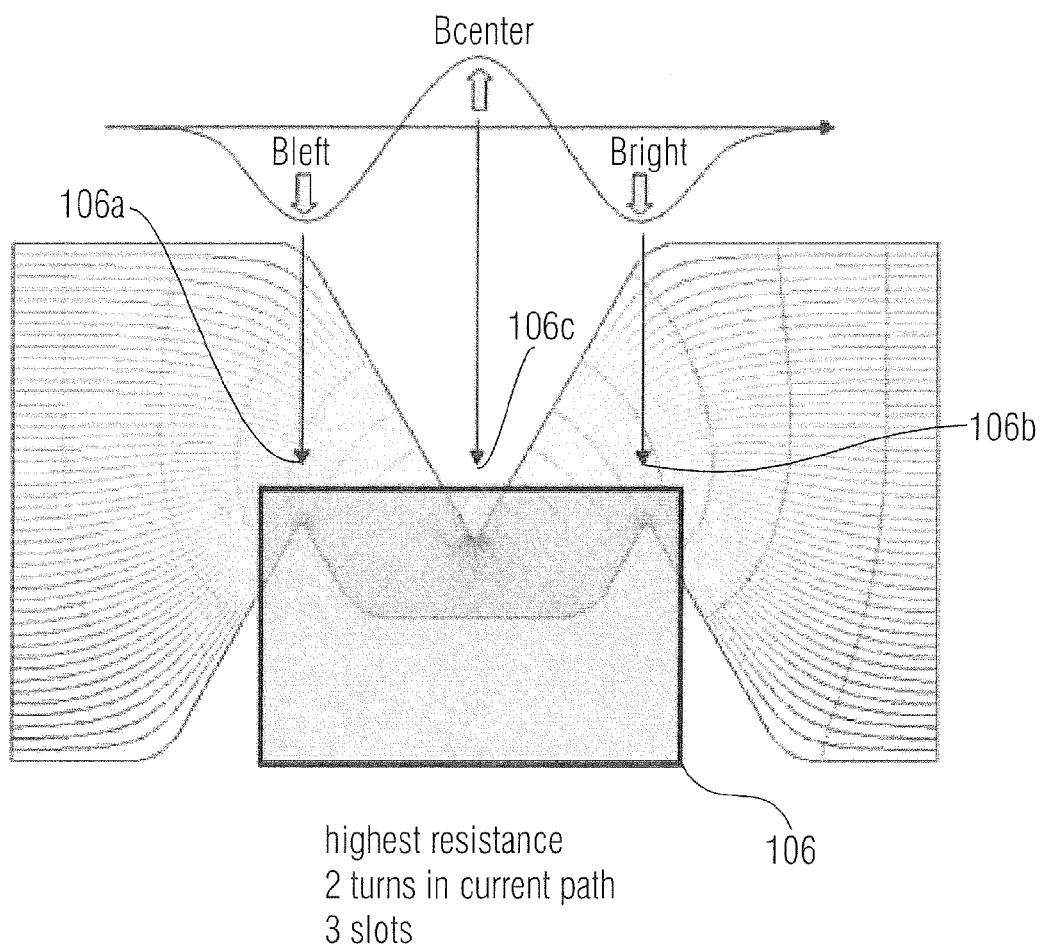

FIG. 21(a)-(c) show examples of triple Hall systems for currents up to 400 A with three different shapes of a conductor (I, U, S): The semiconductor die 106 is glued (via non-visible interstitial isolation layers) onto the conductor. Above the ends of the thin slots/notches there are planar Hall plates 106a-106c on the surface of the die, which detect the flux component perpendicular to the die surface. The sensor computes the difference of the centre flux component and the average of the outer flux components—this signal is proportional to the current through the conductor and cancels homogeneous background magnetic fields and linear field gradients. Embodiments of the invention may use sensor elements having triple or double Hall systems. Also systems using one or more than three Hall sensors may be used.

In the systems described in accordance with embodiments of the invention so far, there may be a problem that at high frequencies the magnetic field of the conductor induces eddy currents in conductive materials exposed to this field. Theses eddy currents give rise to a secondary magnetic field, which is superimposed on the primary field and which leads to a measurement error of the CLMCS and finally limits the useful bandwidth. Conductive bodies are either the primary conductor itself or additional conductive bodies nearby. If the primary conductor has a circular cross-section, eddy currents do not change the magnetic field versus frequency. Therefore the double Hall systems of the embodiments described above exhibit a large bandwidth, whereas the triple Hall systems with slotted conductor sheets exhibit smaller bandwidth. In both cases the sensor die is attached to the surface of the conductor, which makes it vulnerable to mechanical destruction. It is desired to protect the sensor die with a rigid cover. Moreover this cover should also protect the sensor from background electromagnetic fields, in particular from low frequency or static magnetic and electric fields and from high frequency electro-magnetic radiation and at least soft nuclear radiation like alpha-particles. Such a protective cover may also provide means for attachment like threaded ends.

For the above reasons a protective cover should be made of metal in one embodiment. Yet, this causes the above described eddy currents. Therefore embodiments of the invention provide a solution to use a protective metal cover which avoids a bandwidth reduction by using a conductive cylindrical shield around the primary conductor.

The inner conductor may be a (hollow or solid) cylinder, yet it may also be of any other shape: the more the shape of the primary conductor resembles a cylinder the smaller the effect of eddy currents on the magnetic field is and the larger the volume where the field-over-primary-current-ratio is independent of the frequency. If the primary conductor is a flat bar the field-over-primary-current-ratio is independent of frequency only in a small volume near the smaller edge of the bar.

The outer cylindrical shield may be permeable or not, i.e. it may have an arbitrary permeability. If it has a high relative permeability the shield is a good barrier against low frequency magnetic fields. If the relative permeability is low (around 1) and the conductivity is high the shield works fine for high frequency electro-magnetic fields and low frequency electric fields.

The shield may also carry some electric current: in a quasi-stationary approximation this current does not give rise to a magnetic field inside the cylindrical shield and therefore it does not affect the current measurement. At high frequencies the displacement current inside the shield cannot be neglected and then the current in the shield gives rise to eddy currents in the primary conductor in the bore of the shield and this would be sensed by the magnetic field sensors. Thus: as long as the frequency of the current in the shield is not too high it does not affect the current measurement of the CLMCS.

Since the current through the shield does not affect the magnetic field on the sensor die it may have any polarity, whichever suites the application.

Figure 22:
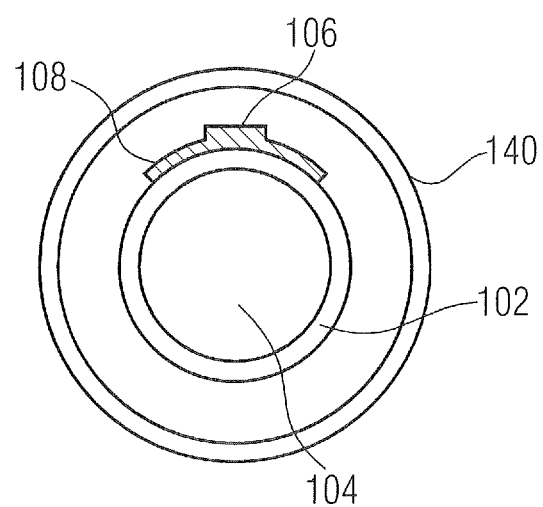
FIG. 22 shows a schematic representation of a current sensor similar to the one of FIG. 1 with an additional shield.

FIG. 22 shows a schematic representation of a current sensor 100 similar to the one of FIG. 1 with the additional shield 140.

In particular, in one embodiment it is also possible to split up the current of the primary conductor and shunt a certain, well defined portion of it over the shield. Then the magnetic sensor elements on the die detect only this portion of the current, which flows through the inner part and not the complementary portion through the shield. This may be advantageous, if the current is very high so that one has to reduce the resistance by using a shield with large cross section.

Figure 23:
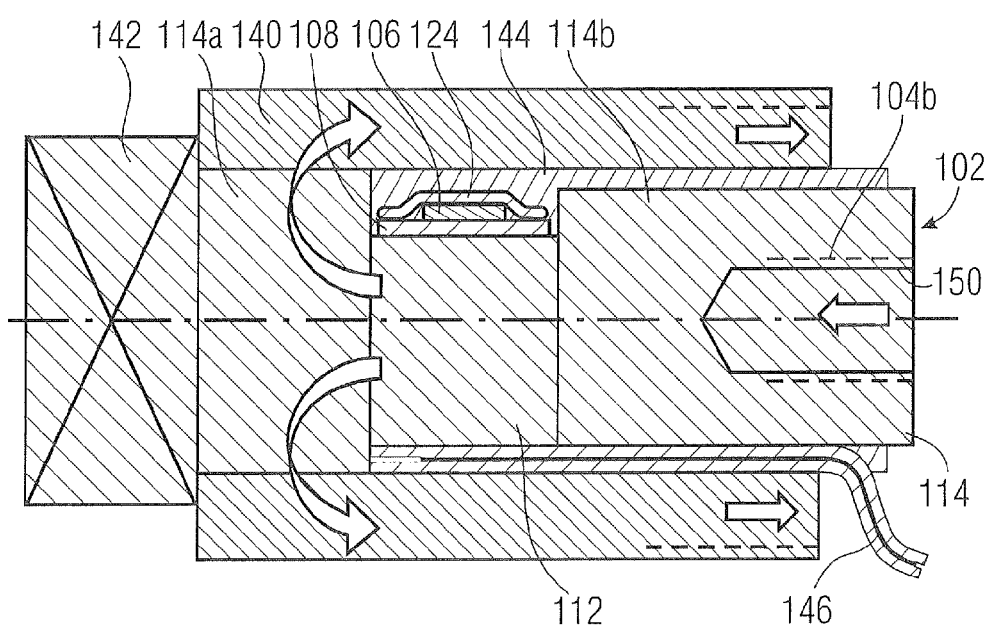
FIG. 23 shows an embodiment of a current sensor including a shield and having a dead-end-stub.

Conversely it is also possible to pass the entire primary current through the shield so that the current flow directions in the center or inner conductor (=primary conductor 102) and in the shield 140 are opposite. This leads to an embodiment of a dead-end-stub as is shown in FIG. 23. The current sensor of this embodiment has the cylindrical conductor 102 having a sleeve 114. The sleeve 114 has the first end 114a and the second end 114b. The central part 112 is arranged between the first end 114a and the second end 114b. The sensor die 106 including the Hall sensors is mounted at the central part 112 with the isolating foil 108 between the sensor die 106 and the sleeve 114. The upper isolating foil 124 is provided to cover the die 106. At the first end 114a of the sleeve 114 a dead end stub 142 is formed. At the second end 114b of the sleeve 114 an opening 104b is formed. The space between the shield 140 and the conductor 102 is filled with a mold 144. Flexible foils 146 are provided for a connection to a terminal. As is indicated by the arrows, a current enters at the right side into the inner part, flows left, at the left end flows outwards. In the shield 140 the current flows from left to right and leaves shield 140 at the right side. The shield 140 is rigidly attached to the shoulder formed by the first part 114a via press-fitting, ultrasonic welding, brazing, soldering, gluing, crimping. Element 142 is shown to be an integral part of the inner conductor—yet it may also be part of the outer sleeve (then the sleeve is a hollow cylinder with its end). The second end 114b may have respective internal screw threads 150. The perimeter of the second end 114b may be smooth (as shown in FIG. 23) or similar to element 142 in order to mate with a spanner to tighten the screw.

Figure 24:
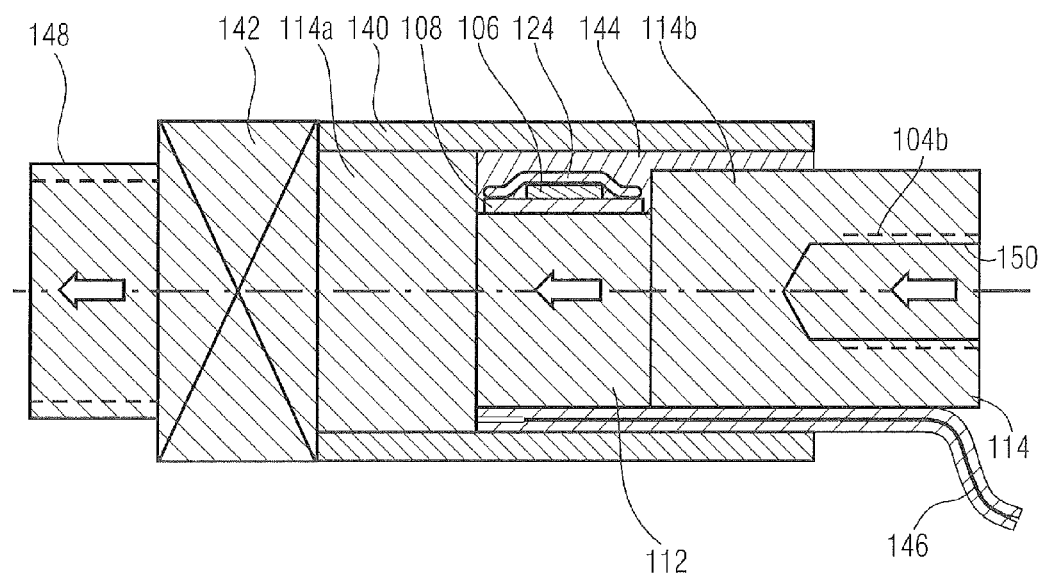
FIG. 24 shows another embodiment of a current sensor including a shield.
Figure 25A:
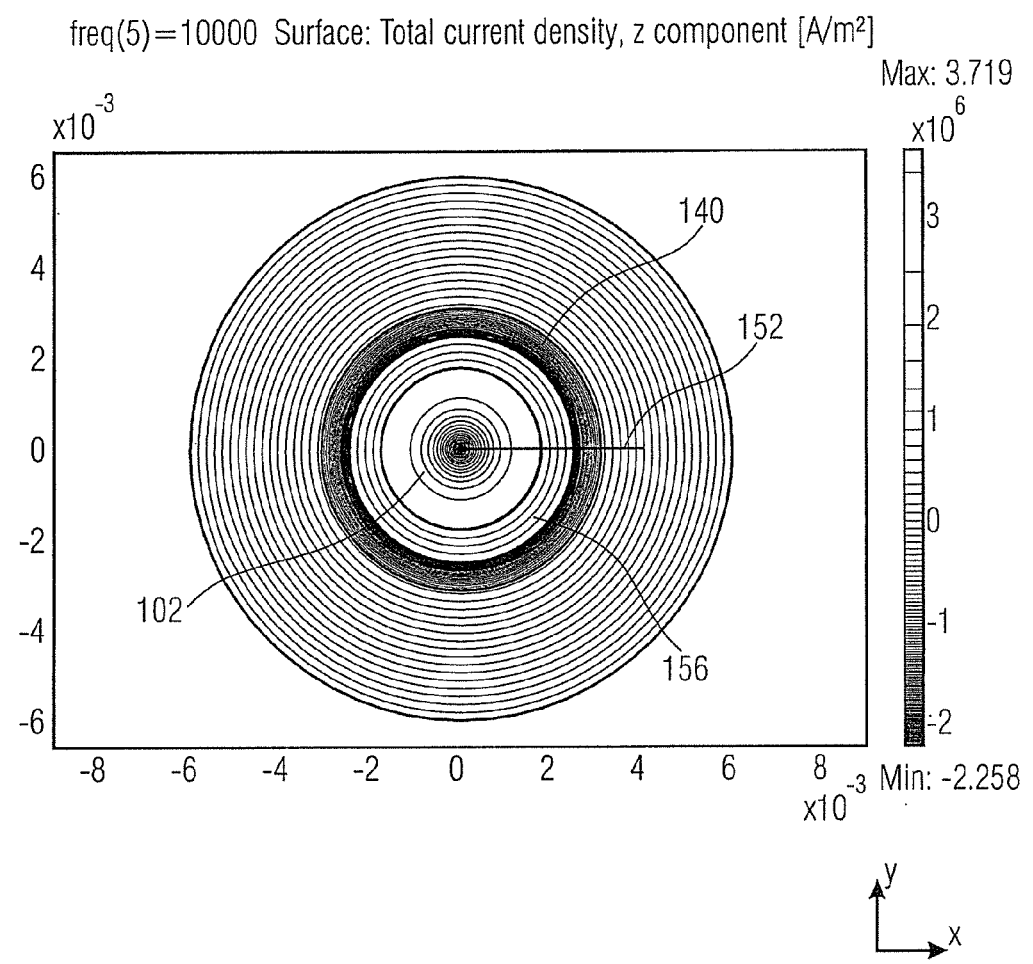
FIGS. 25(a)-(b) show the total current distribution in a conductor and a shield.
Figure 25B:
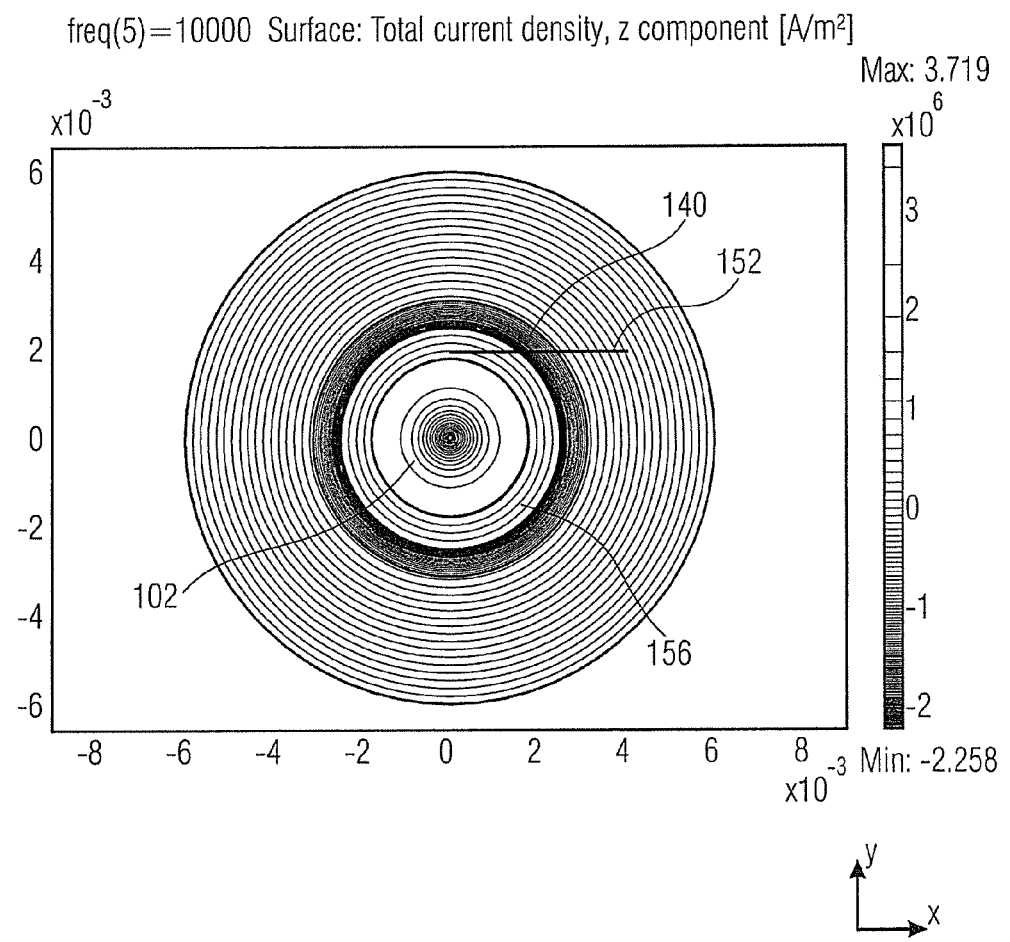
Figure 25C:
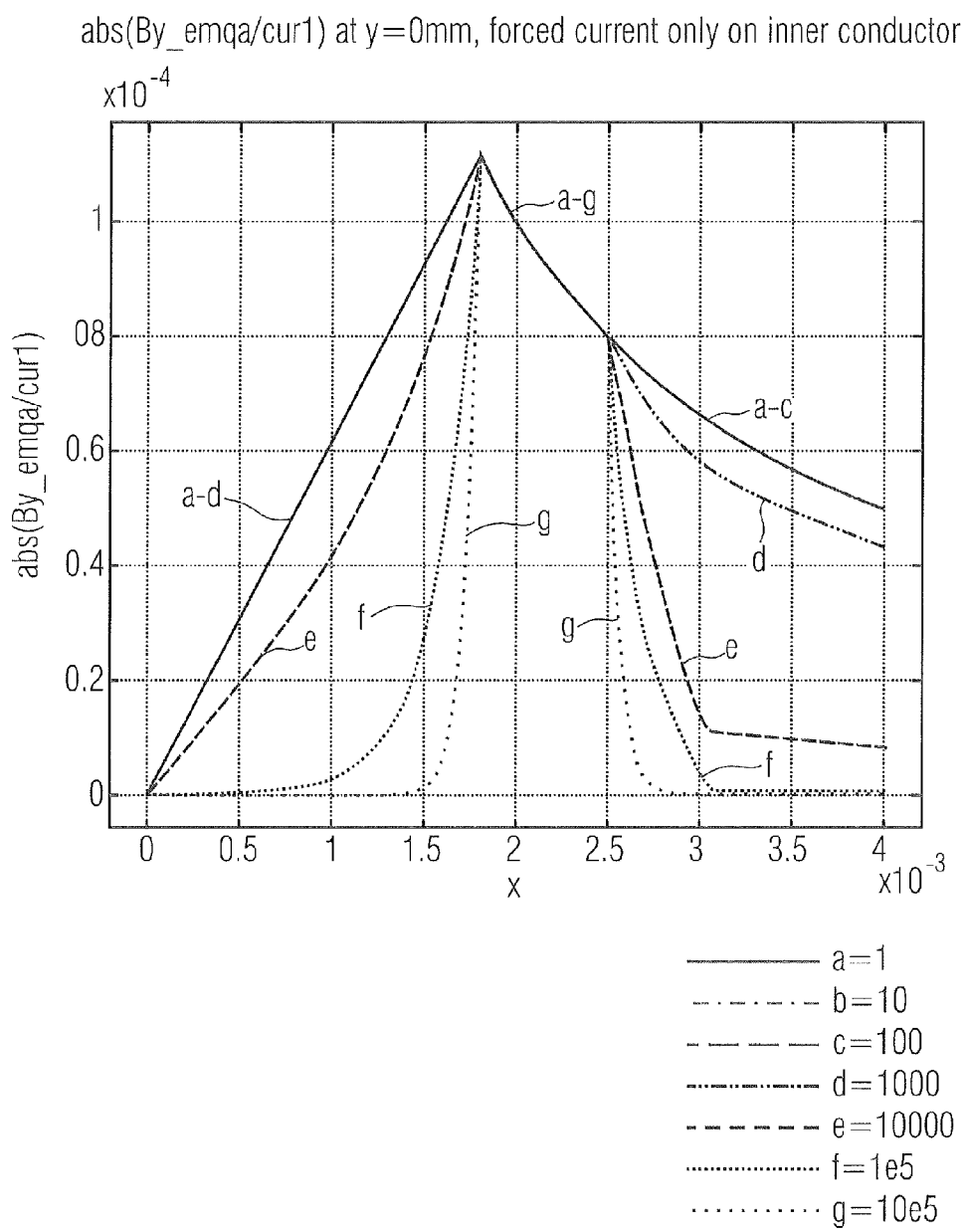
FIGS. 25(c)-(d) show the magnitude of the By-field divided by the total current.
Figure 25D:
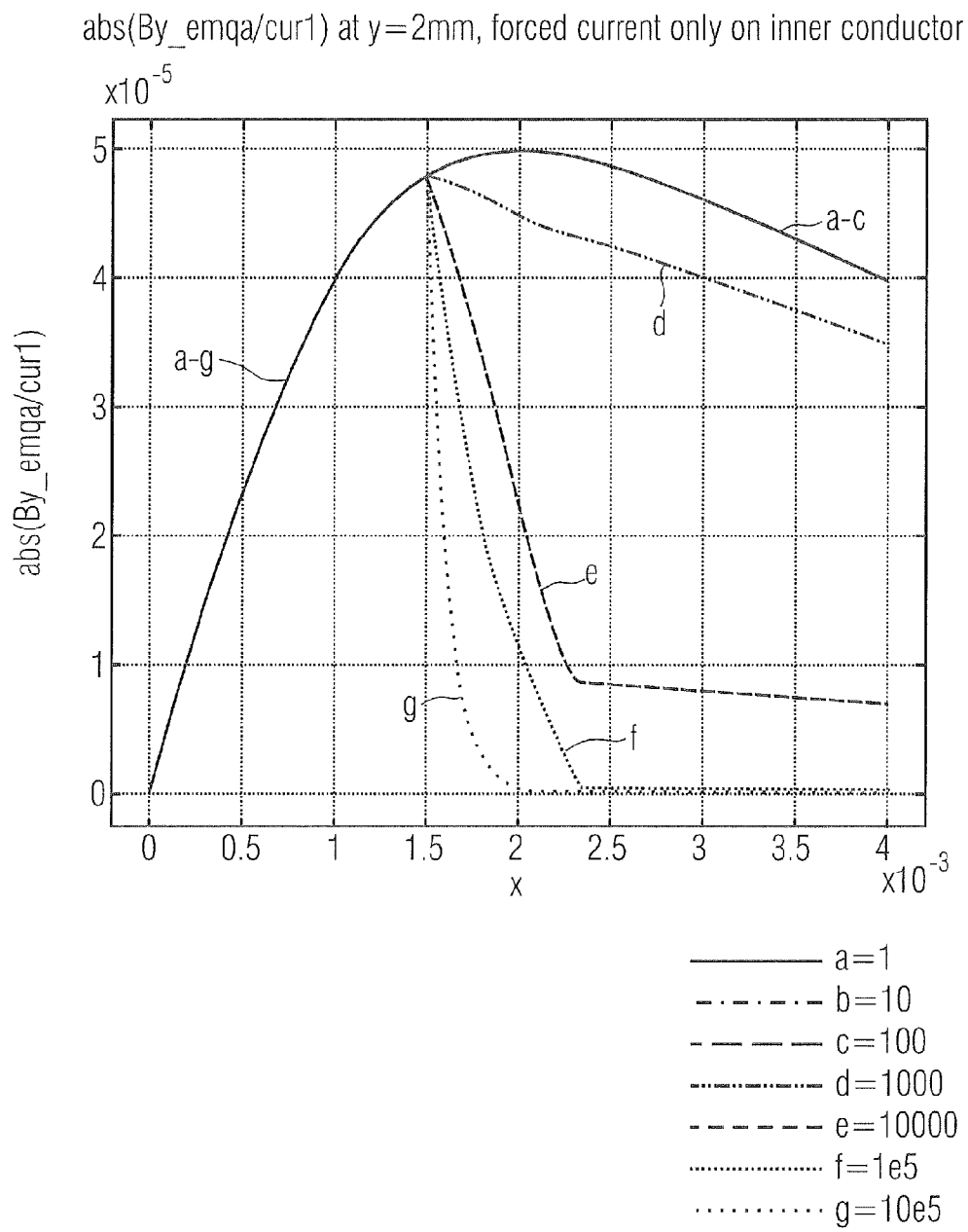

In accordance with another embodiment, it is possible to connect the shield to the primary conductor only on one perimeter so that it is galvanically tied to the primary conductor, yet there is no low frequency current flowing through it. This is shown in FIG. 24. An external screw threaded end 148 is provided that allows a connection to a busbar or a cable-shoe. The element 142 may have a square/rectangular/octagonal/hexagonal (polygonal) cross section or similar profile to give grip to a wrench/spanner to tighten the screw joint. The first part 114a has a circular cross-section and serves as a shoulder to hold the shield 140. The cylindrical shield 140 is press-fitted on shoulder 114a and has the purpose to protect the sensor 106 mechanically and to shield it from high-frequency background magnetic fields and from temperature, salt or other chemical contaminants. It also prevents the sensor from radiating (emitting) electromagnetic interference. The inner isolation foil 108 serves as galvanic isolation between the sensor 106 and the high current path. It may also carry the thin conductive traces to contact the sensor die 106 if it is face-down. The foil 108 is glued to the central part 112 by some adhesive at its bottom. The sensor die 106 is positioned face-down, however it may also be positioned face-up. Face-down means that the surface of the chip on which the electronic device(s) is(are) arranged faces the isolation foil. Face-up means that the surface of the chip on which the electronic device(s) is(are) arranged faces the shield. The outer isolation foil 124 serves as galvanic isolation between the shield and the die 106. It may carry the thin conductive traces to contact the sensor die if it is face-up. The foils 108 and 124 may be glued together along their perimeter to establish a hermetic seal against electric charge and/or moisture. The mold 144 may be injected between the shield 140 and the center part 112 and the second end 114b. The mold 144 keeps the sensor 106 in place, protects it against environmental influences and stabilizes the shield 140 against the inner conductor parts. The second end 114b has an internal screw thread 150, and its perimeter may be smooth (as shown in FIG. 24) or similar to element 142 in order to mate with a spanner to tighten the screw. The flexible foils 146 lead to some kind of connector or printed circuit board or contacts, which might be attached to the main body by some injection molding techniques. The central or main part 112 of conductor 102 right below the sensor element 106 has circular or close-to-circular or polygon cross-section (e.g. hexagon, octagon, etc). Since the semiconductor is located between the conductor and the shield and both are at the potential of the primary conductor the semiconductor may be covered with electrically conductive sheets on both surfaces (top and bottom surface of the die) and to connect them to the ground potential of the sensor system, in order to prevent capacitive crosstalk from the primary conductor to the sensor circuit.

In an embodiment the parts 112, 114*a*, 114*b*, 142 and 148 may be made of a single piece of copper (or any other good and nonmagnetic conductor). The shield 140 is either press-fitted or glued or welded or brazed or soldered or crimped onto shoulder 114*a* to have good mechanical and electrical contact. The threads at both ends should be distant enough from the sensor not to cause measurement errors, if slightly or strongly magnetic screws (from soft steel) are used. Also nonmagnetic screws (e.g. A4-quality: purely austenitic steel even down to lowest working temperatures) may be used. The embodiment of FIG. 23 may use the same materials.

In an embodiment, a thin electrically isolating foil or an injection mold or some other kind of electric isolator may be placed between the shoulder 114*a* and the shield 140 so that the shield 140 may float or that it may be connected to any other potential.

In the following different configurations of the outer shield 140 will be discussed. The conductor 102 and the shield 140 provided around the conductor 102 will be considered two concentric cylinders. If a current flows only through the inner part of the conductor 102 and the outer part serves merely as a shield 140 there is the total current distribution shown in FIGS. 25(*a*) and 25(*b*) (note: the cross sectional area of both conductors was chosen to be identical: radii=1.8 mm, 2.5 mm, 3.08 mm). Along the lines 152 and 154 in FIGS. 25(*a*) and 25(*b*) the magnitude of the By-field divided by the total current is given in FIGS. 25(*c*) and 25(*d*). As can be seen from 25(*c*) and 25(*d*), between the inner and outer conductor the field is independent of frequency. Inside the inner conductor we note the skin effect: at large frequencies the field is expelled from the inner conductor. In the shield we note that the field is strongly damped at high frequencies—therefore at high frequencies the field outside the shield is effectively "shielded". Thus, embodiments of the invention have an advantage in that the field at high frequencies is greatly reduced outside the shield and at the same time the field from external disturbances acting on a sensor element inside the shield is also greatly reduced whereas the shield does not impair the bandwidth of the sensor. Besides, the shield protects the sensor from the environment.

Figure 26:
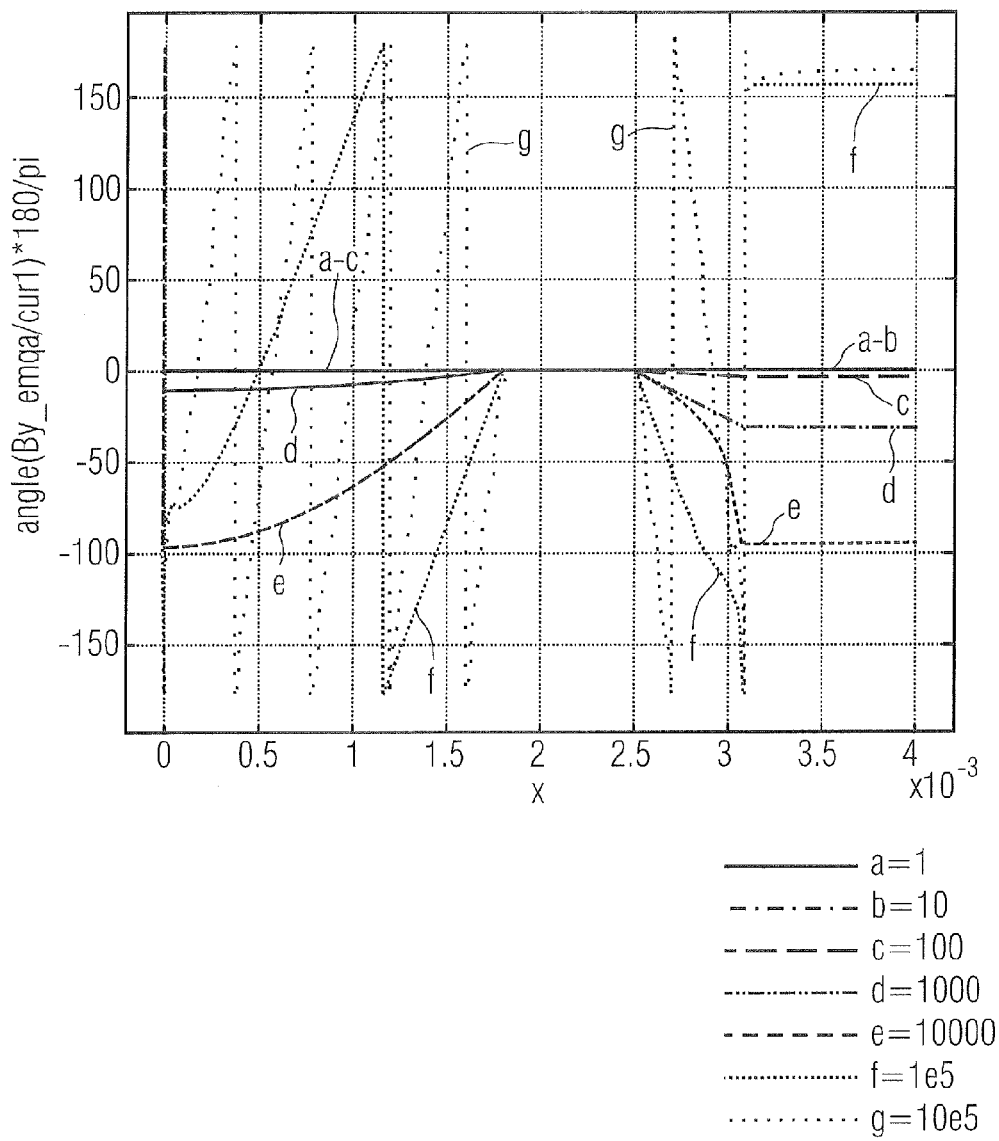
FIG. 26 shows the phase of the field over the current ratio.

Also the phase of the field over current ratio is zero in the gap 156 between both conductors, as can be seen from FIG. 26.

Figure 27A:
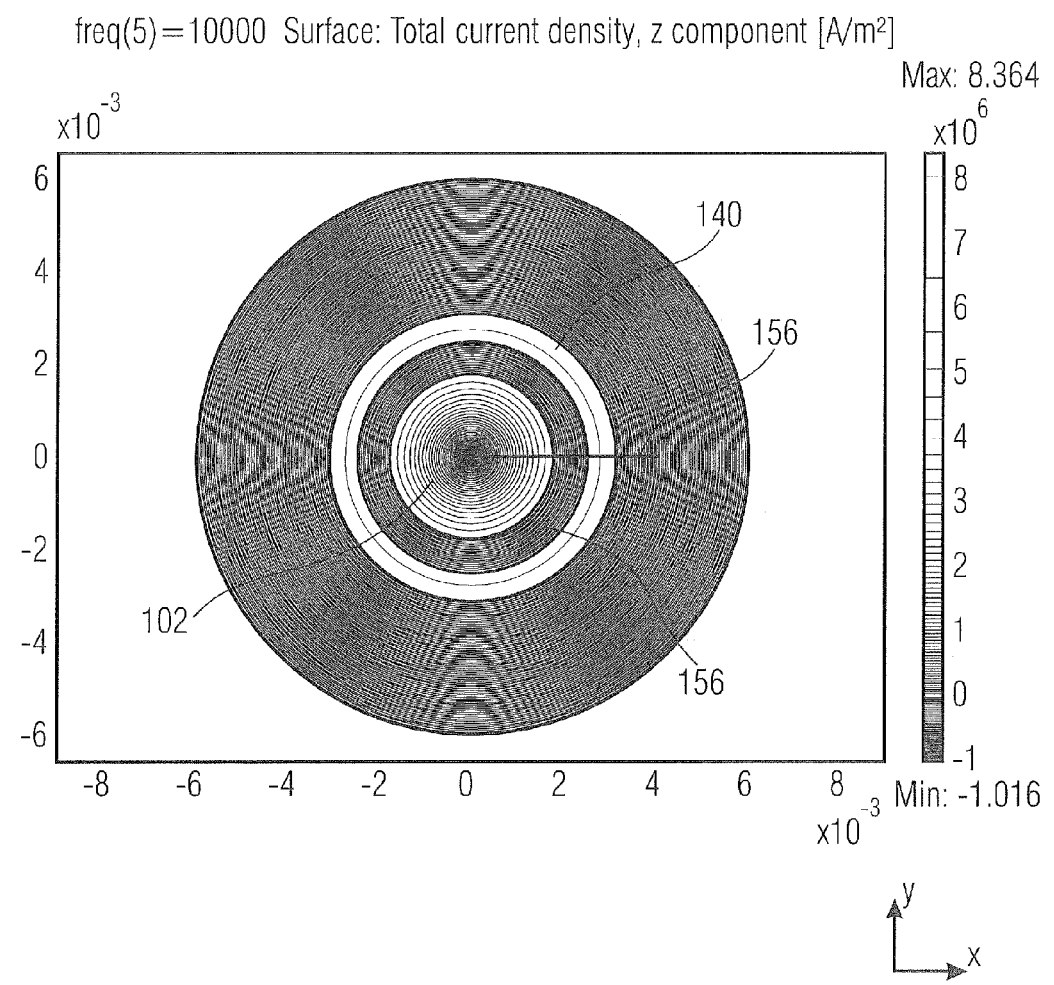
FIGS. 27(a)-(b) show the ratio of field over current in an inner conductor.
Figure 27B:
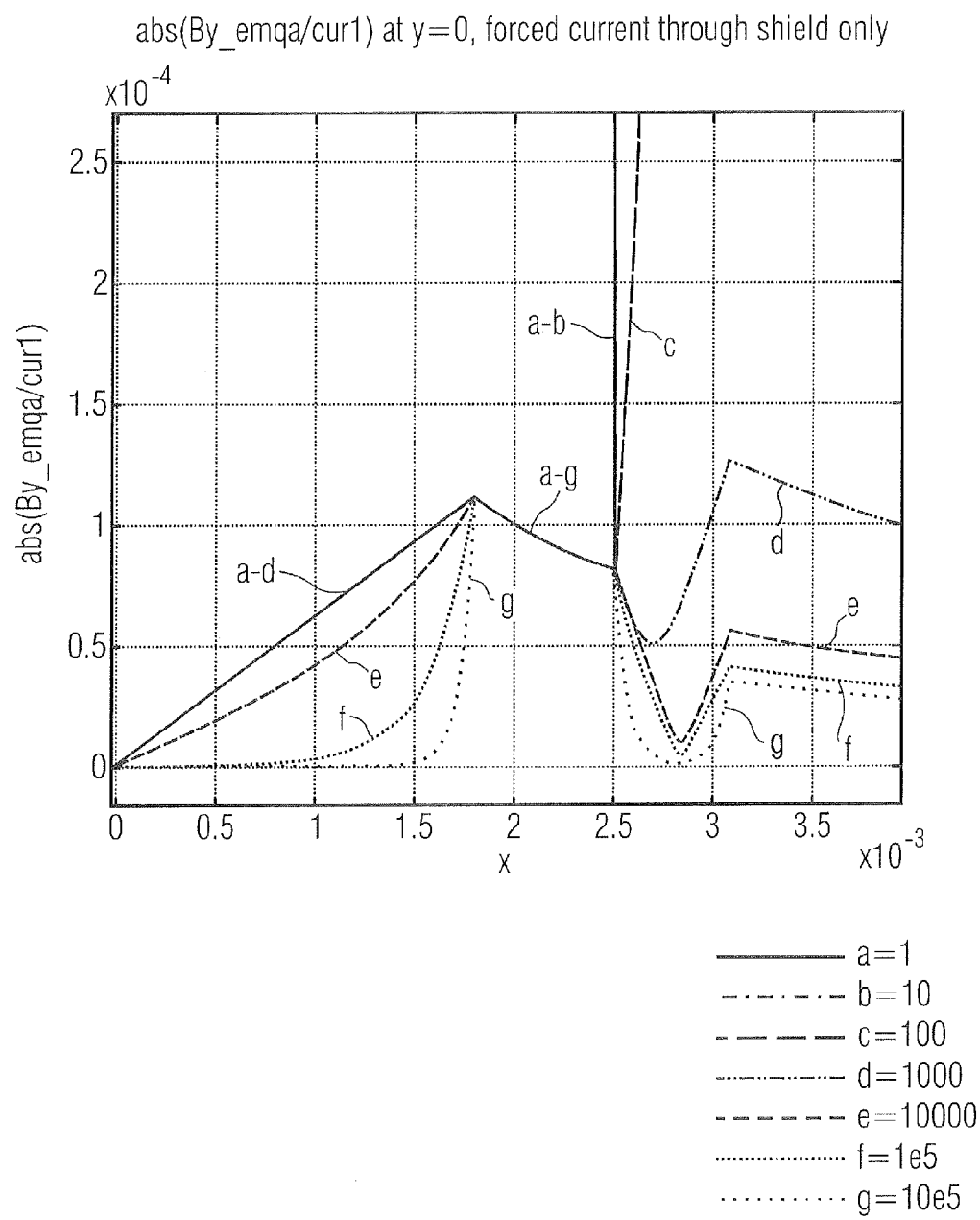

If a current is forced through the shield 140 the magnetic field in the gap 156 between inner conductor 102 and shield 140 is independent of the current. Yet, the current through the shield induces current in the inner conductor and this one generates a field on the sensor inside the gap. Again the ratio of field over current in inner conductor is independent of frequency, as can be seen from FIGS. 27(*a*) and 27(*b*).

Figure 28:
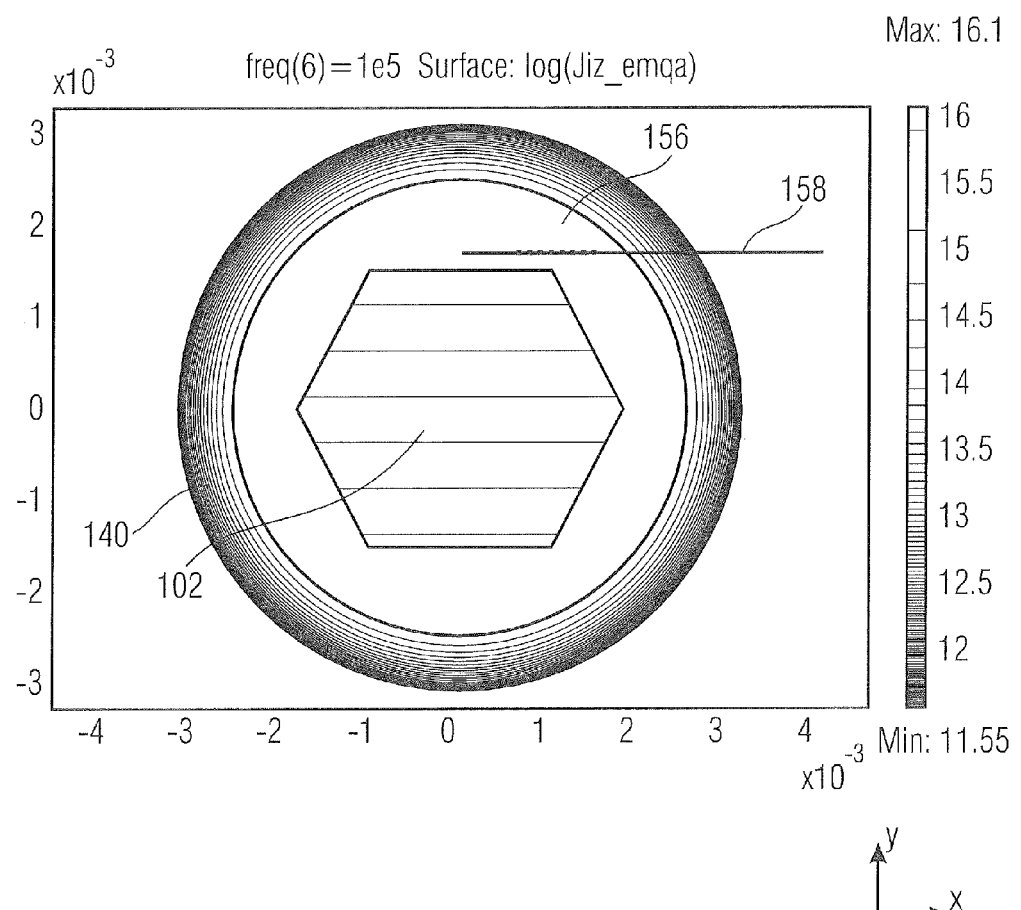
FIG. 28 shows an embodiment of a current sensor with shield, wherein the inner conductor has a cross section of a hexagon.
Figure 29A:
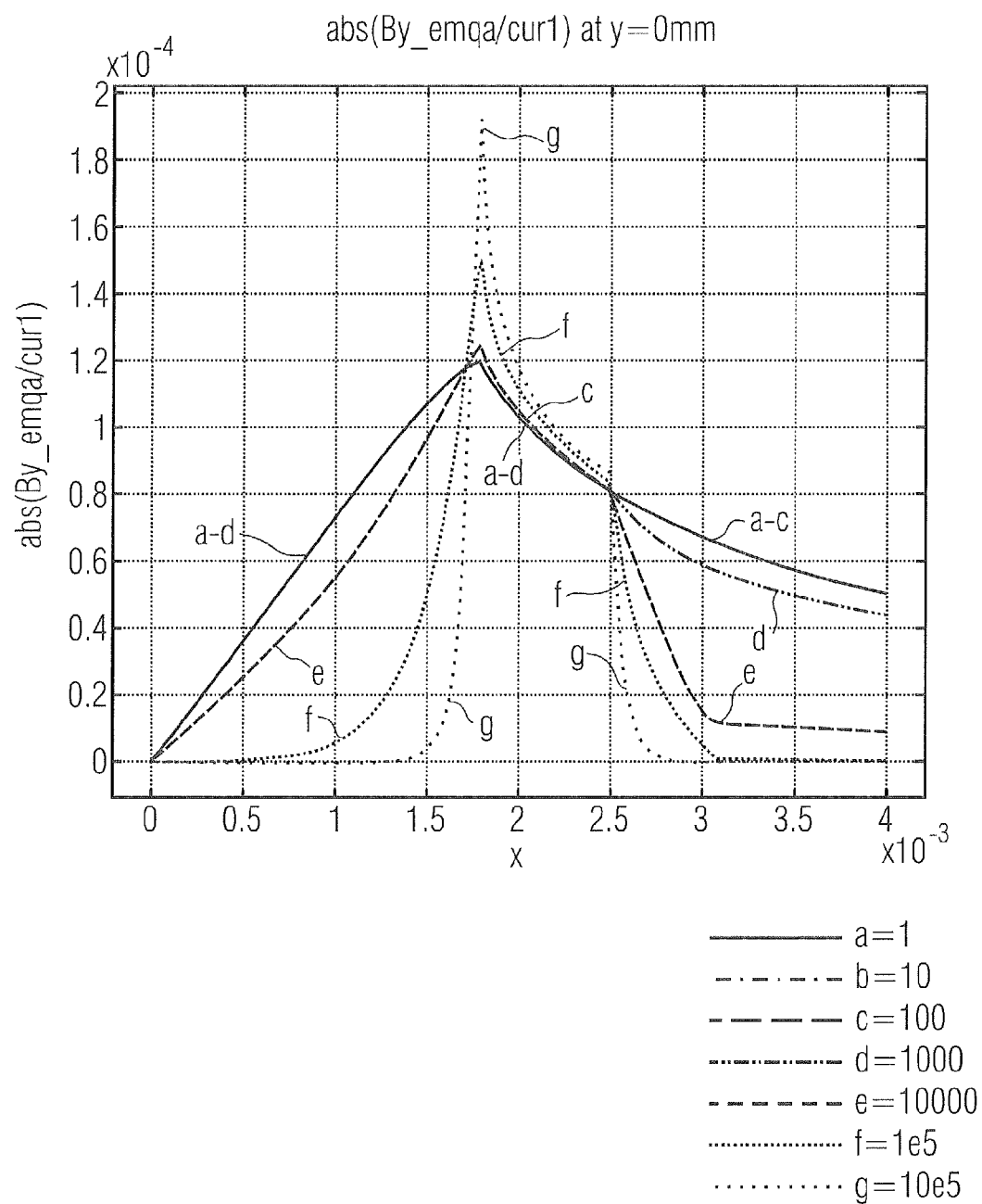
FIGS. 29(a)-(b) shows the frequency dependency of the magnetic field in the embodiment of FIG. 28.
Figure 29B:
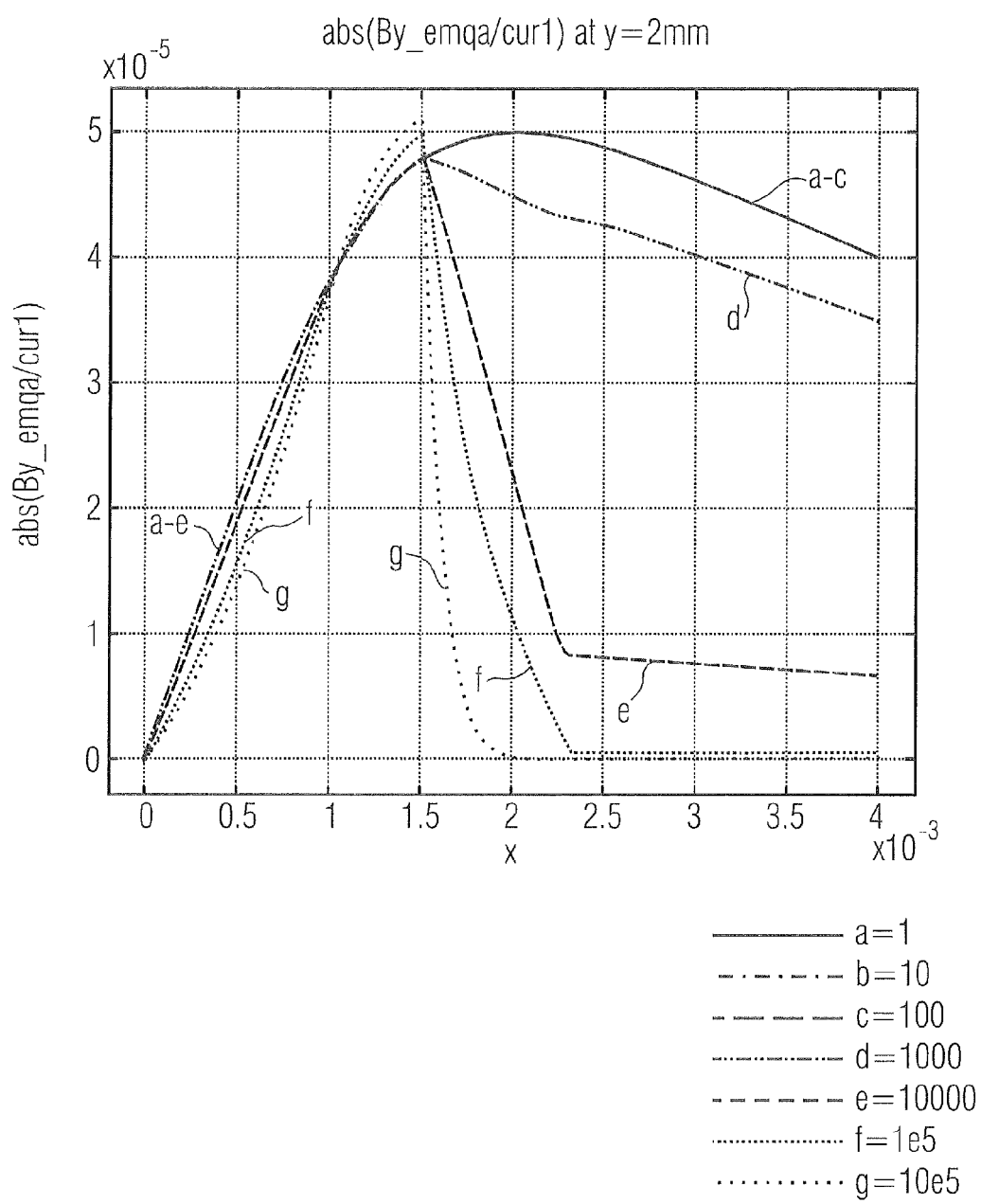
Figure 30:
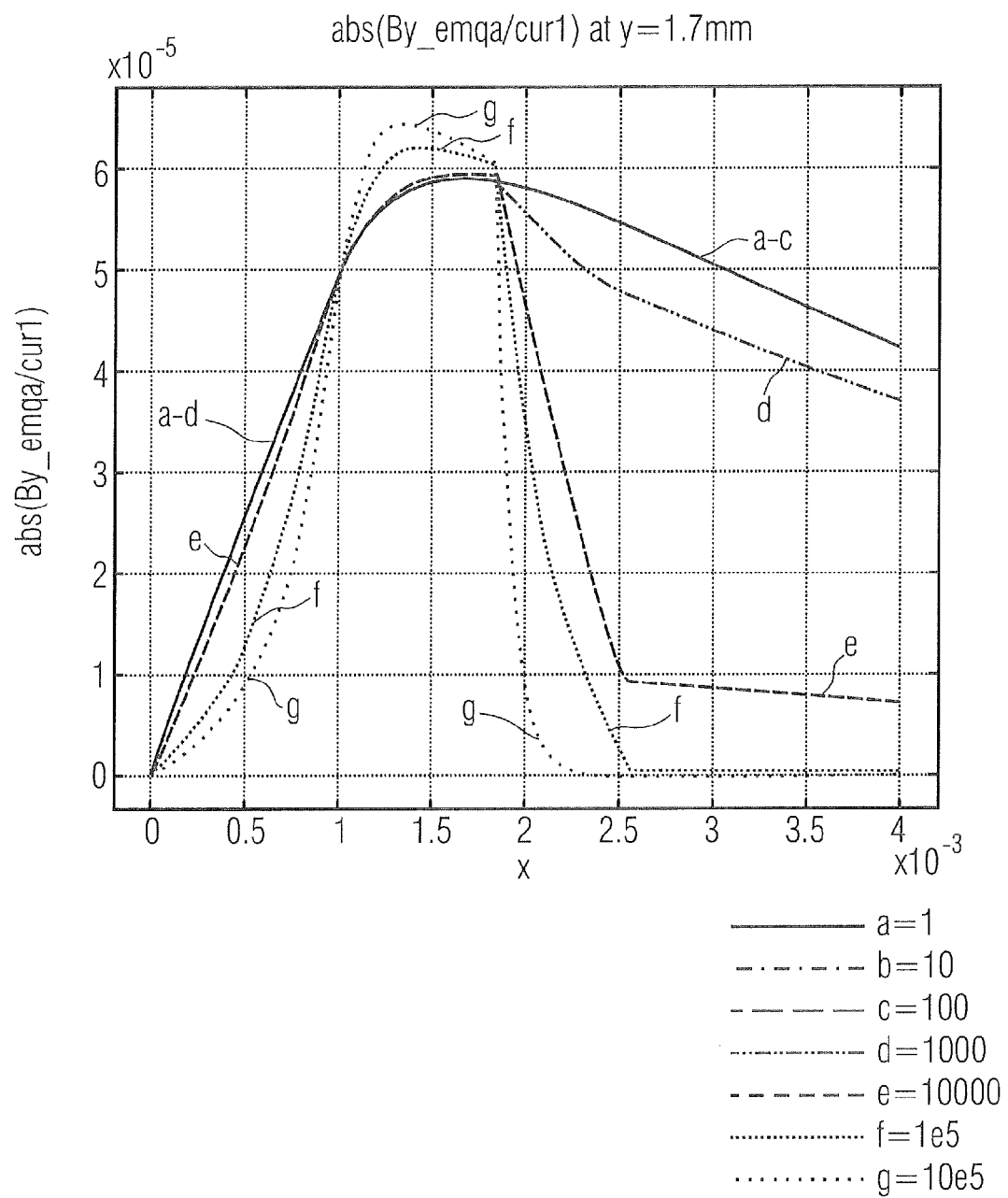
FIGS. 30-32 show plots illustrating the ratio By/cur$_1$ for the sensor of FIG. 28.

In accordance with an embodiment shown in FIG. 28 the inner conductor 102 has a cross section of a hexagon with two opposite edges 2 mm long and the other 4 edges 1.7 mm long. The 2 mm long edges are 3 mm apart. The width along the x-axis is 3.6 mm. The cross-section is 8.6 mm². The total current through the inner conductor is $cur_1$ (obtained via integration of Jz_emqa over the cross-section). The outer hollow cylinder (shield 140) is unchanged: Di=5 mm, Do=3.0806 mm. Because the inner conductor is not perfectly circular any more also the field is not perfectly constant versus frequency. Yet the frequency dependency is still small, particularly at points in the gap but close to the outer shield, as is shown in FIGS. 29(*a*) and 29(*b*). Note that for any y-position there is one x-position with vanishing frequency dependency: such points are (x, y)=(1.15 mm, 2 mm) shown in FIG. 29(*b*) and (x, y) =(1.02 mm, 1.7 mm) shown in FIG. 30.

Figure 31:
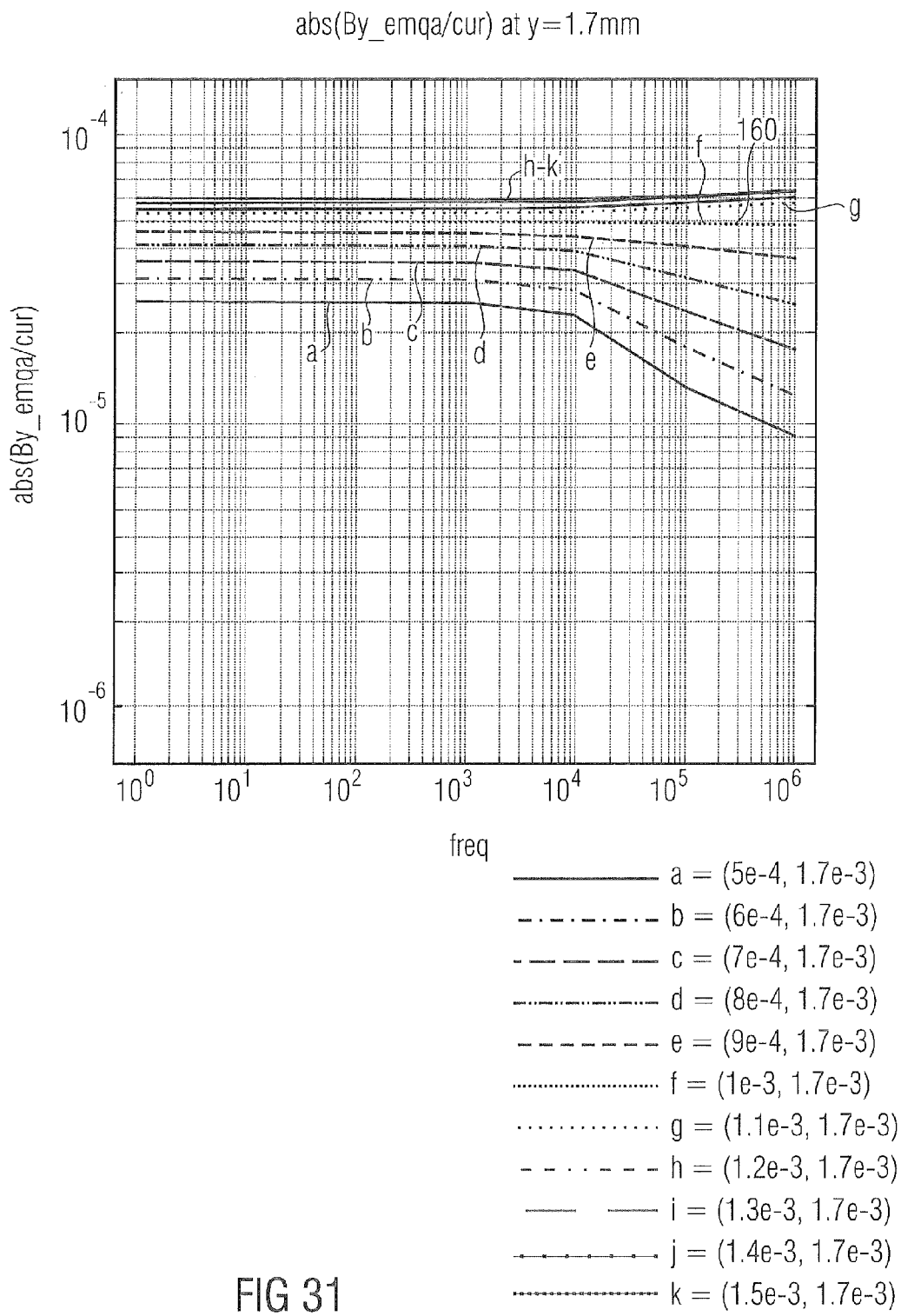
Figure 32:
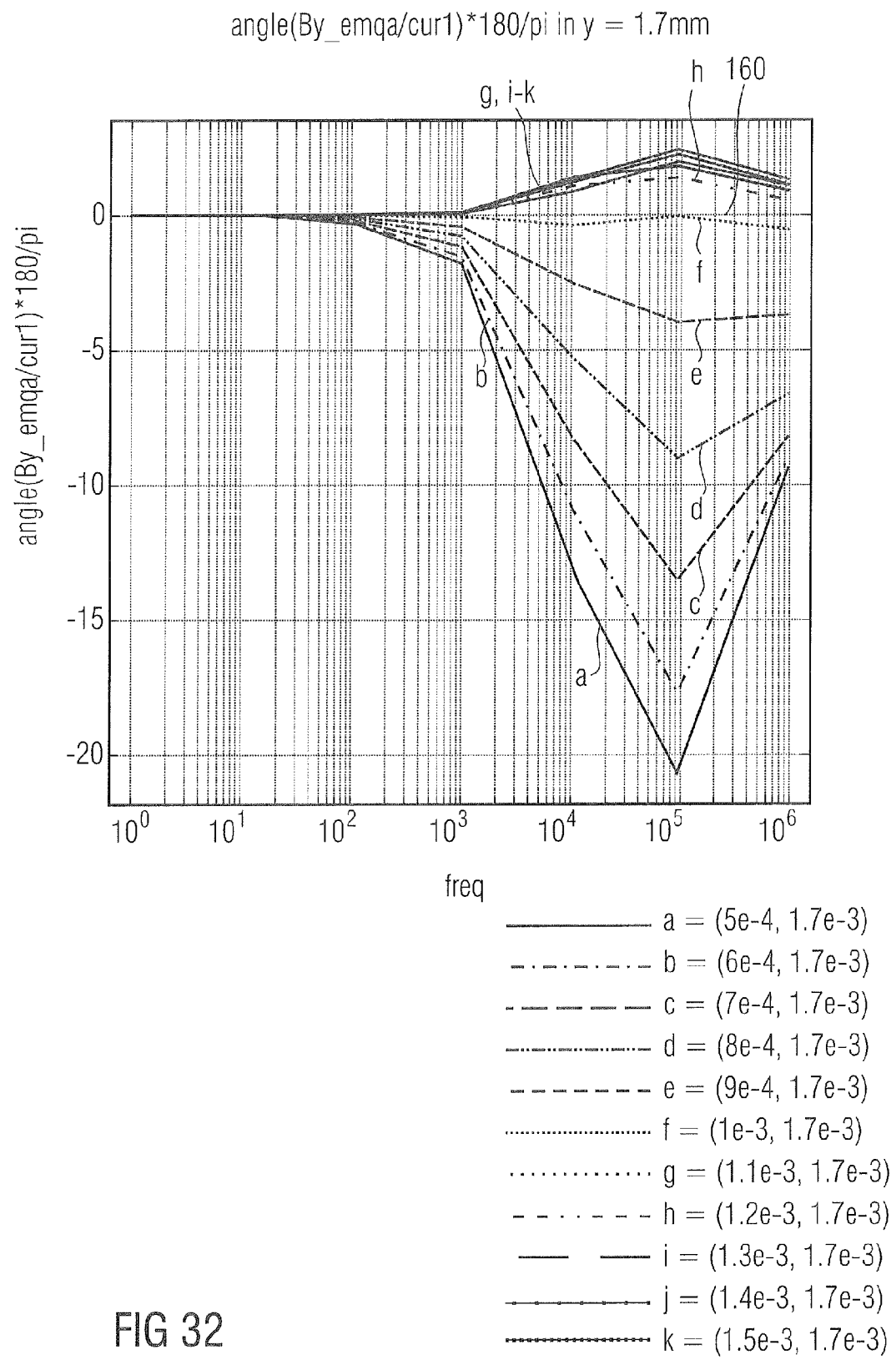

This embodiment has the advantage that with this geometry it is easier to attach a die to its flat surface. The line 158 shows the path at y=1.7 mm where the $By/cur_1$ is plotted in FIG. 30. On the points magnitude and phase of $By/cur_1$ are plotted in FIGS. 31 and 32. Note that magnitude and phase of $By/cur_1$ is very flat for x=1 mm (curve 160).

Thus, in accordance with embodiments of the invention, for any conductor cross-section it should be possible to find a point, where magnitude and phase of the ratio of magnetic field over current stays nearly constant versus frequency. This point is close to the edge of the conductor and it is not changed much by an additional shield as long as this shield has a circular cross-section. If the conductor is symmetric with respect to the magnetic field sensors then also the shield should be symmetric to them.

Figure 33:
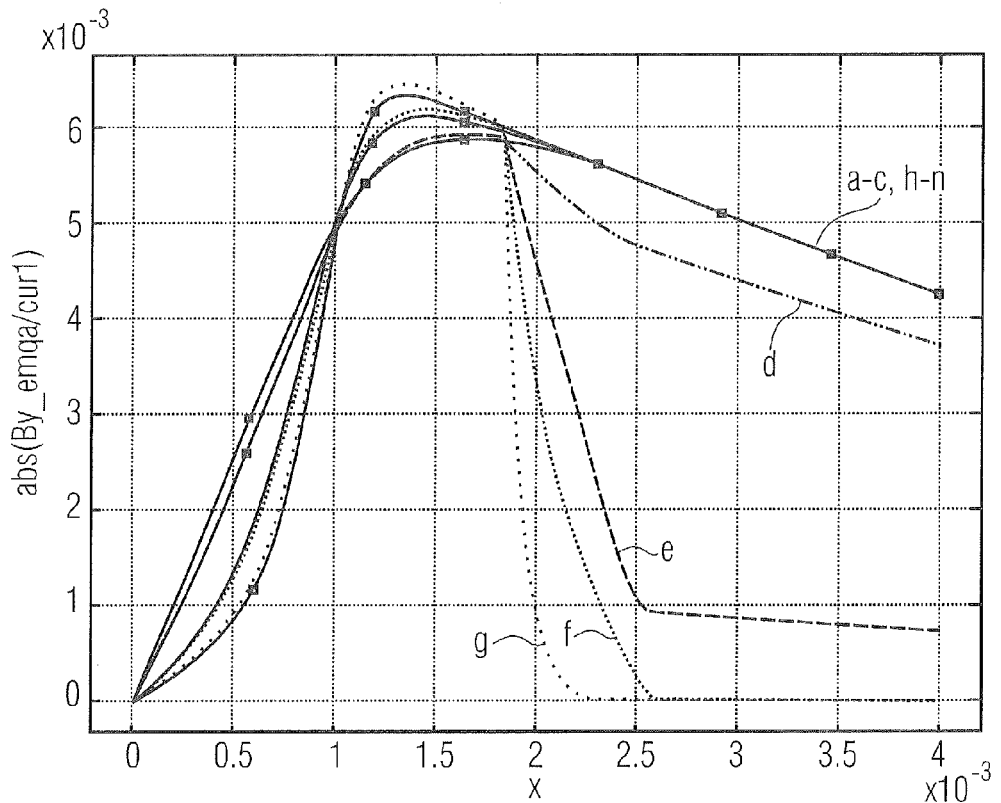
FIG. 33 shows a plot illustrating the magnetic field with shield and without shield.

If we skip the shield the frequency dependency nearly stays the same. In the plot in FIG. 33 the field with shield according to FIG. 28 is given by the solid lines whereas the field without shield is given by the lines with squares. As may be seen, the field close to a conductor is mainly determined by the cross-section of the conductor and only marginally influenced by a nearby shield.

Figure 34:
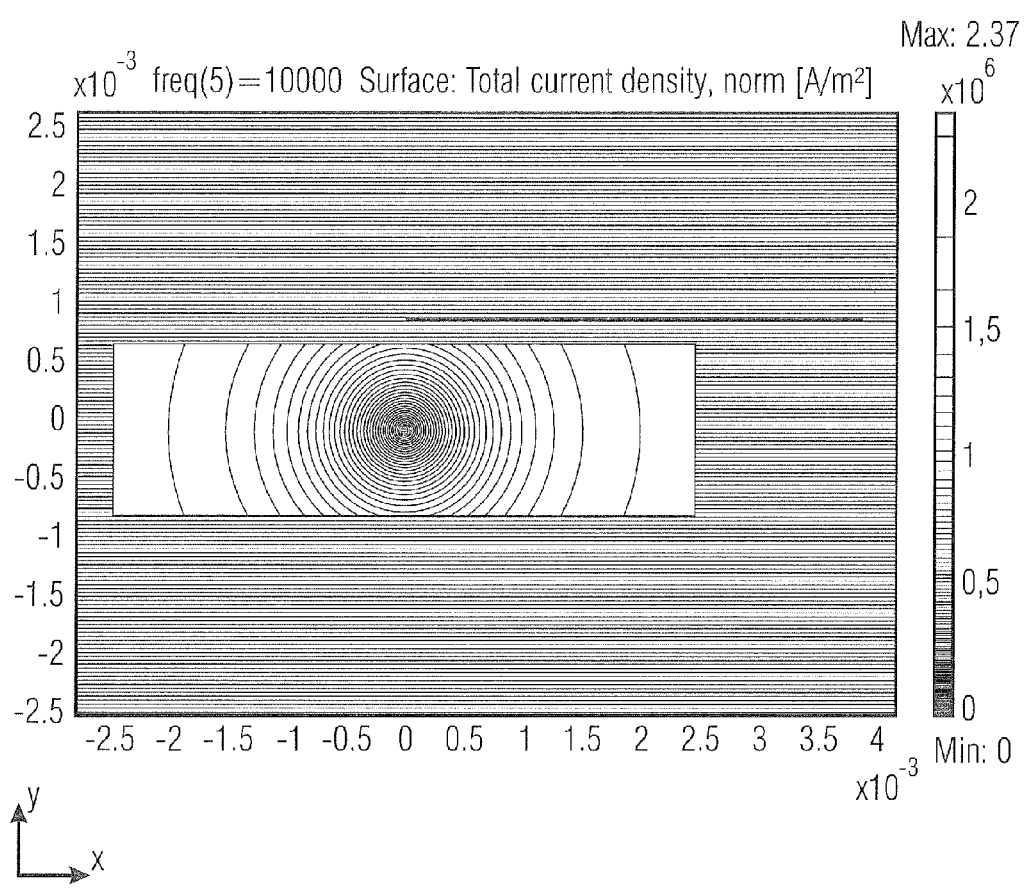
FIGS. 34-36(b) show plots illustrating the behavior of a current sensor having a rectangular sensor die without shield.
Figure 35:
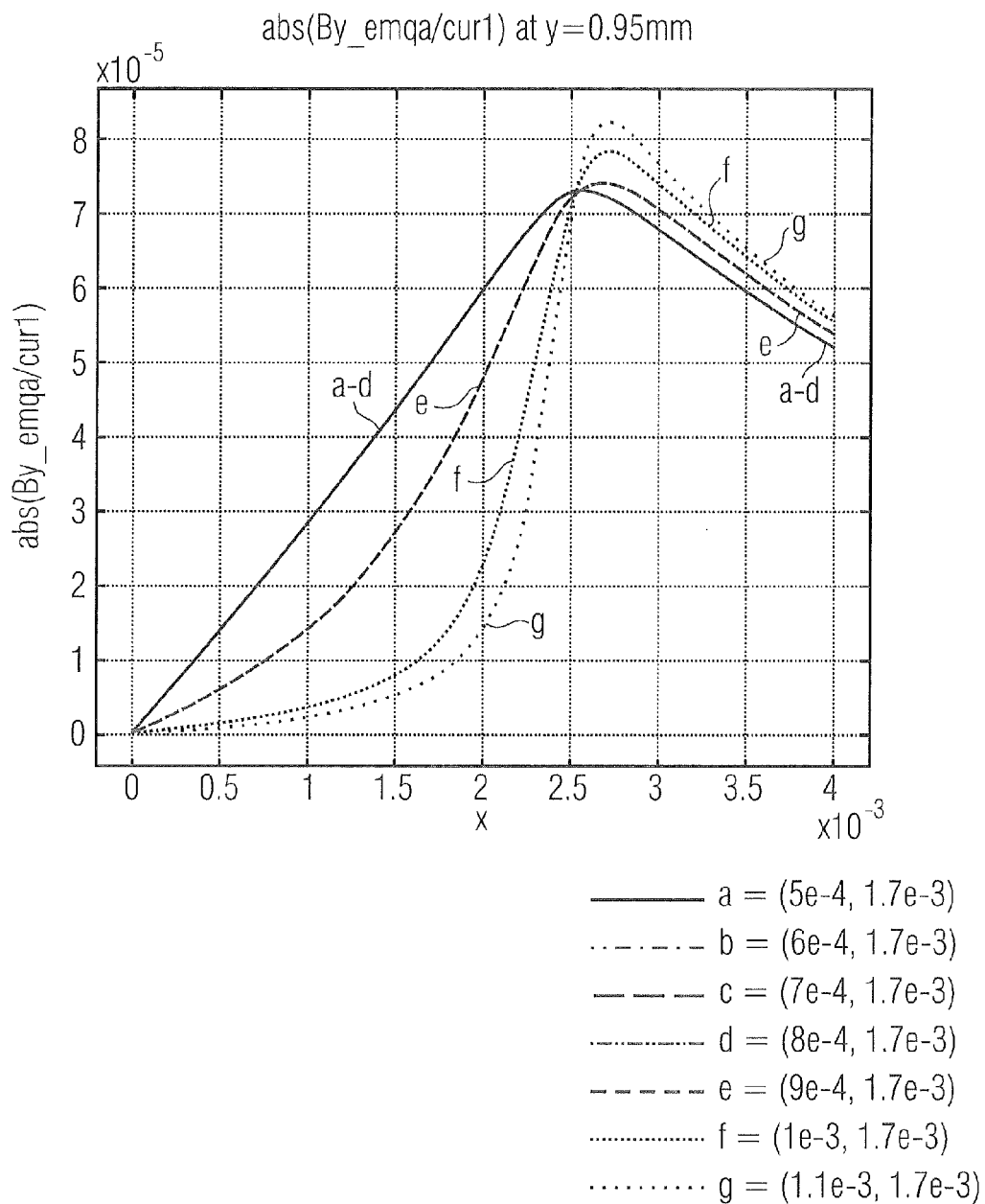
Figure 36A:
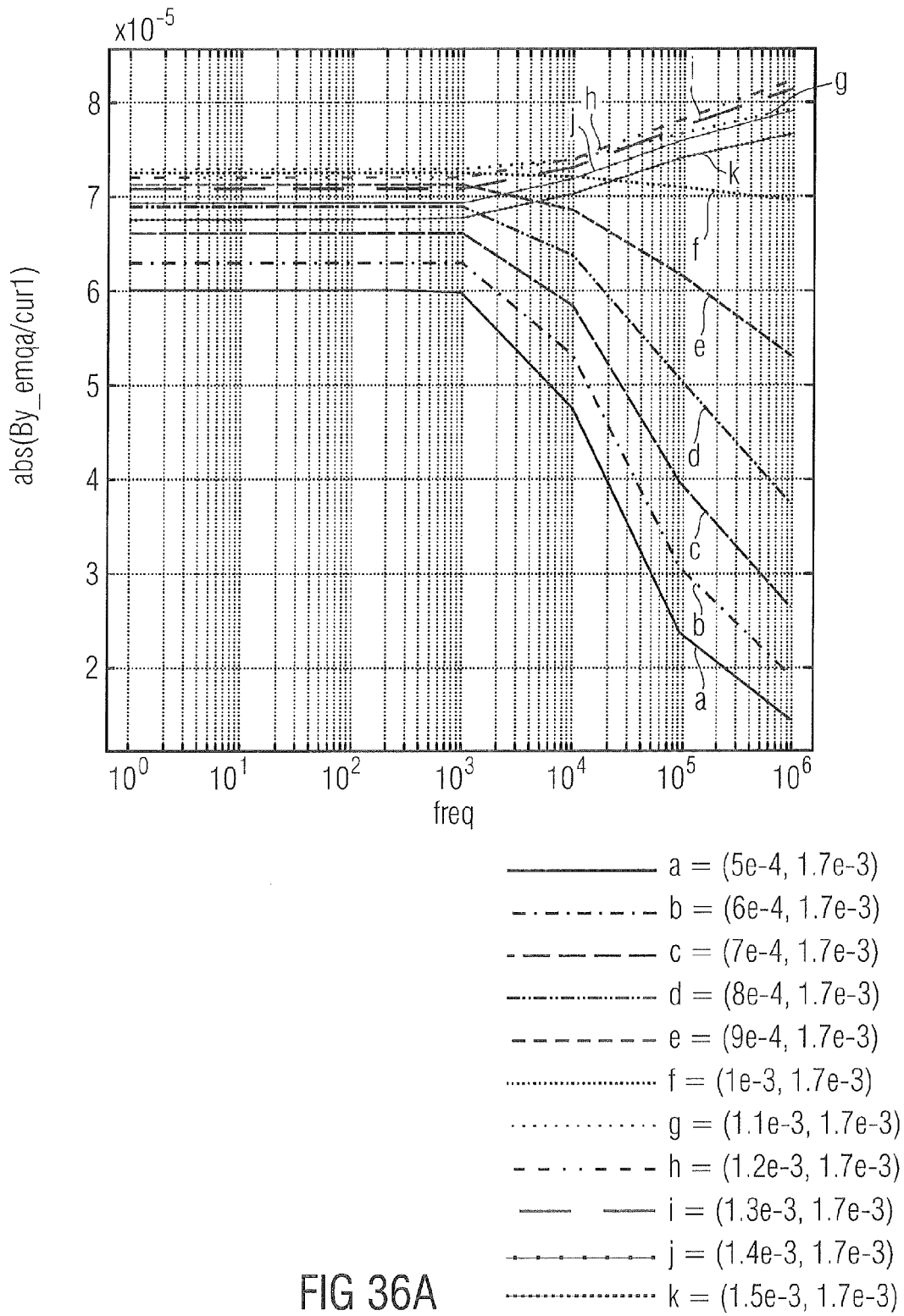
Figure 36B:
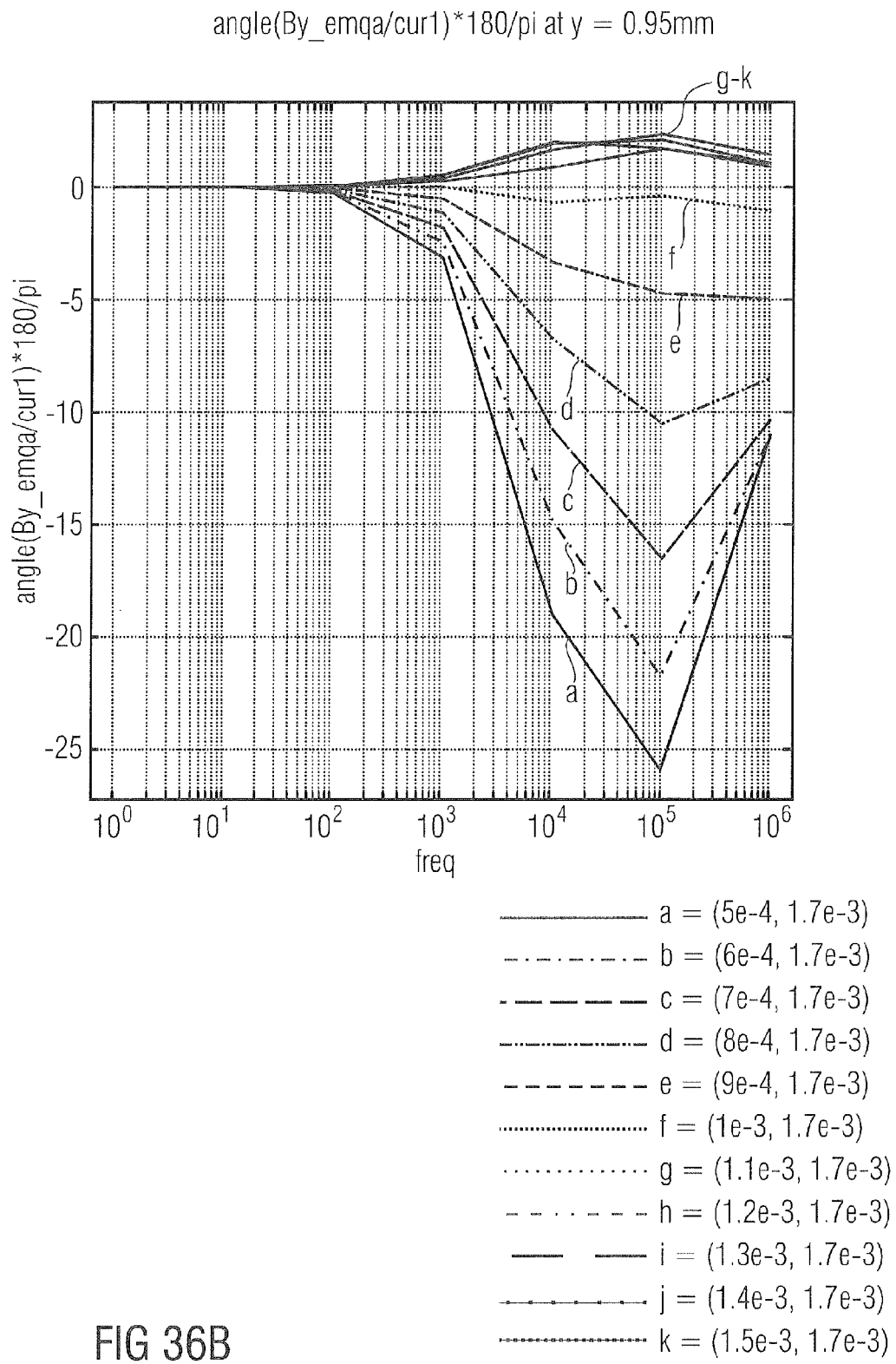

If we consider a plain strip (3 mm×5 mm) without any shield we note that the current is expelled from the interior and pushed to the short edge as is shown in FIG. 34. Therefore the field concentrates also close to the short edge at high frequencies as is shown in FIG. 35. Close to the edge at x=2.505 mm the By-field is constant versus frequency. The Bode plot in FIGS. 36(*a*) and 36(*b*) also show the weakest frequency dependency close to x=2.5 mm.

Figure 37:
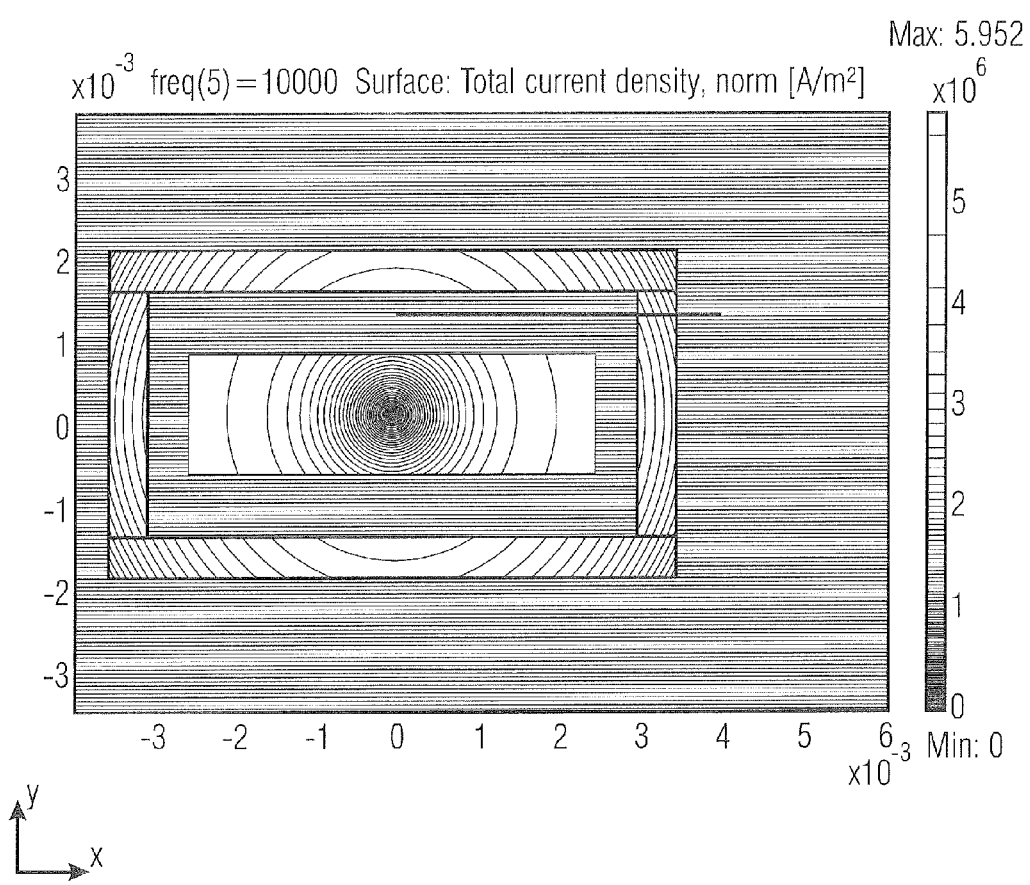
FIGS. 37-39 show plots illustrating the behavior of a current sensor having a rectangular sensor die with a rectangular shield.
Figure 38:
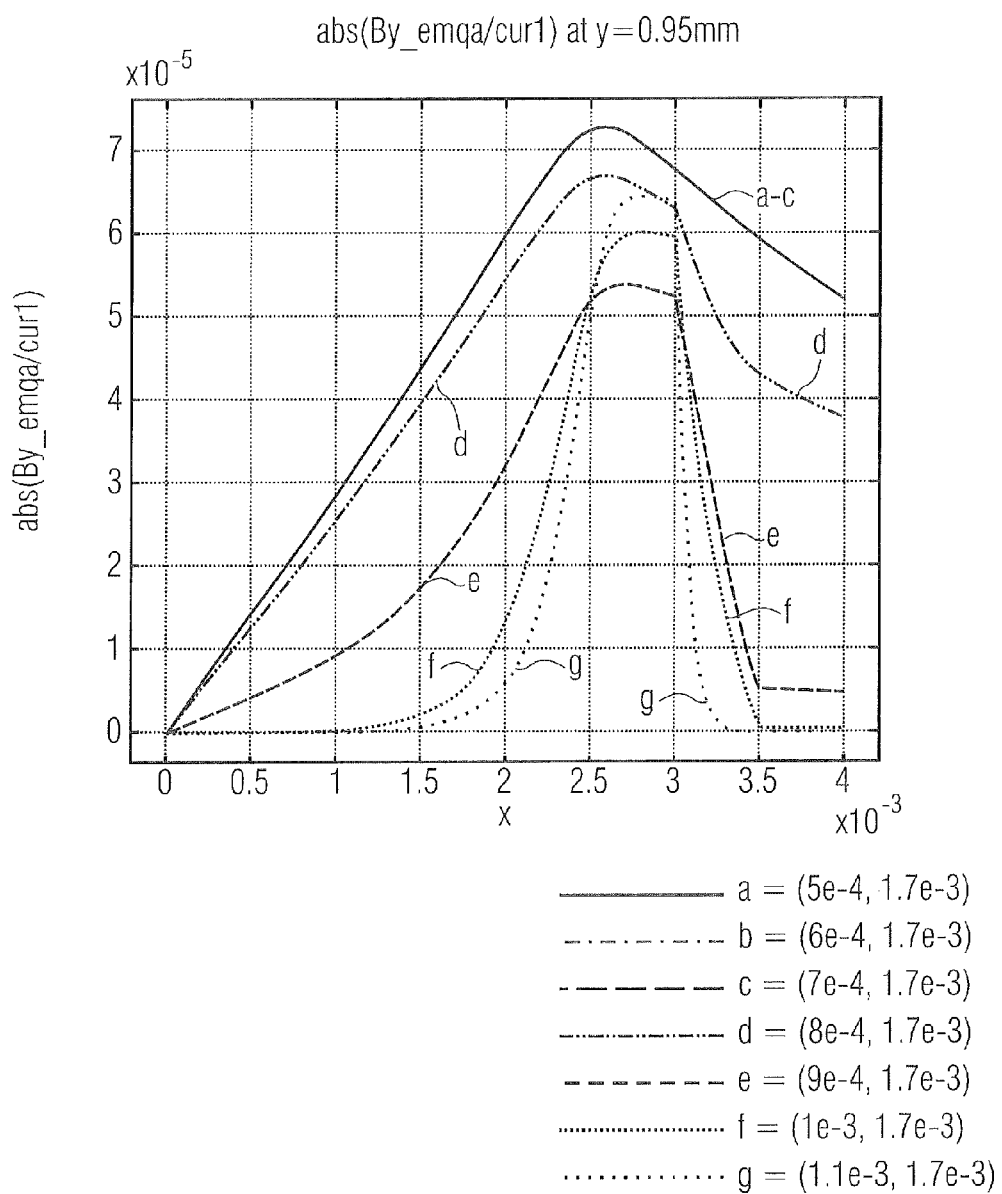
Figure 39:
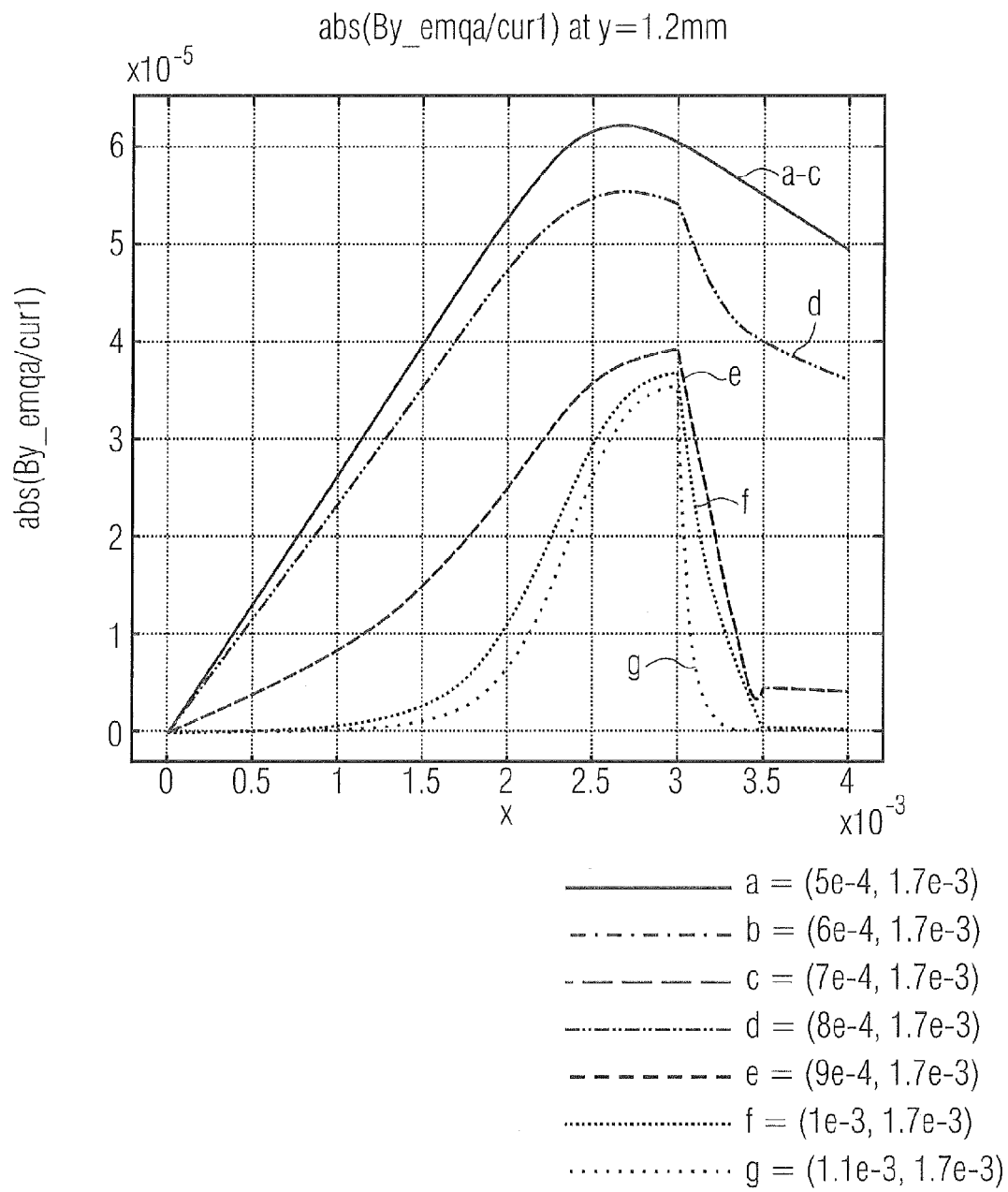

Now, the same conductor strip as in FIG. 34 (5 mm×1.5 mm) plus an additional shield (0.5 mm thick, inner width=6 mm, inner height=3 mm) is considered (see FIG. 37). So the gap between the strip and the shield is about 0.75 mm. As can be seen, a very strong frequency dependency can be observed, particularly at points which are closer to the shield than to the conductor (see FIGS. 38 and 39).

Figure 40:
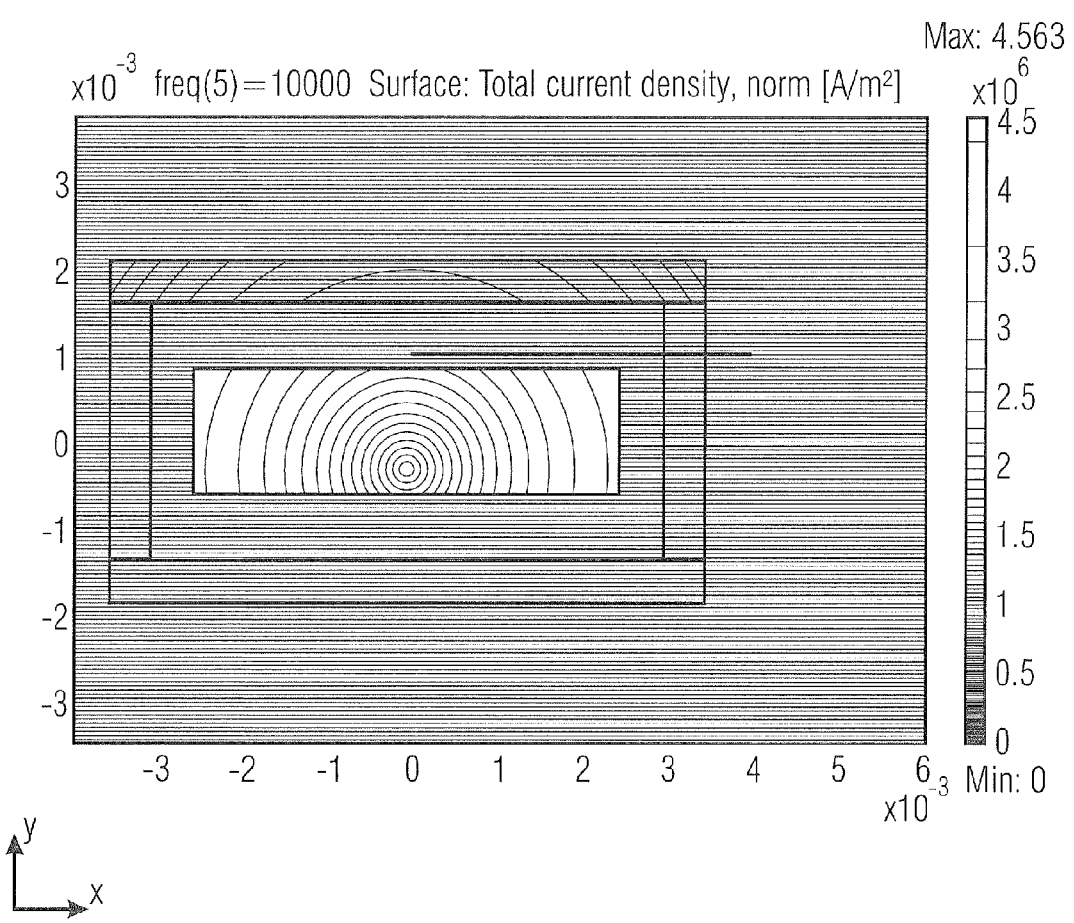
FIGS. 40-41 show plots illustrating the behavior of a current sensor having a rectangular sensor die with a shield at only one side.
Figure 41:
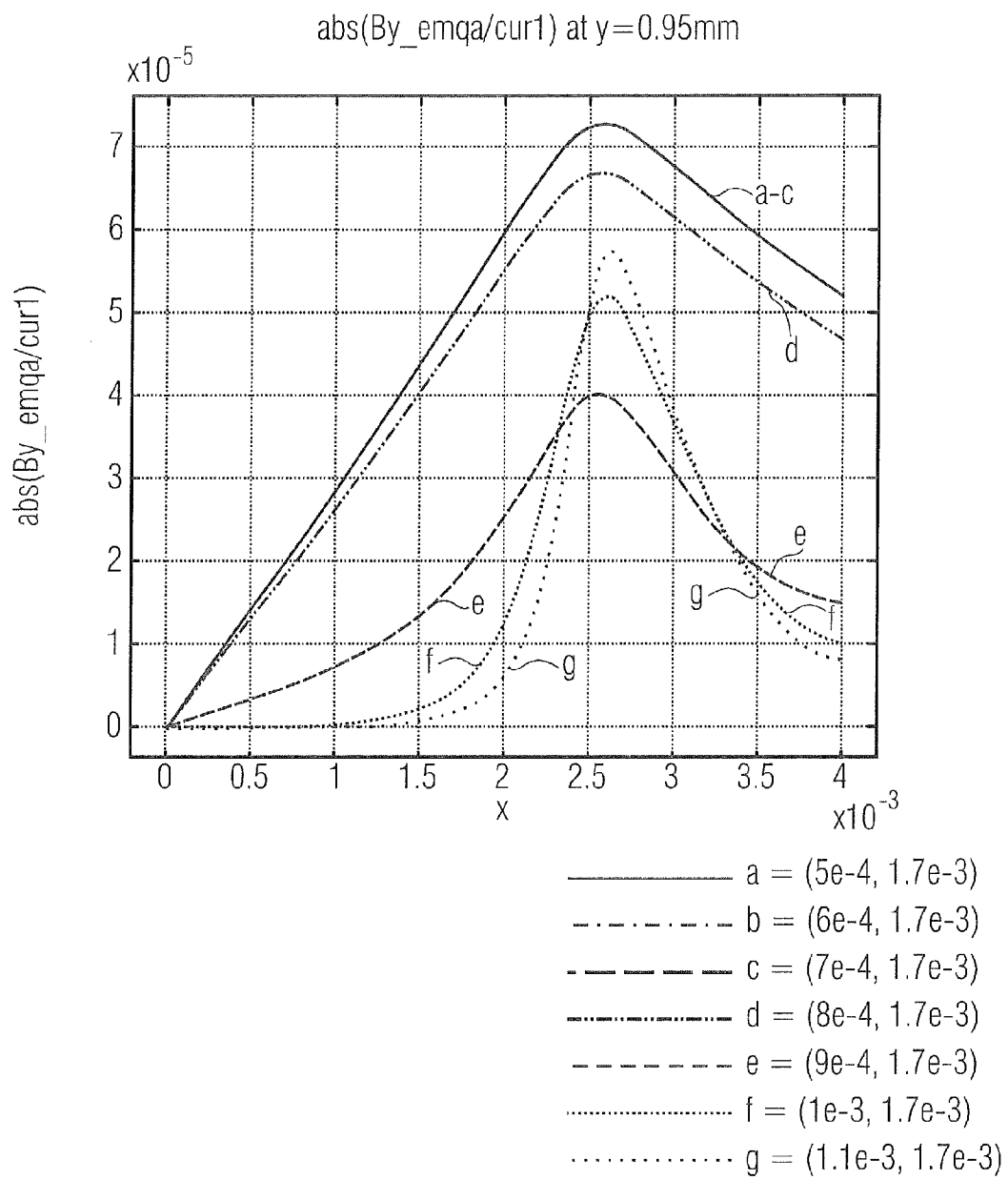

If the shield consists of the top plate only the frequency dependency is even worse, as may be seen from FIGS. 40 and 41.

Figure 42:
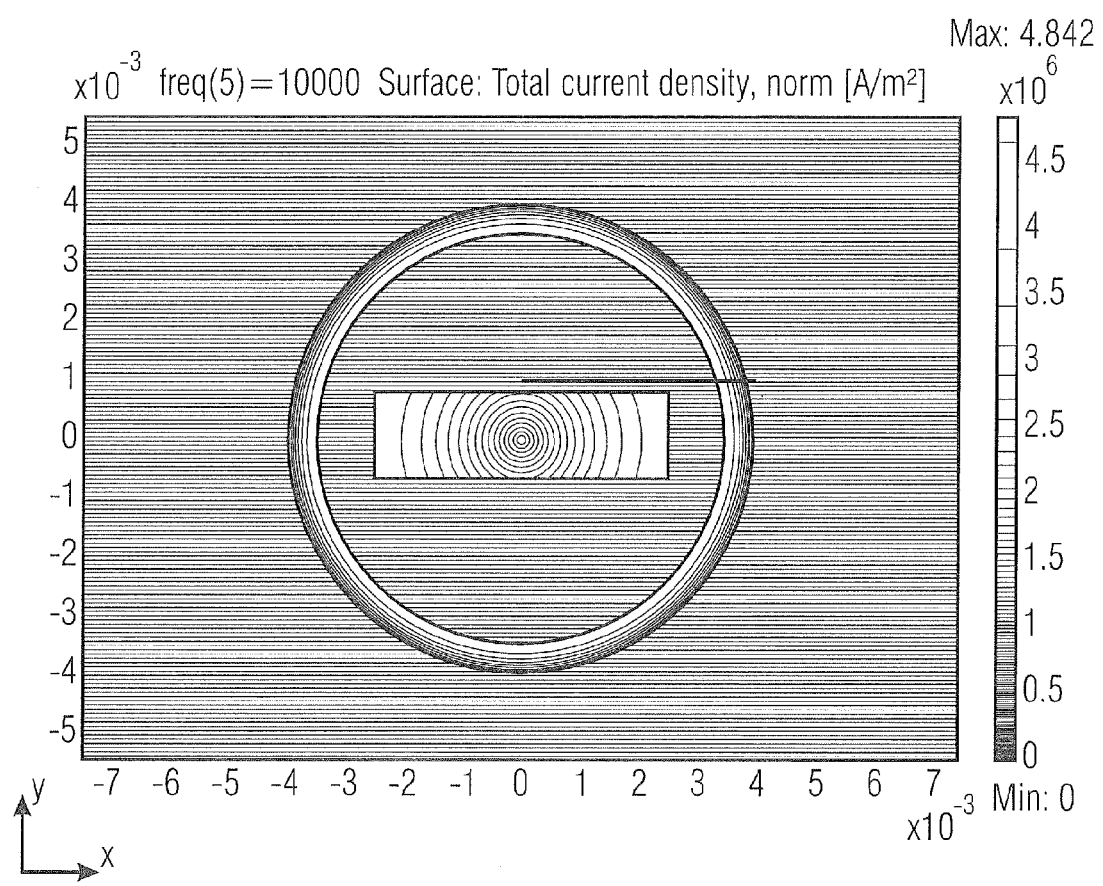
FIGS. 42-43 show plots illustrating the behavior of a current sensor having a rectangular sensor die with a circular shield.
Figure 43:
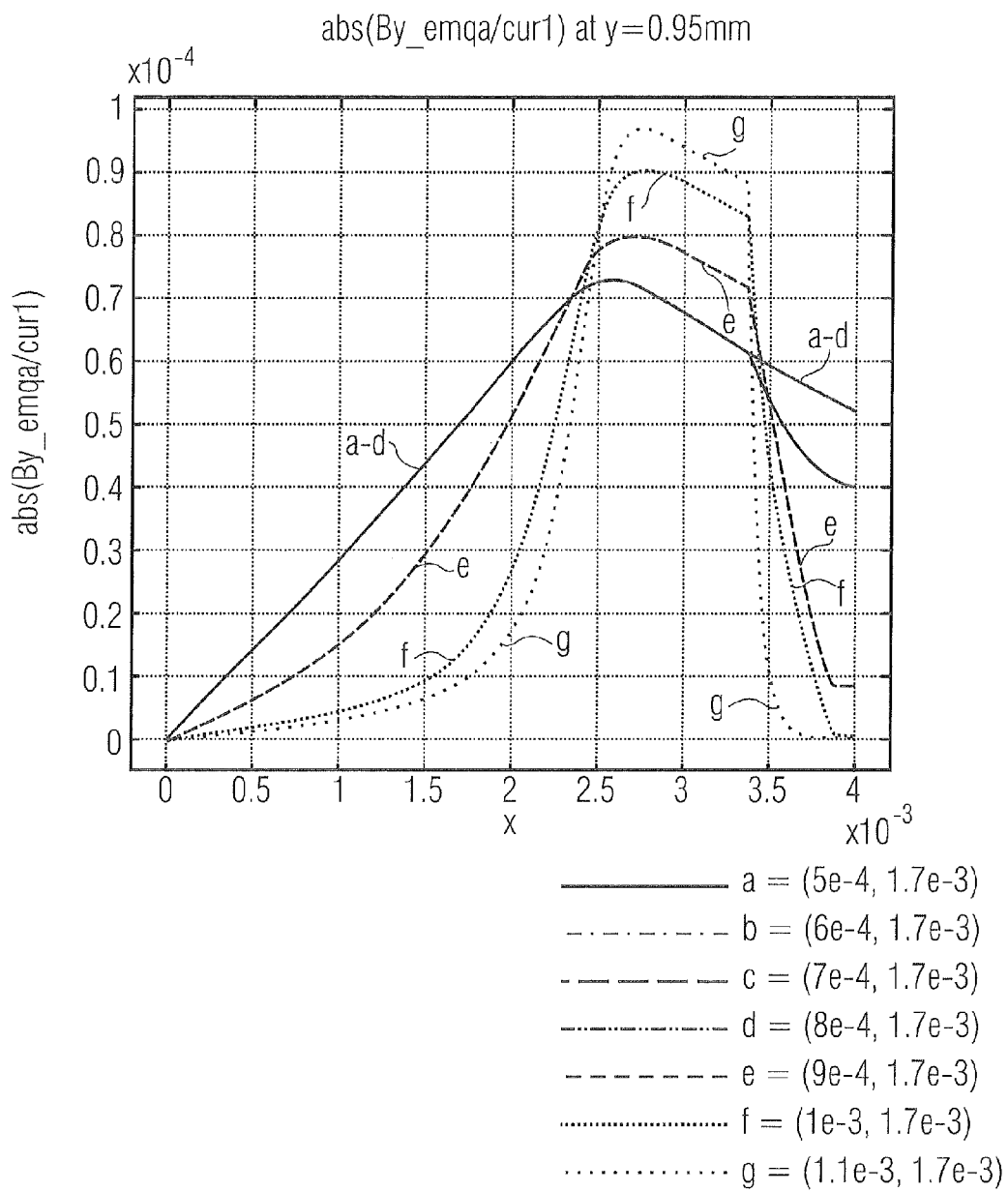

Embodiments of the invention use a shield with circular cross-section and, as may be seen from FIGS. 42 and 43 the frequency dependency of By/current near x=2.4 mm is much smaller so that in accordance with embodiments of the invention the shield 140 is a hollow cylinder whereas the inner conductor may be of any shape, yet it may be advantageous to use a shape close to circular (solid or hollow does not matter).

Embodiments of the invention were described using two magnetic field sensors. The invention is not limited to such an arrangement. Embodiments of the invention may comprise a first group of magnetic field sensors and a second group of magnetic field sensors. Each group of magnetic field sensors may comprises one or more magnetic field sensors. The two groups are arranged on the conductor on opposite sides of a line that is perpendicular to the current flow direction through the conductor.

Embodiments of the invention were described using two Hall sensors. The invention is not limited to Hall sensors. Instead of or in addition to the Hall sensors also other magnetic field sensors may be used, e.g. magnetoresistive (MR) devices like AMR (anisotropic MR), GMR (giant MR), or TMR (tunneling MR) devices.

Embodiments of the invention concern a current sensor as described above, wherein respective ends of the conductor may have one of the following configurations:

a connecting element adapted to be connected to a contact may be provided at a first end of the conductive element, and a receptacle adapted to receive a cable may be provided at a second end of the conductive body, the second end being opposite to the first end, or a first receptacle adapted to receive a first cable may be provided at the first end of the conductive element, and a second receptacle adapted to receive a second cable may be provided at the second end of the conductive body, or a first connecting element adapted to be connected to a first contact may be provided at the first end of the conductive element, and a second connecting element adapted to be connected to a second contact may be provided at the second end of the conductive element, or a connecting element adapted to be connected to a first contact may be provided at the first end of the conductive element, and a terminal element may be provided at the second end of the conductive element, or a receptacle adapted to receive a cable may be provided at the first end of the conductive element, and a terminal element may be provided at the second end of the conductive element.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A current sensor, comprising:
   a conductive element comprising a first end, a second end, and an intermediate portion arranged between the first end and the second end, wherein the conductive element is configured to conduct a current to be sensed from the first end through the intermediate portion to the second end; and
   a magnetic field sensor arranged at the intermediate portion of the conductive element and is configured to sense a magnetic field generated by the current through the conductive element,
   wherein the first end is configured to be coupled to a first conductor,
   wherein the second end is configured to be coupled to a second conductor; and
   wherein:
       the first end of the conductive element comprises a connecting element configured to connect to a contact, and the second end of the conductive element comprises a receptacle configured to receive a cable, or
       the first end of the conductive element comprises a first receptacle configured to receive a first cable, and the second end of the conductive element comprises a second receptacle configured to receive a second cable, or
       the first end of the conductive element comprises a first connecting element configured to connect to a first contact, and the second end of the conductive element comprises a second connecting element configured to connect to a second contact, or
       the first end of the conductive element comprises a connecting element configured to connect to a first contact, and the second end of the conductive element comprises a terminal element, or
       the first end of the conductive element comprises a receptacle configured to receive a cable, and the second end of the conductive element comprises a terminal element.

2. The current sensor of claim 1, wherein at least one of the first end and the second end is configured to provide a detachable connection or a permanent connection to the respective conductor.

3. The current sensor of claim 2, wherein
   the detachable connection comprises a screwed connection; and
   the permanent connection comprises a press-fitted connection, a welded connection, a brazed connection, a solder connection, a glued connection or a crimped connection.

4. The current sensor of claim 1, wherein the intermediate portion of the conductive element comprises a substantially circular or a polygonal cross section.

5. The current sensor of claim 1, wherein the intermediate portion of the conductive element comprises a massive or solid conductor.

6. The current sensor of claim 1, comprising:
   at least two magnetic field sensors arranged on opposite sides of a line perpendicular to a current flow direction in the conductive element; and
   an insulating layer arranged between the conductive element and the magnetic field sensors.

7. The current sensor of claim 1, wherein the connecting element comprises a cable shoe.

8. The current sensor of claim 1, wherein the terminal element comprises a dead end stub.

9. A cable system, comprising:
   a conductive element comprising a first end, a second end, and an intermediate portion arranged between the first end and the second end, the conductive element configured to conduct a current to be sensed from the first end through the intermediate portion to the second end; and
   a magnetic field sensor arranged at the intermediate portion of the conductive element and configured to sense a magnetic field generated by the current through the conductive element,
   wherein the first end is coupled to a first conductor,
   wherein the second end is coupled to a second conductor,
   wherein the first conductor comprises one of a first cable, a first terminal element, and a first connecting element configured to connect to a first contact,
   wherein the second conductor comprises one of a second cable, a second terminal element, and a second connecting element configured to connect to a second contact; and
   wherein:
       the first end of the conductive element comprises a connecting element configured to connect to a contact, and the second end of the conductive element comprises a receptacle configured to receive a cable, or
       the first end of the conductive element comprises a first receptacle configured to receive a first cable, and the second end of the conductive element comprises a second receptacle configured to receive a second cable, or
       the first end of the conductive element comprises a first connecting element configured to connect to a first contact, and the second end of the conductive element comprises a second connecting element configured to connect to a second contact, or the first end of the conductive element comprises a connecting element configured to connect to a first contact, and the second end of the conductive element comprises a terminal element, or the first end of the conductive element comprises a receptacle configured to receive a cable, and the second end of the conductive element comprises a terminal element.

* * * * *